US007362889B2

(12) United States Patent
Dubowsky et al.

(10) Patent No.: US 7,362,889 B2
(45) Date of Patent: Apr. 22, 2008

(54) ELASTOMERIC ACTUATOR DEVICES FOR MAGNETIC RESONANCE IMAGING

(75) Inventors: Steven Dubowsky, Boston, MA (US); Moustapha Hafez, Paris (FR); Ferenc A. Jolesz, Brookline, MA (US); Daniel F. Kacher, Allston, MA (US); Matthew Lichter, Somerville, MA (US); Peter Weiss, Eichenau (DE); Andreas Wingert, Baindt (DE)

(73) Assignee: Massachusetts Institute of Technology, Cambridge, MA (US)

( * ) Notice: Subject to any disclaimer, the term of this patent is extended or adjusted under 35 U.S.C. 154(b) by 741 days.

(21) Appl. No.: 10/291,866

(22) Filed: Nov. 8, 2002

(65) Prior Publication Data

US 2003/0210811 A1 Nov. 13, 2003

Related U.S. Application Data

(60) Provisional application No. 60/379,465, filed on May 10, 2002.

(51) Int. Cl.
*G06K 9/00* (2006.01)

(52) U.S. Cl. .................. 382/128; 382/131; 382/132

(58) Field of Classification Search ............... 382/128, 382/131, 132; 324/300, 318, 307, 309; 600/300, 600/415, 411; 601/2, 3; 335/298
See application file for complete search history.

(56) References Cited

U.S. PATENT DOCUMENTS 3,832,580 A    8/1974  Yamamuro et al. .......... 310/9.5

(Continued)

FOREIGN PATENT DOCUMENTS

DE    274 765    1/1990

(Continued)

OTHER PUBLICATIONS

Pelrine R., et al., "Dielectric Elastomer Artificial Muscle Actuators: Toward Biomimetic Motion," Proceedings of SPIE, vol. 4695, pp. 126-137 (2002).

(Continued)

*Primary Examiner*—Anh Hong Do
(74) *Attorney, Agent, or Firm*—Michael J. Bastian, Esq.; Choate Hall & Stewart LLP

(57) ABSTRACT

The present invention is directed to devices and systems used in magnetic imaging environments that include an actuator device having an elastomeric dielectric film with at least two electrodes, and a frame attached to the actuator device. The frame can have a plurality of configurations including, such as, for example, at least two members that can be, but not limited to, curved beams, rods, plates, or parallel beams. These rigid members can be coupled to flexible members such as, for example, links wherein the frame provides an elastic restoring force. The frame preferably provides a linear actuation force characteristic over a displacement range. The linear actuation force characteristic is defined as ±20% and preferably 10% over a displacement range. The actuator further includes a passive element disposed between the flexible members to tune a stiffness characteristic of the actuator. The passive element can be a bi-stable element. The preferred embodiment actuator includes one or more layers of the elastomeric film integrated into the frame. The elastomeric film can be made of many elastomeric materials such as, for example, but not limited to, acrylic, silicone and latex.

28 Claims, 43 Drawing Sheets

U.S. PATENT DOCUMENTS

| | | | | |
|---|---|---|---|---|
| 4,771,785 | A | * | 9/1988 | Duer .......................... 600/415 |
| 4,845,431 | A | | 7/1989 | Sullenberger ................ 324/318 |
| 5,049,821 | A | | 9/1991 | Duensing et al. ........... 324/322 |
| 5,130,656 | A | | 7/1992 | Requardt et al. ........... 324/318 |
| 5,150,710 | A | | 9/1992 | Hall et al. ................ 128/653.5 |
| 5,206,557 | A | | 4/1993 | Bobbio |
| 5,356,500 | A | | 10/1994 | Scheinbeim et al. ......... 156/229 |
| 5,365,928 | A | | 11/1994 | Rhinehart et al. ........ 128/653.5 |
| 5,440,194 | A | | 8/1995 | Beurrier ..................... 310/328 |
| 5,502,387 | A | | 3/1996 | McGill ........................ 324/318 |
| 5,836,750 | A | | 11/1998 | Cabuz |
| 5,841,278 | A | * | 11/1998 | Green et al. ................. 324/318 |
| 6,157,276 | A | | 12/2000 | Hedeen et al. ............... 335/216 |
| 6,181,131 | B1 | * | 1/2001 | Bruland et al. .............. 324/300 |
| 6,215,307 | B1 | | 4/2001 | Sementchenko ............. 324/318 |
| 6,303,885 | B1 | | 10/2001 | Hichwa et al. |
| 6,343,129 | B1 | | 1/2002 | Pelrine et al. ............... 381/191 |
| 6,402,689 | B1 | * | 6/2002 | Scarantino et al. ......... 600/300 |
| 6,549,010 | B2 | * | 4/2003 | Roozen et al. .............. 324/318 |
| 6,648,914 | B2 | * | 11/2003 | Berrang et al. ................ 623/10 |
| 6,773,408 | B1 | * | 8/2004 | Acker et al. ..................... 601/2 |
| 2001/0026165 | A1 | | 10/2001 | Pelrine et al. ............... 324/750 |
| 2001/0032663 | A1 | | 10/2001 | Pelrine et al. ............... 136/205 |
| 2001/0035723 | A1 | | 11/2001 | Pelrine |
| 2001/0036790 | A1 | | 11/2001 | Kornbluh et al. ........... 446/337 |
| 2001/0045104 | A1 | | 11/2001 | Bailey, Sr. et al. ........... 62/510 |
| 2002/0008445 | A1 | | 1/2002 | Pelrine et al. ............... 310/330 |
| 2002/0008516 | A1 | | 1/2002 | Dietz et al. .................. 324/318 |
| 2002/0117517 | A1 | | 8/2002 | Unger et al. ................. 222/214 |

FOREIGN PATENT DOCUMENTS

| | | | |
|---|---|---|---|
| EP | | 1 101 442 | 5/2001 |
| EP | | 1195523 B1 | 3/2005 |
| JP | | 405223509 A | * 8/1993 |
| JP | | 5-253175 A | 10/1993 |
| JP | | 08257010 A | 10/1996 |
| JP | | 02000090506 A | * 3/2000 |
| JP | | 2001294642 | 10/2001 |
| KR | | 285912 | 2/1999 |
| WO | WO 99/59479 | | 11/1999 |
| WO | WO 00/64003 | | 10/2000 |
| WO | WO 01/06575 A1 | | 1/2001 |
| WO | WO 01/06579 | | 1/2001 |
| WO | WO 01/31716 | | 5/2001 |
| WO | WO 01/45786 | | 6/2001 |
| WO | WO 01/50584 | | 7/2001 |

OTHER PUBLICATIONS

Benslimane, M., et al., "Mechanical properties of Dielectric Elastomer Actuators with smart metallic compliant electrodes," Proceedings of SPIE, vol. 4695, pp. 150-157 (2002).

Toth., L.A. and Goldenberg, A.A., "Control System Design for a Dielectric Elastomer Actuator: the Sensory Subsystem," Proceedings of SPIE, vol. 4965, pp. 323-334, (2002).

Sommer-Larsen, P., et al., "Performance of dielectric elastomer actuators and materials," Proceedings of SPIE, vol. 4695, pp. 158-166 (2002).

Choi, H., et al., "Biomimetric Actuator Based on Dielectric Polymer," Proceedings of SPIE, vol. 4695, pp. 138-149 (2002).

Choi, H. R., et al., "Soft Actuator for Robotic Applications Based on Dielectric Elastomer: Quasi-static Analysis," Proceedings of the 2002 IEEE, pp. 3212-3217 (May 2002).

Choi, H. R., et al., "Soft Actuator for Robotic Applications Based on Dielectric Elastomer: Dynamic Analysis and Applications," Proceedings of the 2002 IEEE, pp. 3218-3223 (May 2002).

Pelrine, R. E., et al., "Electrostriction of polymer dielectrics with compliant electrodes as a means of actuation," Sensors and Actuators A 64, pp. 77-85 (1998).

Pelrine, R., et al., "Electrostriction of Polymer Films for Microactuators," IEEE, pp. 238-243 (1997).

Pelrine, R., et al., "High-Strain Actuator Materials Based on Dielectric Elastomers," Adv. Mater. 12, No. 16, pp. 1223-1225 (Aug. 16, 2000).

Pelrine, R., et al., "High-Speed Electrically Actuated Elastomers with Strain Greater than 100%," Science vol. 287, pp. 836-839 (Feb. 4, 2000).

Pelrine, R., et al., "High-field deformation of elastomeric dielectrics for actuators," Materials Science and Engineering C 11, pp. 89-100 (2000).

Kornbluh, R., et al., "Electrostrictive Polymer Artificial Muscle Actuators," Proceedings of the 1998 IEEE, pp. 2147-2154, (May 1998).

Kornbluh, R., et al., "Electroelastomers: Applications of Dielectric Elastomer Transducers for Actuation, Generation and Smart Structures," www.erg.sri.com, No date given.

Heydt, R., et al., "Acoustical performance of an electrostrictive polymer film loudspeaker," J. Acoust. Soc. Am 107 (2), pp. 833-839 (Feb. 2000).

Heydt, R., et al., "Design and Performance of an Electrostrictive-Polymer-Film Acoustic Actuator," Journal of Sound and Vibration 215(2), pp. 297-311 (1998).

Chinzei, K., et al., "Surgical Assist Robot for the Active Navigation in the Intraoperative MIR: Hardware Design Issues," Proceedings of the 2000 IEEE, pp. 727-732 (2000).

Kofod, G., "Dielectric elastomer actuators," Unpublished doctoral dissertation, Technical University of Denmark, (2001).

Park, K. C., et al., "An Electrostrictive Polymer Actuator Control Sysytem," Proceedings of the 2001 IEEE, pp. 470-475 (Nov. 3, 2001).

Cho, S., et al., "Compliant Micro Actuator made from Dielectric Polymer," Paper presented at the meeting of the International Conference on Control, Automation and Systems, (Oct. 2001).

Kornbluh, R., et al., "High-field electrostriction of elastomeric polymer dielectrics for actuation," Proceedings of the SPIE International Symposium (Mar. 1999).

Kornbluh, R., et al., "Ultrahigh strain response of field-actuated elastomeric polymers," Proceedings of SPIE vol. 3987 pp. 51-64 (2000).

Pelrine, R.., et al., "Artificial Muscle for Small Robots," www.erg.sri.com (Jan. 17, 2001).

Pelrine, R., et al., "Dielectric Elastomers Generator Mode Fundamentals and Applications," Proceedings of SPIE vol. 4329, pp. 148-156 (2001).

Pelrine, R., et al., "Applications for Dielectric Elastomer Actuators," Proceedings of SPIE vol. 4329, (Mar. 4-8, 2001).

Eckerle, J., et al., "A Biologically Inspired Hexapedal Robot Using Field-Effect Electroactive Elastomer Artificial Muscles," Proceedings of SPIE vol. 4329, pp. 1-12 (Mar. 4-8, 2001).

Kofod, G., et al., "Actuation response of polyacrylate dielectric elastomers," Proceedings of SPIE vol. 4329, pp. 141-147 (2001).

Cho S., et al., "Development of Micro Inchworm Robot Actuated by Electrostrictive Polymer Actuator," No date given.

Grimm, R.C. and Ehman, R.L., "Minimizing Signal Loss from Electromechanical Drivers in MR Elastography," Proc. Intl., Soc, Mag. Reson. Med. 10 (2002).

Jeon, J. W., et al., "Electrostrictive Polymer Actuators and Their Control Systems," Proceedings of SPIE vol. 4329, pp. 380-388 (2001).

Cho., S. et al., "Electrostrictive Polymer Actuator Using Elastic Restoring Force," Proceedings of the IMS (Apr. 19-21, 2001).

Chinzei, K., et al., "MR Compatibility of Mechatronic Devices: Design Criteria," No date given.

Venook, R., et al., "Autotuning Electronics for Varactor Tuned, Flexible Interventional RF Coils," Proc. Intl. Soc. Mag. Reson. Med. 10 (2002).

Leussler, C., et al., "Intrinsic Hybrid Surface Coil Array for Improved SNR in Cardiac MRI," Proc. Intl. Soc. Mag. Reson. Med. 10 (2002).

Bar-Cohen "EAP As Artificial Muscles—Progress and Challenges" Smart Structures and Materials 2004: Electroactive Polymer Actuators and Devices Proceedings of the SPIE vol. 5385, pp. 10-16 (2004).

Bar-Cohen "Electroactive Polymers as Artificial Muscles-Reality and Challenges" Proceedings of the 42$^{nd}$ AIAA: Structures, Structural Dynamics, and Materials Conference (SDM)-American Institute of Aerospace and Astronautics, Inc. 2001: pp. 1 to 10.

Meijer, et al., "Muscle-Like Actuators? A comparison Between Three Electroactive Polymers", Smart Structures and Materials 2001: Electroactive Polymer Actuators and Devices, SPI vol. 4329.

Plante, et al., "Large Scale Failure Modes of Dielectric Elastomer Actuators" Internation Journal of Solids and Structures, vol. 43, 7727-7751 (Mar. 2006).

Sujan, et al., "Lightweight hyper-redundant binary elements for planetary exploration robots", IEEE, pp. 1273-1278, Jul. 2001.

Vogan "Development of Dielectric Elastomer Actuators for MRI Devices" MS Thesis, Dept. of Mech. Engineering, MIT, 2004.

Vogan, et al., "Manipulation in MRI Devices using Electrostrictive Polymer Actuators: With an Application to Reconfigurable Imaging Coils" Proceedings of the 2004 IEEE Int'l Conference on Robotics and Automation, Apr. 2004.

Winger, et al., "Hyper-Redundant Robot Manipulators Actuated by Optimized Binary Dielectric Polymers", Smart Structures and Materials Symposium March 2002.

Wingert, et al., On the Kinematics of Parallel Mechanisms with Bi-Stable Polymer Actuators, Proceedings of the 8th International Symposium on Advances in Robotic Kinematics Jun. 2002.

Wingert "Development of Polymer-Actuatated Binary Manipulator" MS Thesis, Dept. of Mech. Engineering, MIT, 2002.

Office Action dated Nov. 20, 2006 for U.S. Appl. No. 10/291,217.

* cited by examiner

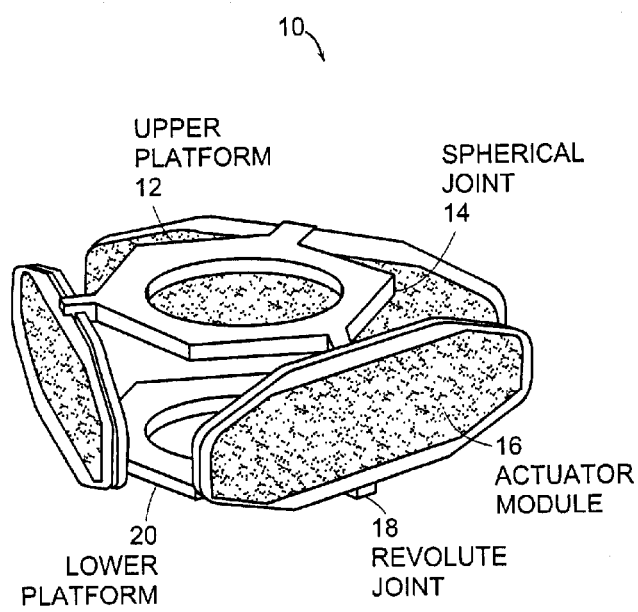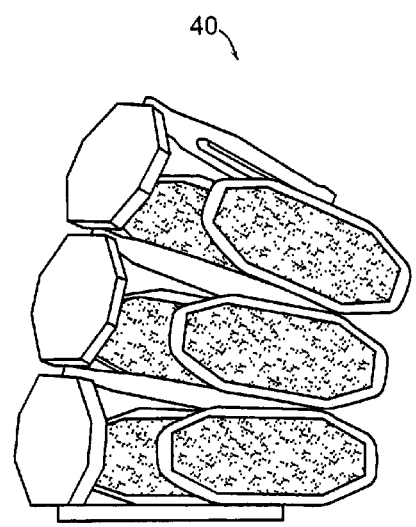
Figure 1A
Figure 1B

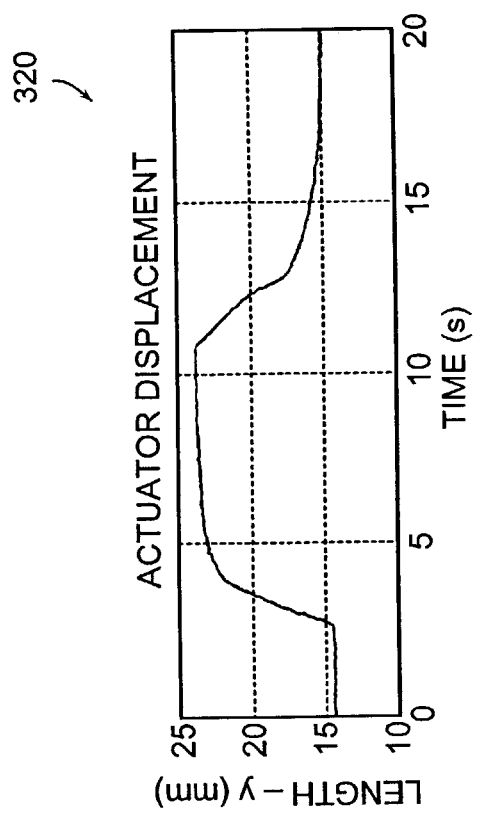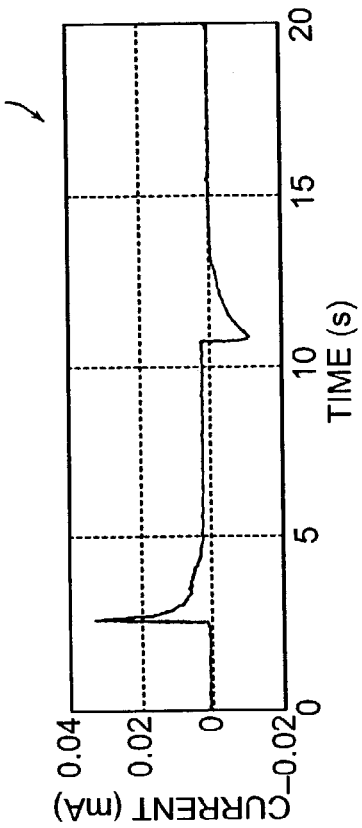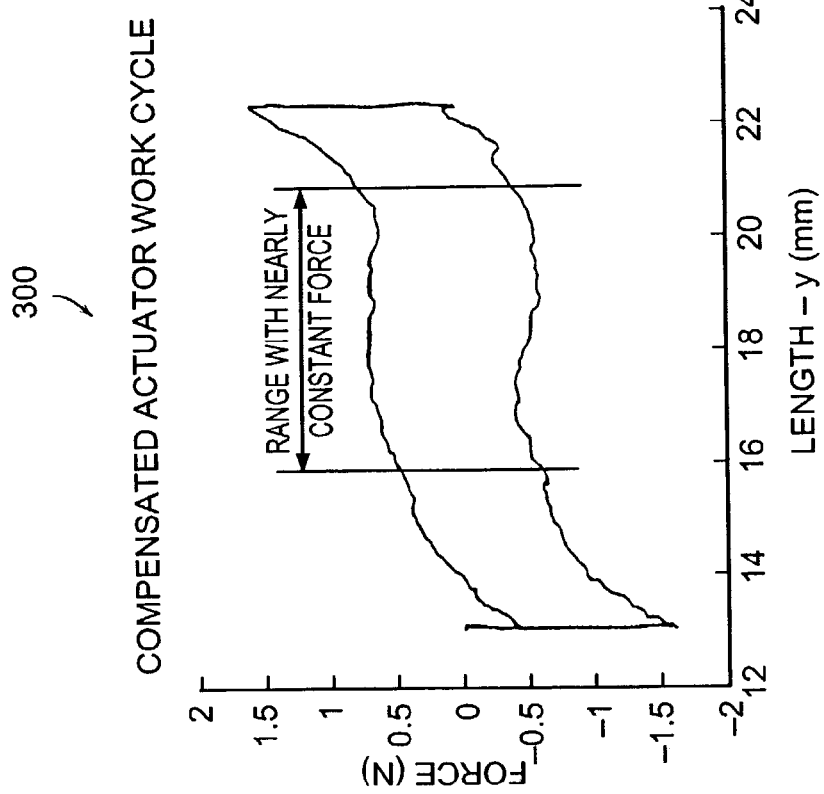

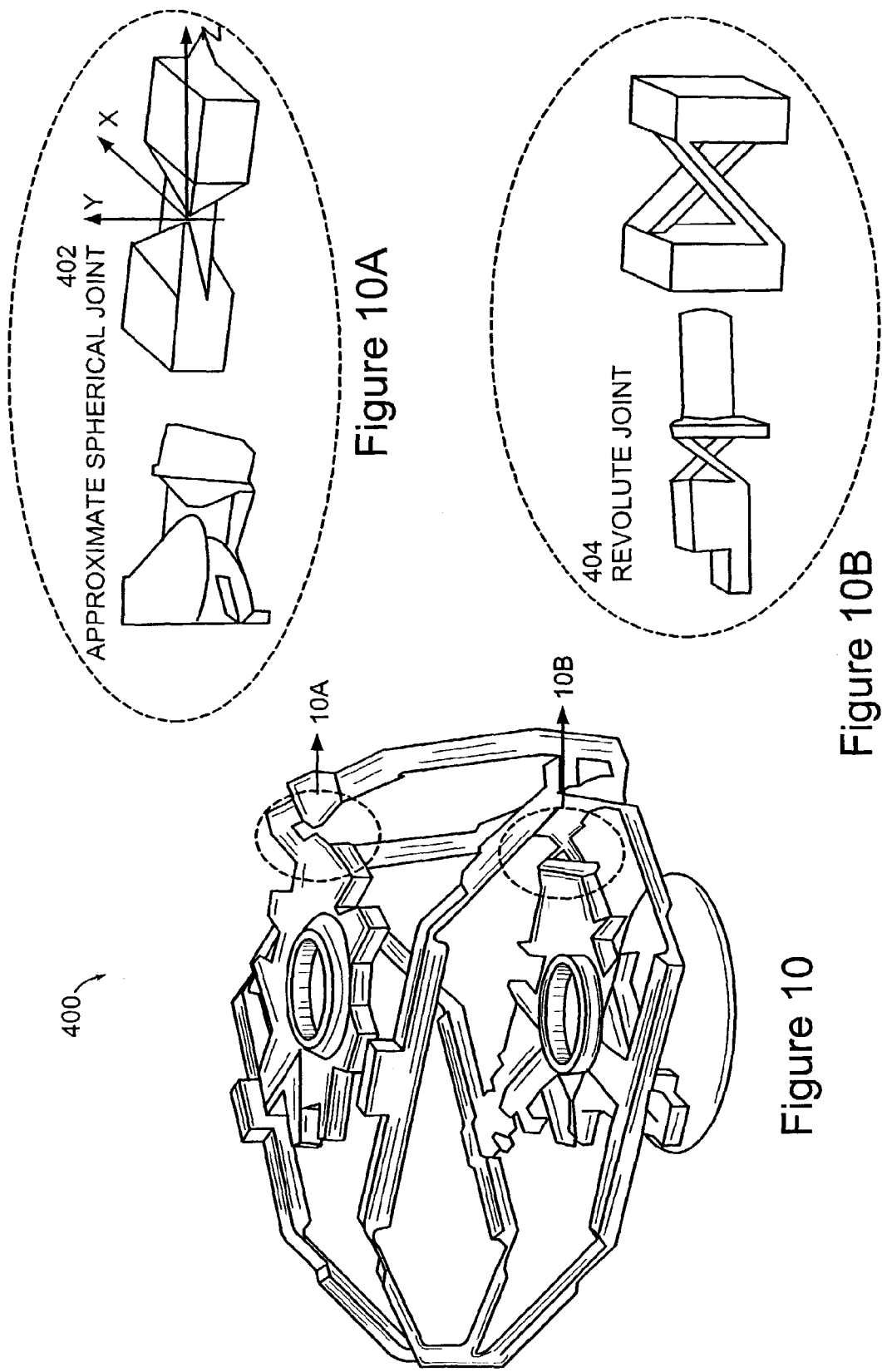

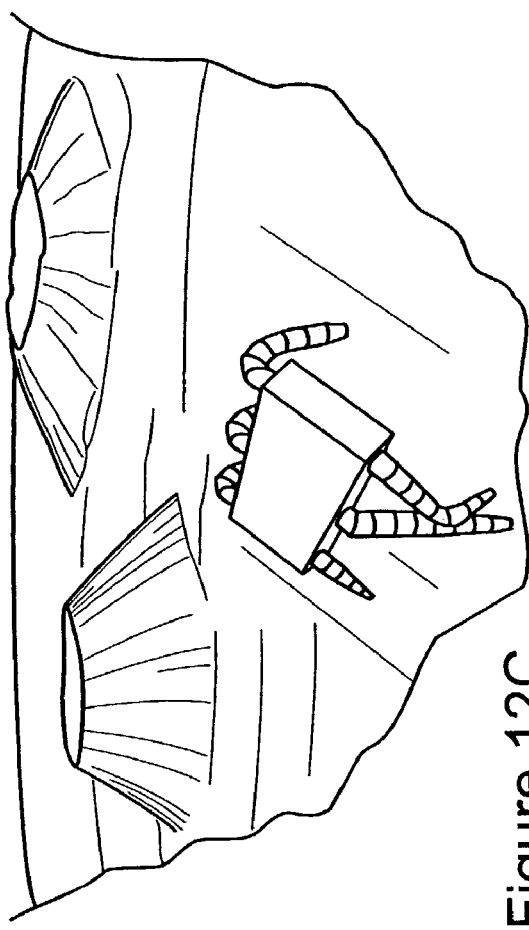
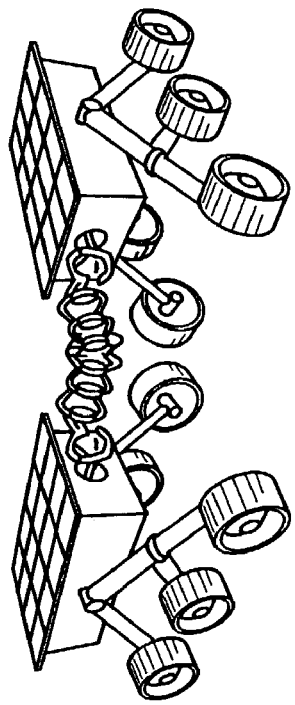
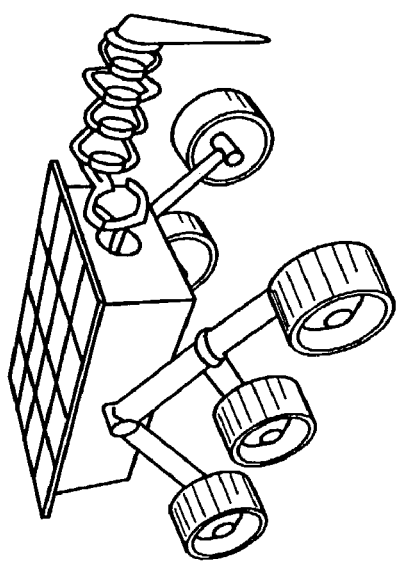
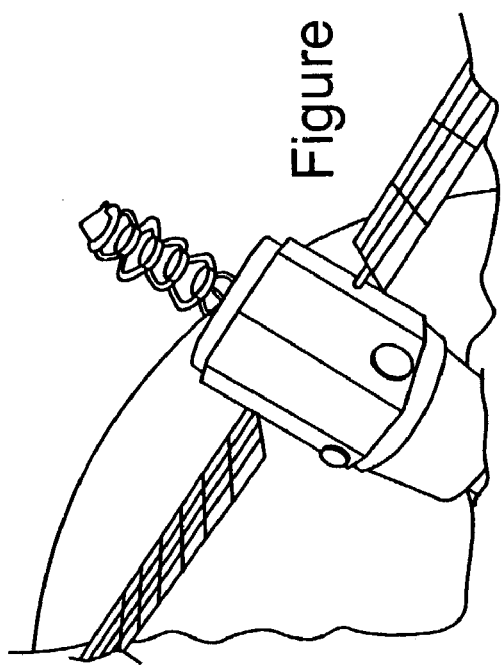
Figure 12A
Figure 12B
Figure 12C
Figure 12D

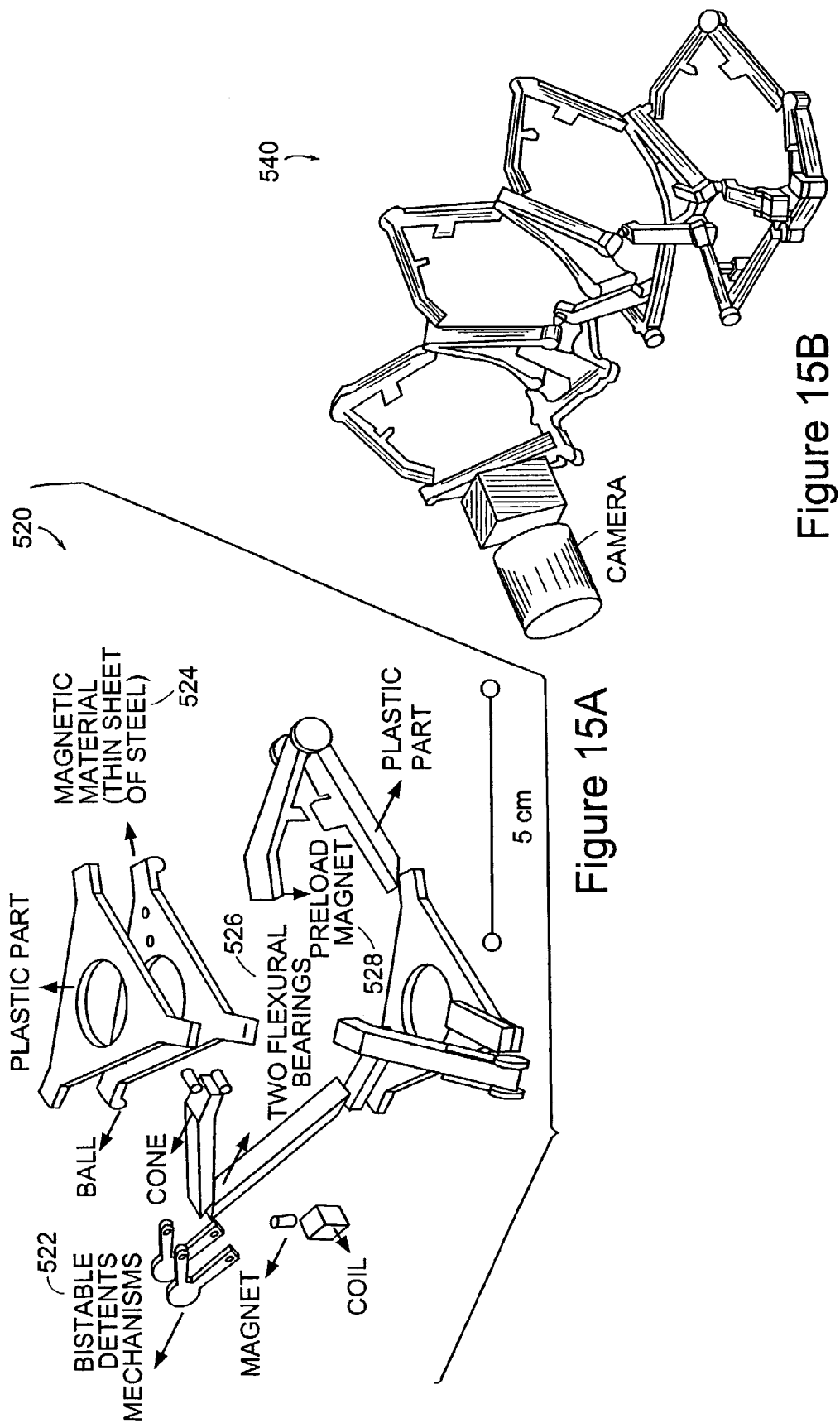

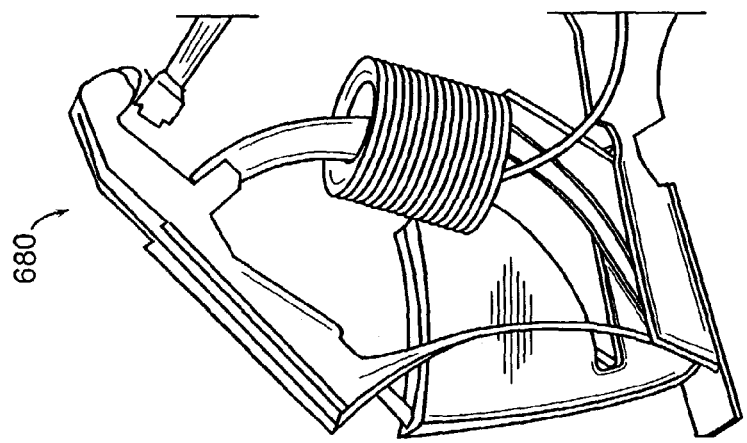
Figure 18C
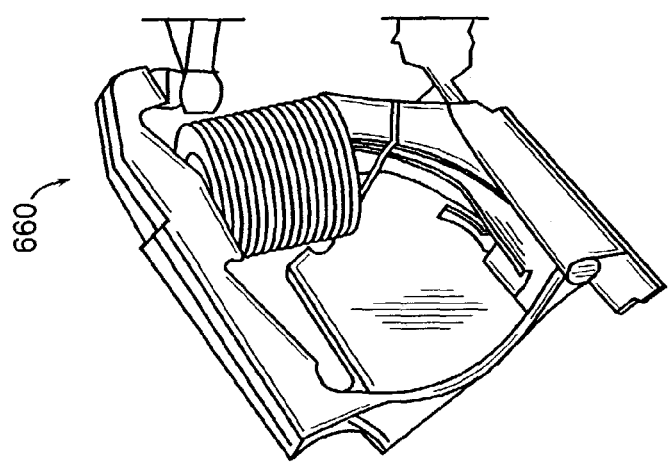
Figure 18B
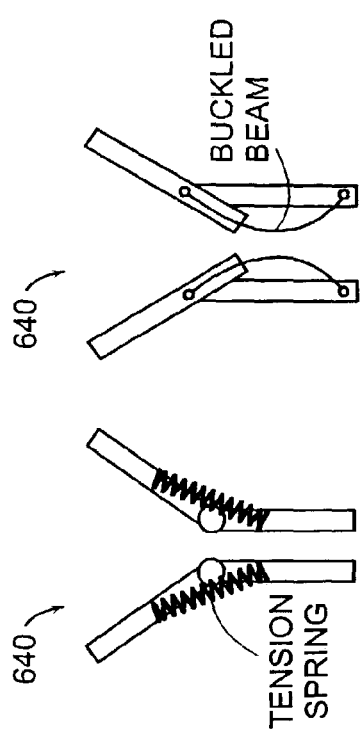
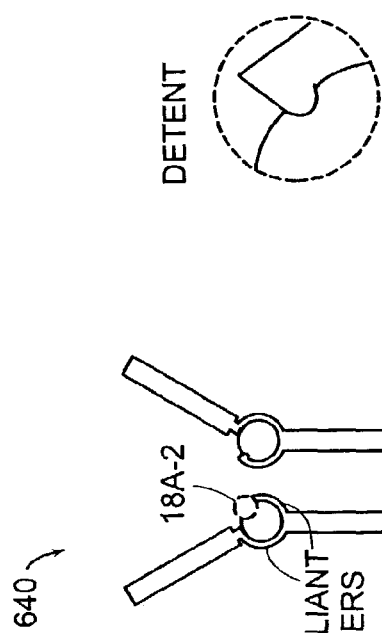
Figure 18A-4  Figure 18A-3
Figure 18A-2
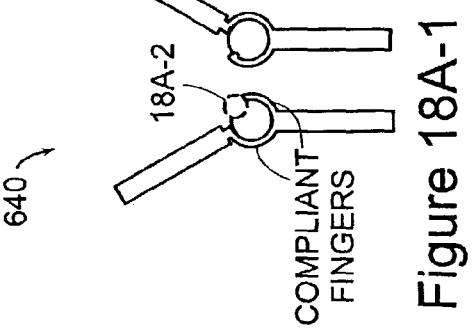
Figure 18A-1

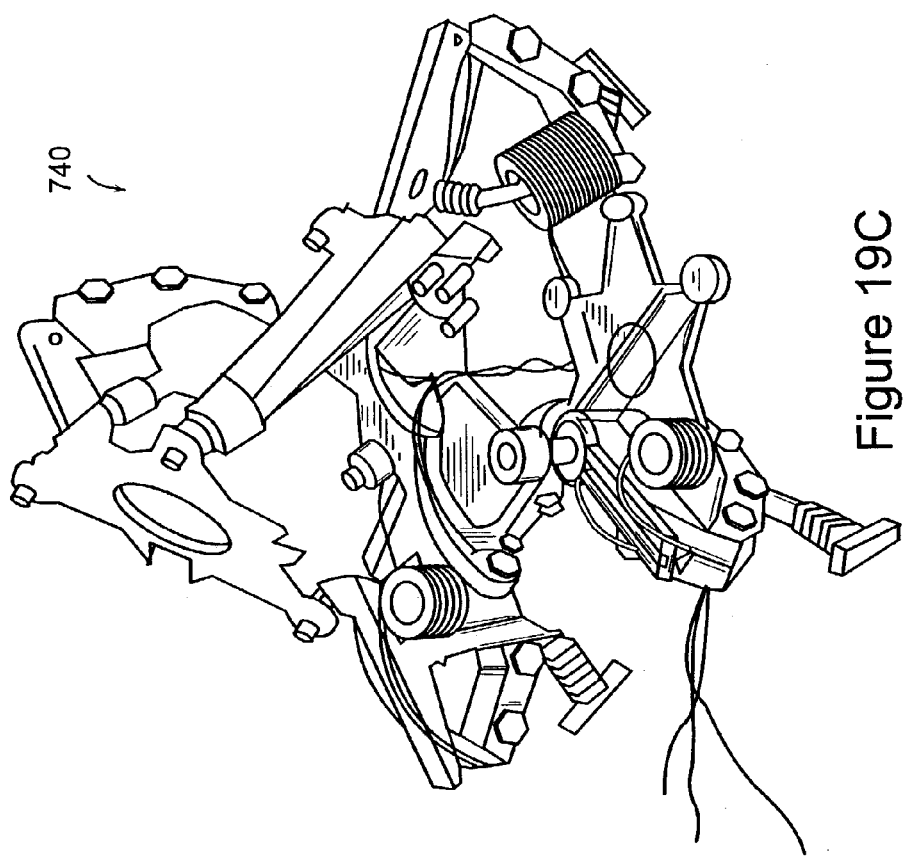
Figure 19C
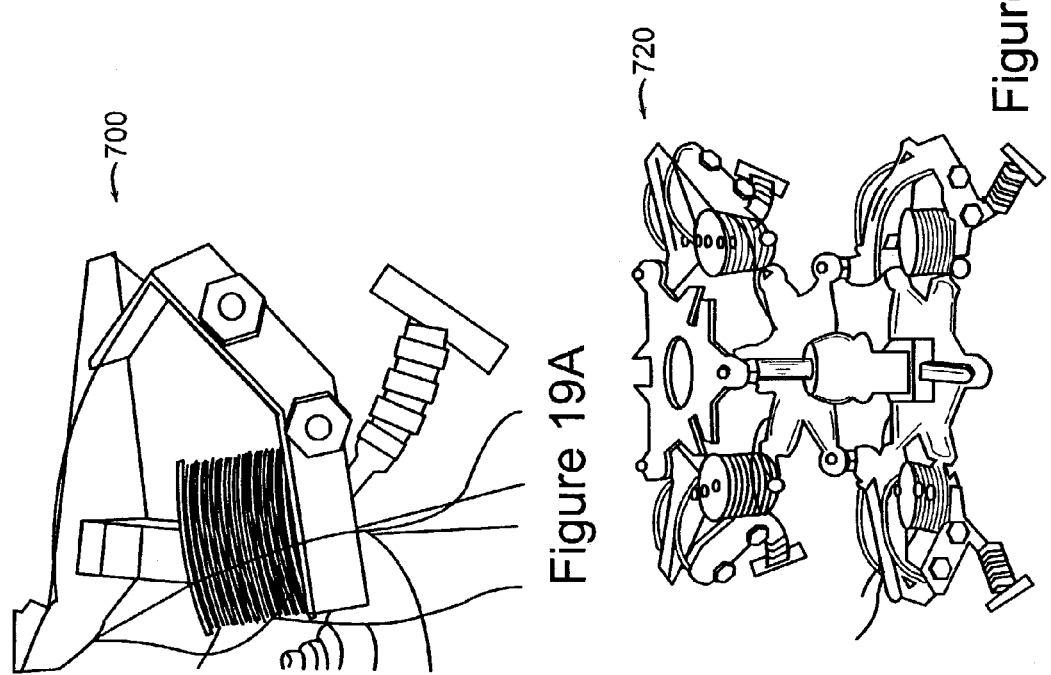
Figure 19A
Figure 19B

DIAMOND-SHAPED ACTUATOR PROTOTYPE

AREA CHANGE OF A DIAMOND TRUSS

HEXAGONAL-SHAPED FRAMES

FLEXIBLE DIAMOND-SHAPED FRAMES

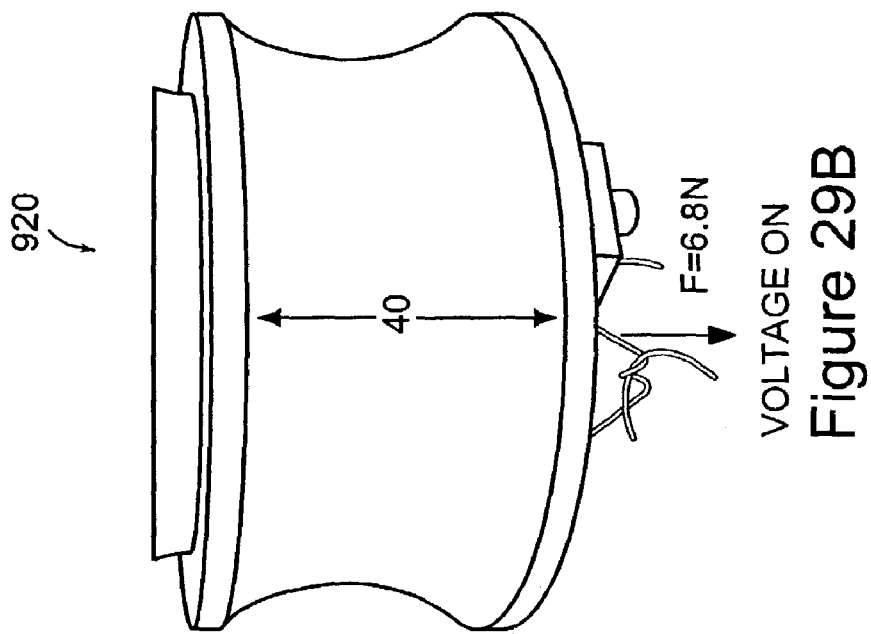
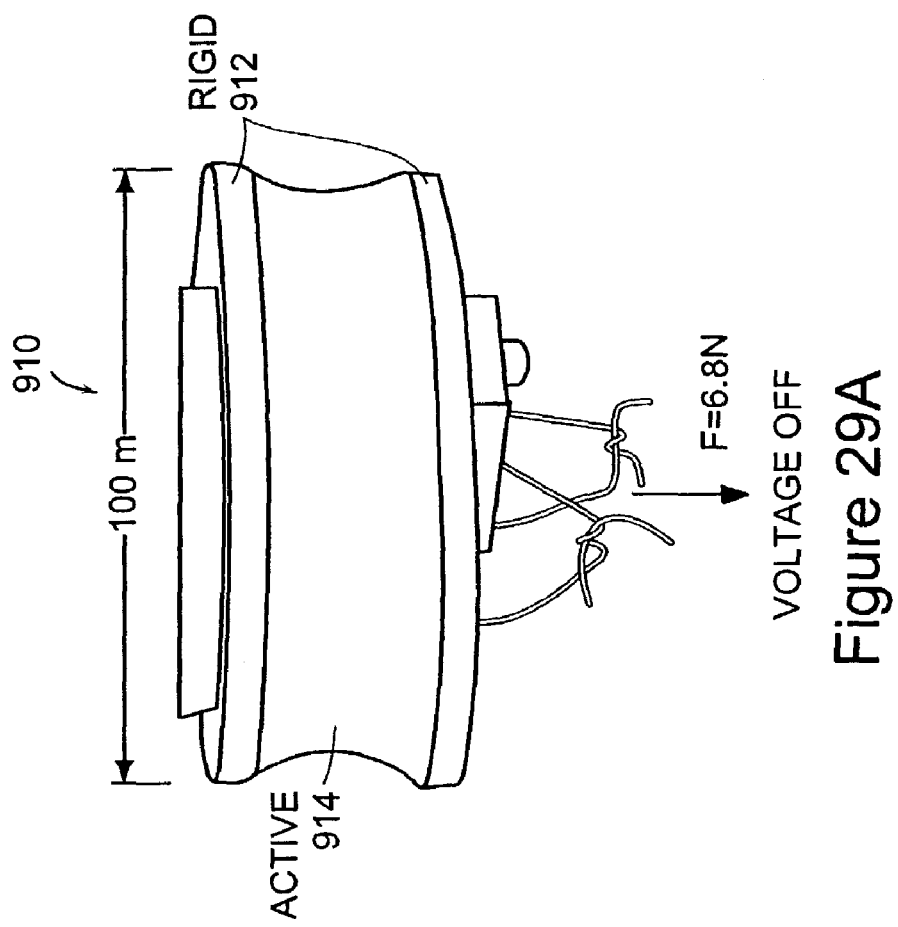

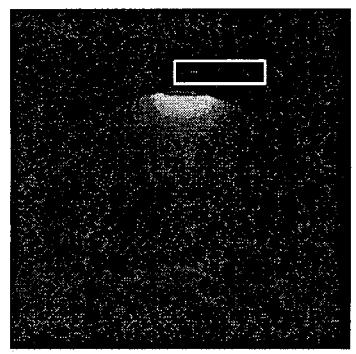
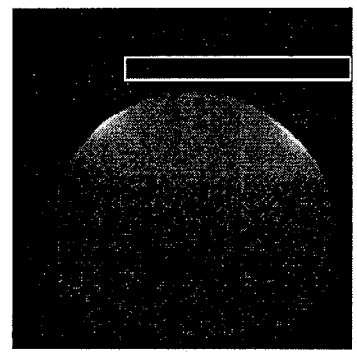
Figure 35A          Figure 35B
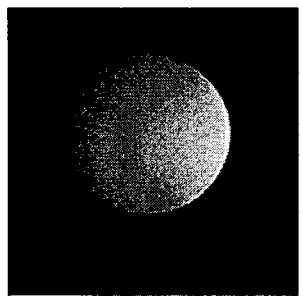
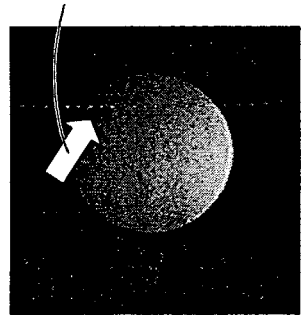
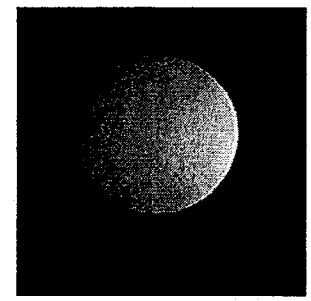
Figure 37A          Figure 37B          Figure 37C
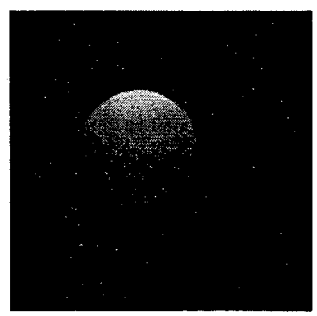
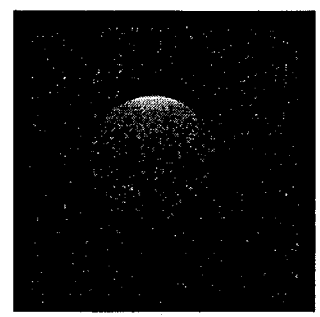
Figure 38C          Figure 38D

ELASTOMERIC ACTUATOR DEVICES FOR MAGNETIC RESONANCE IMAGING

CROSS REFERENCES TO RELATED APPLICATIONS

The present application claims the benefit of the U.S. Provisional Patent Application No. 60/379,465 filed May 10, 2002. The entire contents of the above application is incorporated herein by reference in its entirety.

GOVERNMENT SUPPORT

This invention was made with government support under Prime NASA Grant Number NAS5, under an agreement with the University Space Research Association Contract Number SUB $AGMT_{13}USRA$ 07600-033.

BACKGROUND OF THE INVENTION

Magnetic Resonance Imaging (MRI) is a technique for visualizing and quantifying the amount and molecular mobility of water and/or fat in a sample. The energy used is non-invasive and non-destructive. The modality of imaging provides cross-sectional and multi-planar imaging for precise spatial delineation and the capability to exploit tissue contrast that is not available by any other modality. The radio frequency (RF) signal from a sample is acquired using an antenna or coil.

Conventional actuators, for example, electric motors cannot be used in Magnetic Resonance Imaging (MRI) scanners because of the high magnetic fields in these systems. Paramagnetic materials in conventional actuators are not safe due to magnetic attraction. Moreover, these materials distort the homogeneous magnetic field necessary to create an MR image. Furthermore, electromagnetic emissions may cause noise in the MR images. Conventional actuators, therefore, cannot be used proximal to the imaging volume of the scanner.

SUMMARY OF THE INVENTION

The present invention is directed to devices and systems used in magnetic imaging environments that include an actuator device having an elastomeric dielectric film with at least two electrodes, and a frame attached to the actuator device. The frame can have a plurality of configurations including, such as, for example, at least two members that can be, but not limited to, curved beams, rods, plates, or parallel beams. These rigid members can be coupled to flexible members such as, for example, links wherein the frame provides an elastic restoring force. The frame preferably provides a linear actuation force characteristic over a displacement range. The linear actuation force characteristic is defined as ±20% and preferably 10% over a displacement range. The actuator further includes a passive element disposed between the flexible members to tune a stiffness characteristic of the actuator. The passive element can be a bi-stable element. The preferred embodiment actuator includes one or more layers of the elastomeric film integrated into the frame. The elastomeric film can be made of many elastomeric materials such as, for example, but not limited to, acrylic, silicone and latex.

In accordance with a preferred embodiment, a magnetic resonance imaging (MRI) actuator, includes an elastomeric film coated on a first and a second surface with a first and a second compliant electrode, and a frame attached to the elastomeric film, the frame having at least two members coupled with a plurality of flexible links. The elastomeric film includes a plurality of layers of, including but not limited to, acrylic and/or silicone.

In accordance with another preferred embodiment of the present invention a positioning device for use in magnetic resonance imaging of a region of interest includes a plurality of stages, each stage of the device including an elastomeric film having a first surface and a second surface, a first and second electrode disposed on the first and second surface, a frame attached to the polymer film, the frame having at least two beams coupled with a plurality of links to provide a restoring force, and an electrically resizable coil disposed on the surface of the polymer film to remotely control the location and focus of the region of interest. In one preferred embodiment, the positioning device can further include a passive element coupled to the plurality of links. In another embodiment the imaging coil includes a ring with elastomer polymer actuator muscle disposed within the ring. In another preferred embodiment the electrodes can form the imaging coil.

In accordance with another aspect of the present invention, a probe for use in magnetic resonance imaging of a region of interest within a body, includes an elongate shaft having a proximal end and a distal end, and an elastomeric actuator structure disposed in the distal end. The dielectric elastomeric actuator structure has a plurality of elastomer films disposed between two compliant electrodes, the polymer films being attached to a frame and having a variable size receiver coil coupled thereon. In a preferred embodiment the probe includes coils with a minimal profile for insertion that can be sized remotely once deployed.

In accordance with another aspect of the present invention, a receiver coil for use in magnetic resonance imaging of a region of interest, includes an elastomeric film coated on a first and a second surface with a first and a second compliant electrode, and a frame attached to the elastomeric film. The receiver coil has a variable size that is remotely controllable. Further, the receiver coil is integrated in an intracavity probe.

In accordance with another aspect of the present invention, a manipulator device includes dielectric elastomeric actuators as described with respect to preferred embodiments herein. The manipulator can be used to vary size and/or shape of imaging coils, position the imaging coils and focus images in the region of interest.

Another preferred embodiment of the present invention includes a device for applying oscillatory stress to an object in a polarizing magnetic field of a nuclear magnetic resonance imaging system, used to perform MR elastography. The device includes an actuator device having an elastomeric dielectric film with at least two compliant electrodes and a frame attached to the actuator device. The device can be a retractor or a transducer or a puncture needle.

The foregoing and other features and advantages of the system and method for polymer actuator devices for magnetic resonance imaging will be apparent from the following more particular description of preferred embodiments of the system and method as illustrated in the accompanying drawings in which like reference characters refer to the same parts throughout the different views.

BRIEF DESCRIPTION OF THE DRAWINGS

FIGS. 1A and 1B are diagrams of a single stage and multistage dielectric polymer actuated in accordance with preferred embodiments of the present invention.

FIGS. 8A-8C graphically illustrate the performance of a compensated actuator model, specifically force displacement (work cycle) and the displacement and current curves, respectively, in accordance with a preferred embodiment of the present invention.

FIGS. 10A and 10B, hereinafter collectively referred to as FIG. 10 is a diagram of a skeletal framework of a binary actuated device in accordance with a preferred embodiment of the present invention.

FIGS. 12A-12D illustrate preferred embodiments of the present invention in space robotic applications.

FIGS. 15A and 15B illustrate the system architecture of a binary actuated device having electromagnetic actuators in combination with an elastomeric actuator in accordance with a preferred embodiment of the present invention.

FIGS. 18A-1, 18A-2, 18A-3, 18A-4, 18B and 18C, hereinafter collectively referred to as FIGS. 18A-18C illustrate preferred embodiments including bi-stable mechanisms in parallel with an actuator in accordance with the present invention.

FIGS. 19A-19C illustrate embodiments of devices having bi-stable mechanisms in accordance with the present invention.

FIGS. 29A-29C illustrate preferred embodiments including cylindrical actuators in accordance with the present invention.

FIGS. 35A and 35B are magnetic resonance images (MRI) of a homogenous spherical water phantom with small surface coils and larger coils, respectively, in accordance with preferred embodiments of the present invention.

FIGS. 37A-37C illustrate MRI images acquired with the body coil in accordance with preferred embodiments of the present invention.

FIGS. 38A-38D illustrate a conventional copper coil, a circular dielectric elastomer actuator circular coil and their MRI images, respectively, in accordance with preferred embodiments of the present invention.

The drawings are not necessarily to scale, emphasis instead being placed upon illustrating the principles of the invention.

DETAILED DESCRIPTION OF THE INVENTION

In recent years, important progress has been made in the area of dielectric elastomer actuators. Measurements and analysis suggests that dielectric elastomer actuators have the potential of overcoming limitations of conventional actuators and serving as a key component for high degrees of freedom (DOF) binary manipulators and devices, as well as conventional continuously actuating devices. Under controlled conditions, dielectric elastomer actuators have achieved very high energy densities.

The preferred embodiment of the present invention includes a high DOF binary device driven by modular dielectric elastomer based actuators. The actuator consists of an integrated module consisting of the elastomer film, an elastic frame and a passive elastic element. The elastomer film can be made from many polymer materials such as, for example, but not limited to, acrylic, silicone and latex. Further, the dielectric polymer can be selected from the group including, but not limited to, essentially of silicone, fluorosilicone, fluoroelastomer, natural rubber, polybutadiene, nitrile rubber, isoprene and ethylene propylene diene. The actuator module applies boundary conditions that enhance the performance of elastomeric films. The actuator module can work under both tension and compression and has a linearly constant force through its stroke. It can be implemented into mechanical systems without the need of external restoring forces. The actuator module is used to actuate a computer controlled element such as, for example, a Binary Robotic Articulated Intelligent Device (BRAID), shown in FIGS. 1A and 1B. The BRAID is a lightweight, hyper-redundant binary manipulator that can have a large number of embedded actuators 16. The embodiment demonstrates feasibility of the modular dielectric elastomer actuators.

Figure 2A:
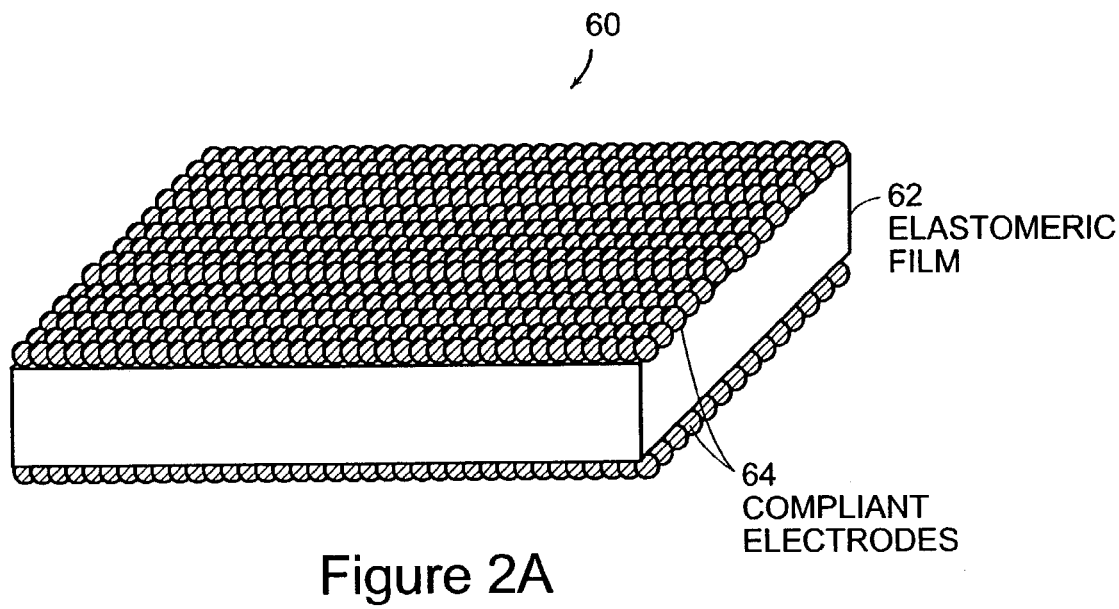
FIGS. 2A and 2B diagrammatically illustrate the operating principle of dielectric elastomer actuators in accordance with preferred embodiments of the present invention.
Figure 2B:
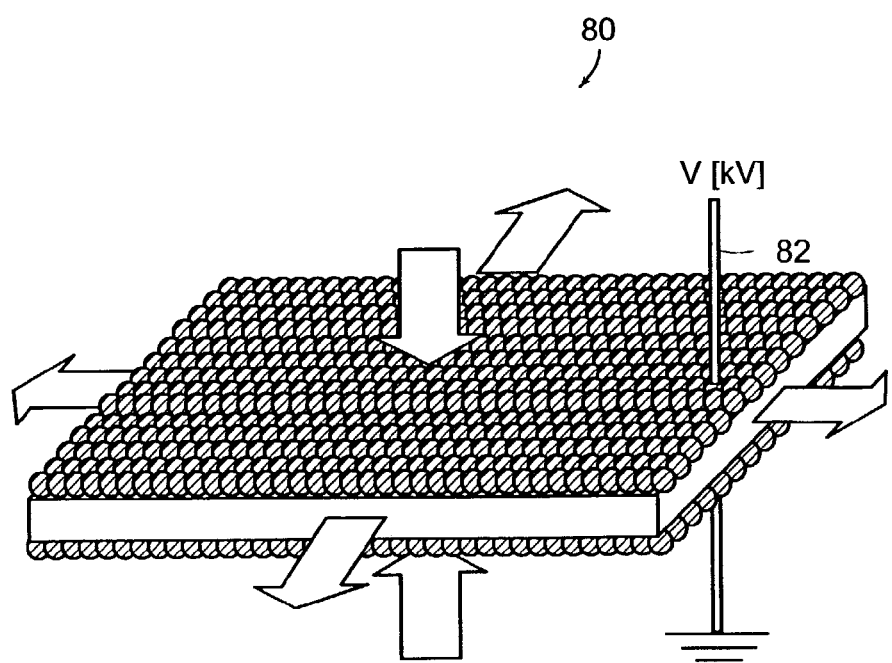

The operating principle of a dielectric elastomer actuator is simple and shown in FIGS. 2A and 2B. An elastomeric film 62 is coated on both sides with compliant electrodes 64. The compliant electrodes are made from a group including essentially, but not limited to, graphite, carbon, conductive polymers and thin-metal films. As a voltage is applied across the electrodes 64, electrostatic forces cause the film to compress in thickness and expand in area. This area expansion can be used to actuate mechanical systems. The individual films can be layered to increase actuation forces.

Dielectric elastomers can be used in linear actuators, loudspeakers, solid state optical devices, rotary drives and as generators. A variety of geometric configurations convert the area expansion of the film to linear motion. For example, the actuator film can be constrained in planar frames or be rolled into tubes that change length. In these embodiments, the direction of the actuator motion is in the same plane as the film expansion. An example of an out-of-plane device in accordance with an embodiment of the present invention is a cone-shaped actuator, in which the motion can be nearly normal to the undeformed film.

Planar geometries of dielectric elastomer actuators have been proposed to power a snake-like manipulator and an insect-inspired hexapedal walker. A conical geometry has been proposed to power an inchworm robot. Since the actuators only work in tension, some external restoring force is required, which can be achieved in a variety of ways. For the case of the snake-like manipulator, each degree of freedom is controlled by an antagonistic pair of actuators. The hexapedal walker and the inchworm robot use return springs to provide the restoring force.

For the actuator in accordance with a preferred embodiment, the restoring force is provided by a flexible frame that is directly bonded to the elastomeric film, resulting in a compact actuator module with embedded actuation.

A dielectric elastomer used in a preferred embodiment, for example, can be, but not limited to, silicone or acrylics such as, VHB™ 4910 provided by 3M Corporation of St. Paul, Minn. and sold as an adhesive tape. This is a very elastic material and has been shown to produce the greatest strains and energy densities in laboratory demonstrations. Up to 380% strain has been reported. However, such high strains have not been reported for actuators when the material is used in practical applications. This is due to the fact that in applications the boundary conditions that maximize performance are not maintained. The modular actuator in accordance with the present invention minimizes and preferably eliminates this problem.

In a preferred embodiment, the dielectric elastomer that separates the electrodes experiences an electrostatic pressure as a charge is applied to the electrodes. If both the dielectric material and the electrodes are compliant, as they conform to the changing shape of a polymer, then the effective pressure is given by $$p = \varepsilon\varepsilon_0 E^2 = \varepsilon\varepsilon_0\left(\frac{V}{z}\right)^2 \quad (1)$$

where $\varepsilon$ is the relative dielectric constant, $\varepsilon_0$ is the permittivity of free space, and E is the applied electric field, which is the ratio of the applied voltage (V) over the film thickness (z). In general, the larger the effective pressure, the larger the actuator strain obtained.

Understanding the implication of this equation is useful in actuator design. Equation 1 suggests that a high effective pressure results from a large electric field. The maximum electric field that can be applied to the film without damaging it is the electric breakdown field. The breakdown field for VHB™ 4910 increases by more than an order of magnitude with pre-stretching of the film. Since the electric field term (E) in Equation 1 is squared, pre-stretching this material can increase the maximum attainable effective pressure by at least an order of magnitude. To fully exploit the potential of dielectric elastomer actuators, the pre-stretching boundary conditions on the film are important. The amount of pre-stretching of the film also affects the dielectric constant, however its variance with pre-strain is small and therefore believed to be less significant in actuator development.

Figure 3A:
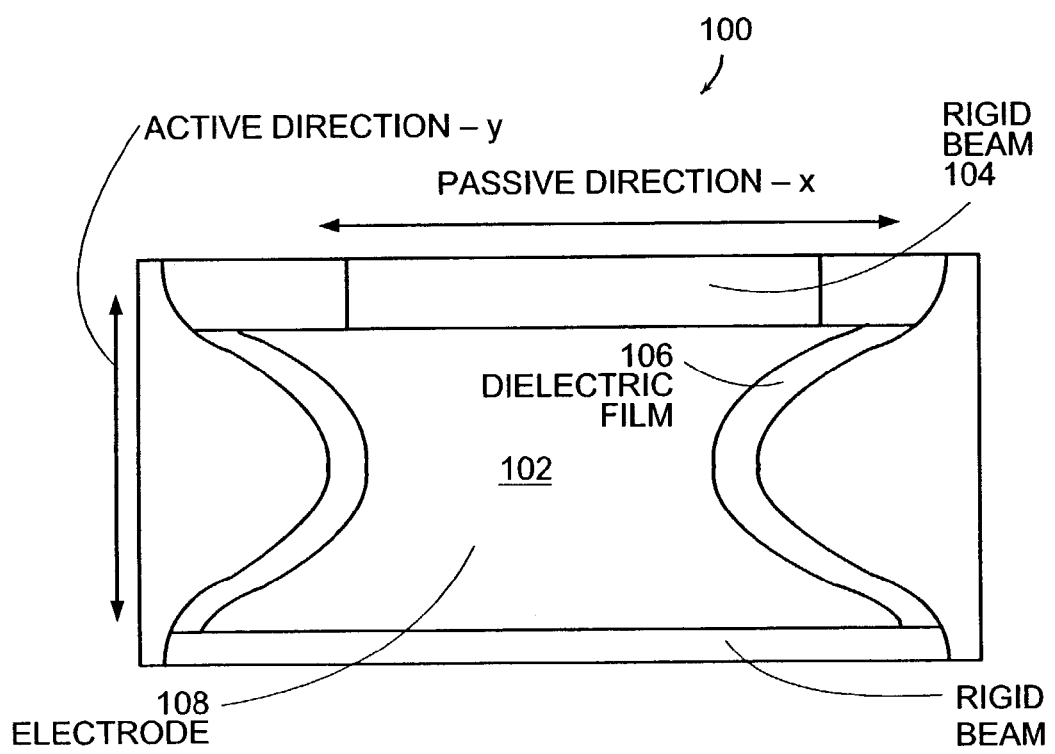
FIGS. 3A and 3B schematically illustrate a prior art method and a method of implementing dielectric elastomer actuators in accordance with a preferred embodiment of the present invention, respectively, including a linear dielectric elastomer actuator having a flexible frame.

A simple way to produce linear motion with dielectric actuators is to stretch the two parallel beams, as shown in FIG. 3A. As a voltage is applied to the electrodes, the film expands in area and allows the beams to separate if they are pre-loaded. Pre-stretching the film reduces the thickness of the film, which in turn reduces the voltage to achieve a given electric field. The vertical sides of the film are free, allowing the film to bow in.

From FIG. 3A it is evident that the amount of pre-stretching in the passive direction is not uniform throughout the actuator film 106. Since the film is largely incompressible (constant volume), it is thin close to the beams 104 and thicker at the center. Applying an electric potential across the electrodes creates a non-uniform pressure and deformation of the film. Thus, not all areas of the film are actuated fully. Since the film is not constrained in the passive directions, it exhibits some motion in that direction upon actuation. This motion does not produce useful mechanical work. It is desirous to maintain the pre-stretched boundary conditions on the film without interfering with the desired motion of the actuator. In one embodiment, in order to ensure uniformity in the film, the aspect ratio of the actuator is increased by increasing the width (x) and reducing the height (y). However, such geometry is inappropriate for many applications.

Figure 3B:
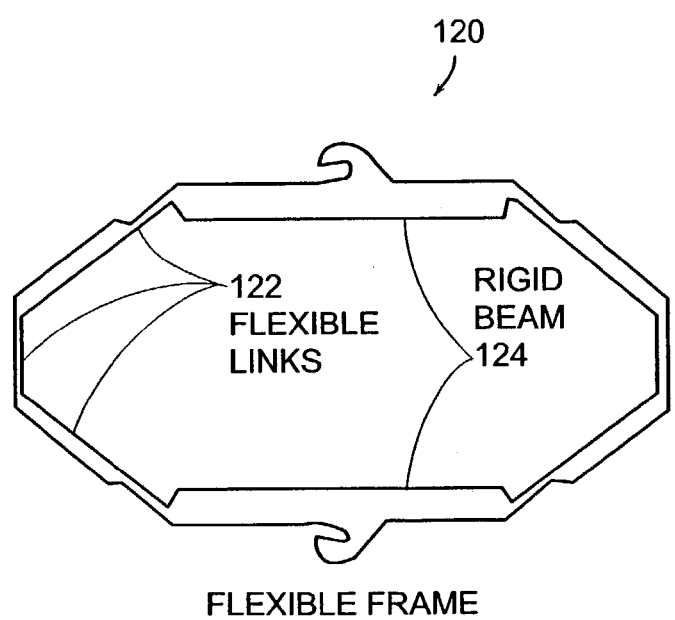

In a preferred embodiment, to solve this problem, the film can be incorporated into a flexible frame 122, as shown in FIG. 3B. The frame 120 consists of two parallel beams 124 that are connected with flexible links 122. The frame geometry is designed such that all areas of film undergo approximately equal expansion under actuation. The frame is a monolithic piece of Delrin®. Flexibility is provided by reducing the wall thickness in certain areas. The film is placed between two such frames.

A second function of the frame is that it provides an elastic restoring force that permits the actuator to work under both tension and compression. A welcome side-effect of the frame is that the risk of tearing of the film at its exposed edges is greatly reduced. The frame also prevents current arcs from developing around the edges of the film.

Figure 4B:
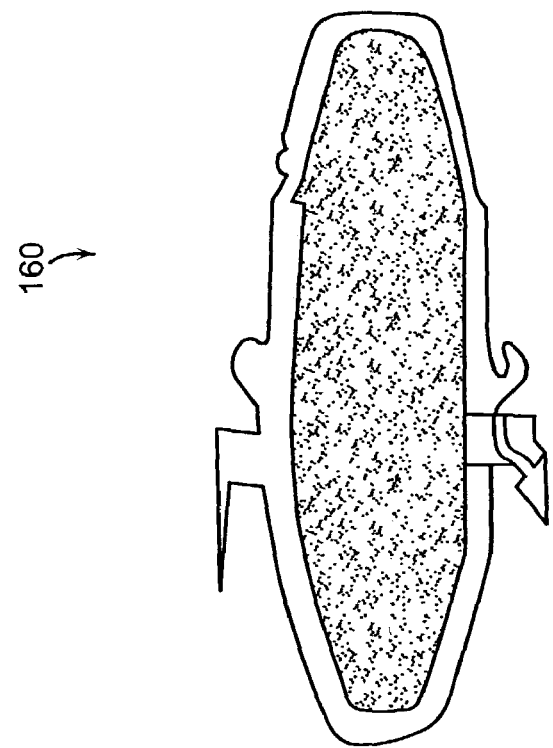
FIG. 4B is a photograph of the embodiment diagrammatically illustrated in FIG. 4A.
Figure 4A:
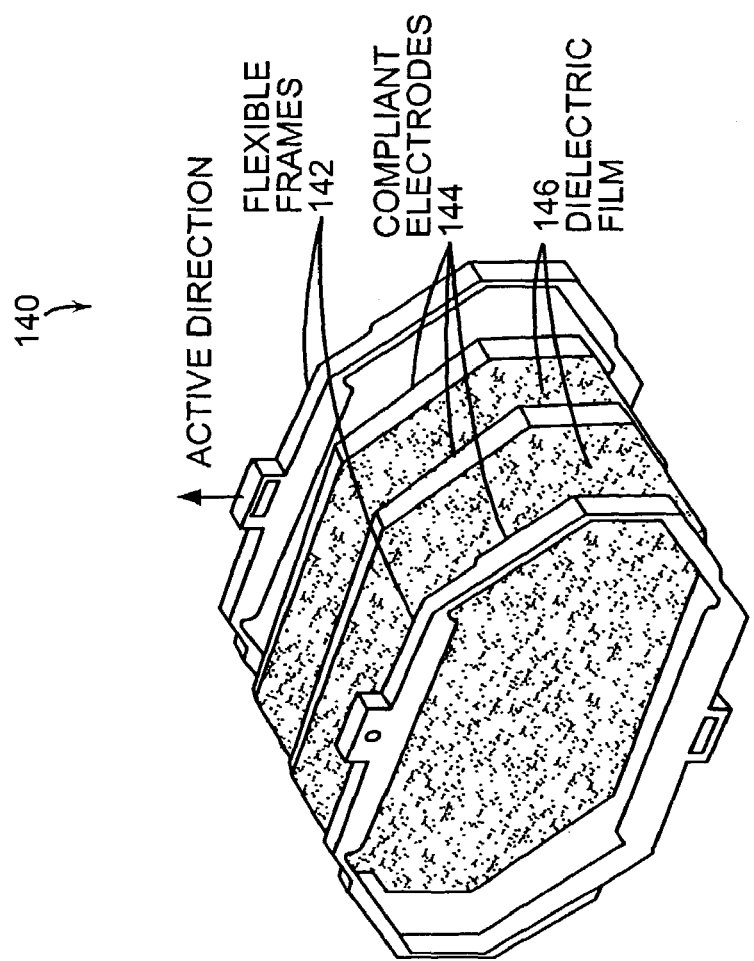
FIG. 4A is an exploded view of an actuator module with a plurality of elastomer films integrated into a flexible frame in accordance with a preferred embodiment of the present invention.

FIG. 4A shows an exploded view of the actuator module 140 with a plurality of the dielectric films 146 integrated into its flexible frame 142. Higher actuation forces can be achieved by increasing the number of layers of film sandwiched between the frames. When using an even number of dielectric films, the electrodes can be arranged so that the two outer electrodes are both grounded. The high voltage is only present in the inside of the actuator and is thus shielded from the environment. The actuator in this preferred embodiment uses two layers of the dielectric polymer as shown in FIGS. 4A and 4B.

Figure 5:
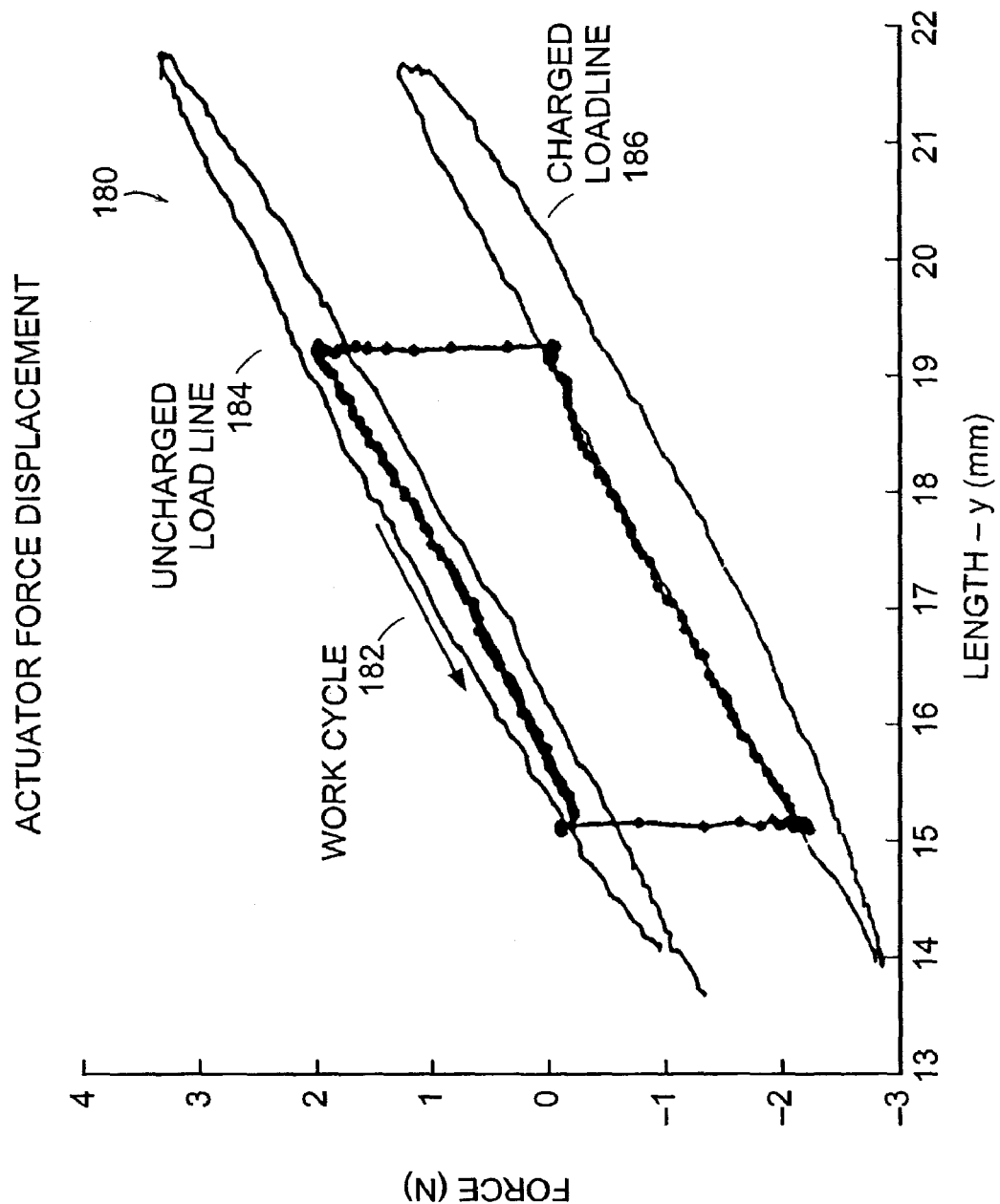
FIG. 5 graphically illustrates the performance of the actuator in terms of the force-displacement characteristics in accordance with a preferred embodiment of the present invention.

To evaluate the performance of the actuator, the force-displacement characteristics are measured and graphically illustrated in FIG. 5. Curves are shown for an actuator with 0 kV, 5.5 kV, and completing a work cycle 182. The work cycle is generated by constraining the displacement of the actuator. A voltage of 5.5 kV is applied and the force applied to the constraint is recorded. While keeping the voltage fixed, the constraint is moved until the actuator force is zero. The voltage is then removed and the process is repeated. The area enclosed by a counter-clockwise work cycle corresponds to the work output per cycle.

The slope of the curve, which corresponds to the stiffness of the actuator, is nearly constant at 0.5 N/mm for the range shown. Some hysteresis is evident, which is attributed to the viscoelastic losses of the film and frame. As shown in FIG. 5, changing the voltage from 0 to 5.5 kV offsets the curve, but does not significantly change its slope, suggesting that the stiffness of the actuator is independent of the state of actuation over the range shown. The actuator can therefore be modeled as a spring 200 that changes its undeformed length upon actuation while maintaining its stiffness, as shown in FIG. 6A. The corresponding force-displacement curves 240 are shown in FIG. 6B.

Figure 6B:
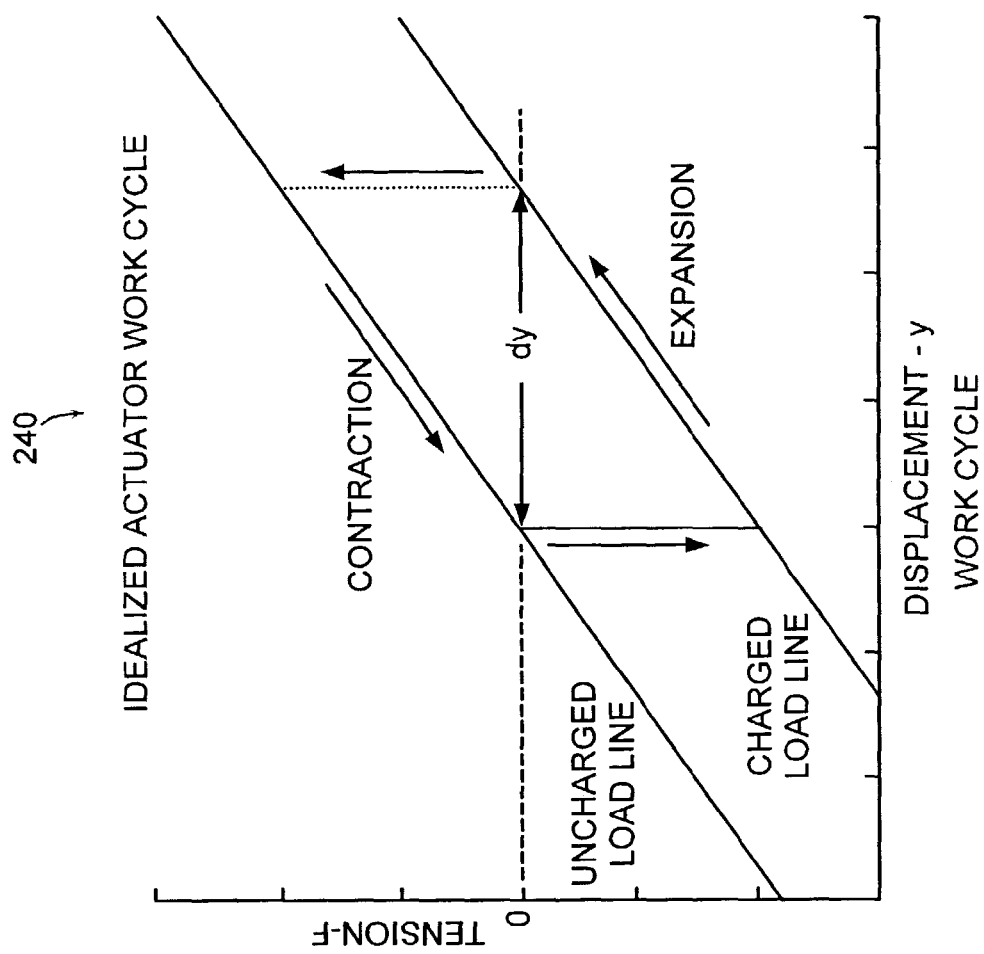
FIGS. 6A and 6B illustrate a model of the actuator as a spring that changes its undeformed length upon actuation and corresponding force-displacement curves in accordance with preferred embodiments of the present invention.
Figure 6A:
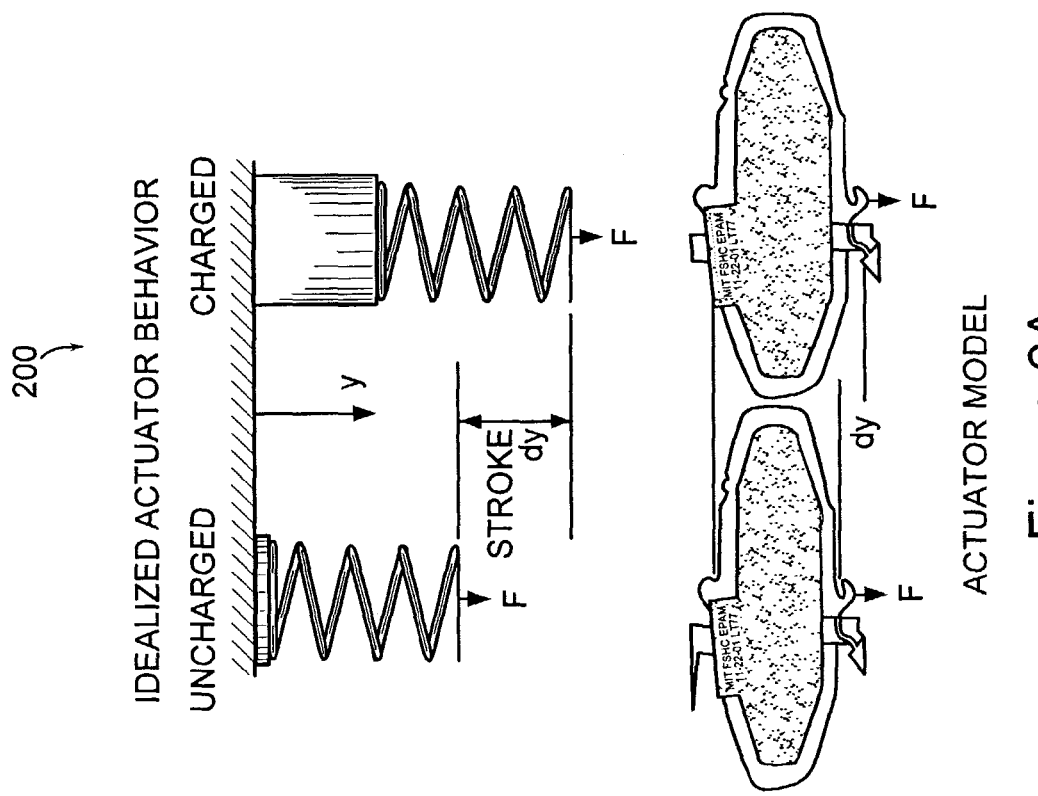

In FIG. 6B it can be seen that the vertical separation between the charged and uncharged stiffness curves represents the force differential the actuator can achieve if rigidly constrained. The horizontal separation of the curves at a given force corresponds to the actuator stroke, which is independent of external loading, provided the load remains constant throughout the stroke. Due to the compliance of the actuator, its length changes with external loading. The force generated by the actuator is not constant throughout the stroke. The force reaches its maximum at the beginning and linearly decreases to zero at the end of the stroke. However, for most applications including the BRAID, an actuator that provides uniform force is more desirable. Such actuator performance can be achieved by tuning the force displacement profiles in FIG. 6B with a passive element.

Figure 7B:
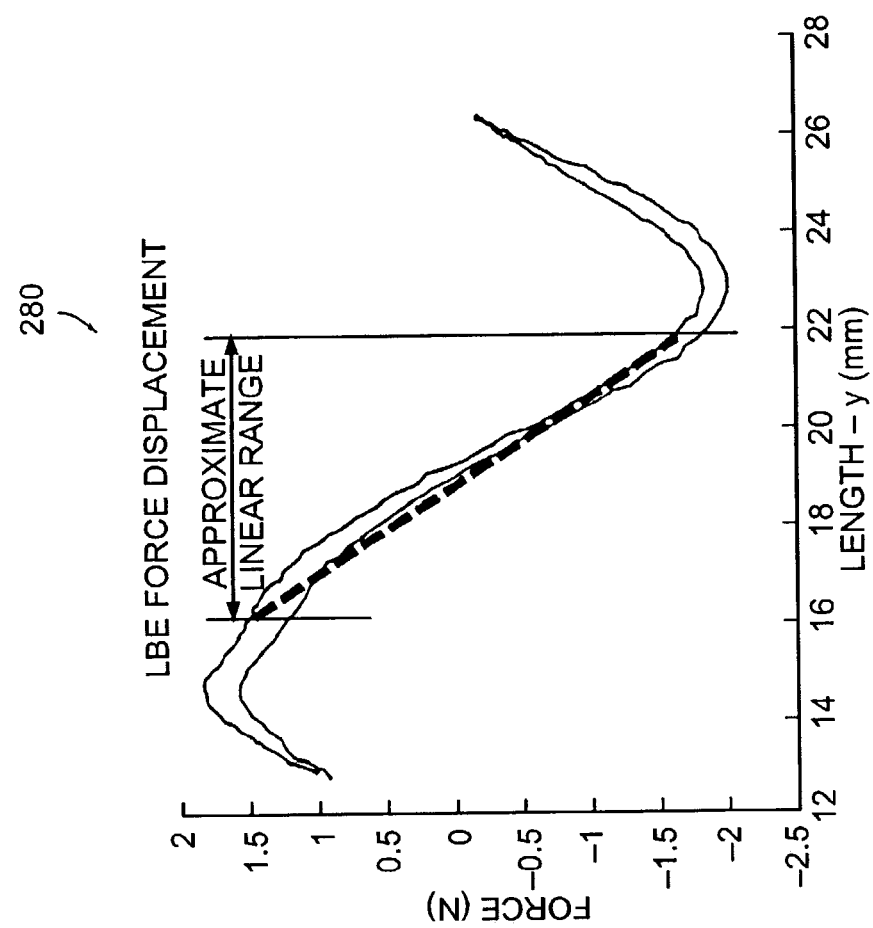
FIGS. 7A and 7B illustrate a linear bi-stable element (LBE) and its corresponding force-displacement characteristics in accordance with a preferred embodiment of the present invention.
Figure 7A:
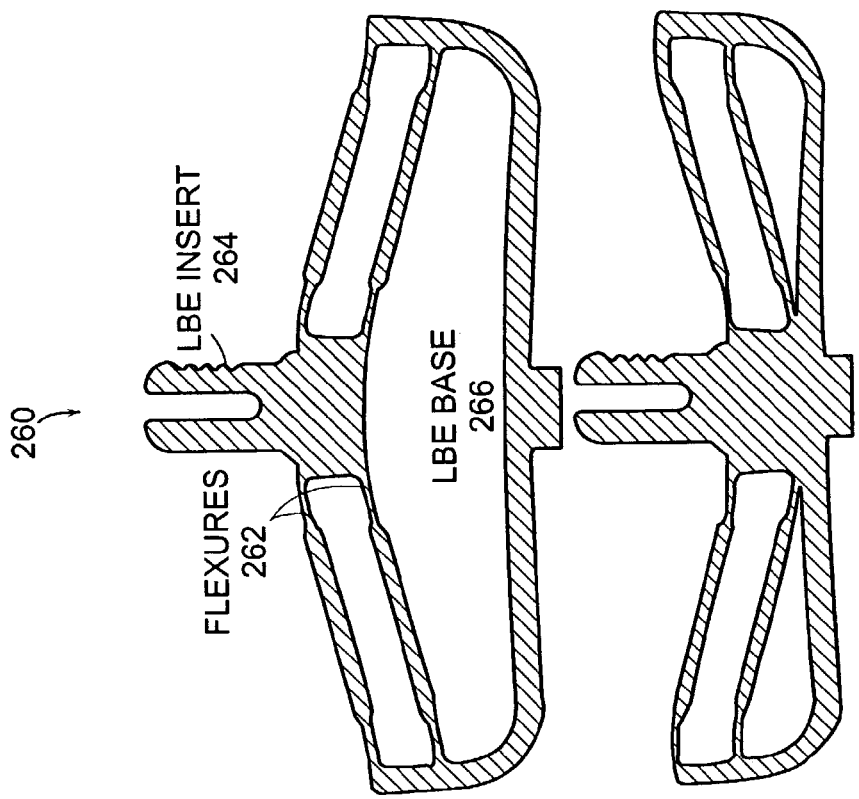

FIGS. 7A and 7B show a linear bi-stable element (LBE) and its corresponding force-displacement characteristics. The LBE consists of a base 266 that elastically supports two opposing flexure arms 262. As a slightly oversized insert 264 is placed between the arms, it pre-loads the base and causes the assembly to have two stable configurations. Between these bi-stable states, there is a region where the force-displacement curve is approximately linear and has a negative slope, as shown in FIG. 7B. The slope is a function of the geometry and material of the LBE. By varying the width of the insert, the slope of the force-displacement curve in the near-linear region can be tuned precisely. The stiffness of the actuator and LBE in parallel is equivalent to the sum of the actuator stiffness and LBE stiffness. Thus, by designing a LBE with a slope of negative 0.5 N/mm over its linear range, the combined actuator module can be tuned to have zero stiffness (constant force output) over an operating range.

FIG. 8A shows the force displacement characteristics 300 of the combined actuator module including the passive element. The work cycle measurements presented in FIG. 5 were repeated. FIG. 8A shows a range over which the actuator force is approximately constant. Comparing the work cycles in FIG. 5 and FIG. 8A, the advantages of the compensated actuator become evident. The stroke of the actuator is increased from about 4 mm to 8 mm.

By using mechanical stops the actuator motion can be confined to the zero-stiffness range. Such an actuator has uniform force-displacement characteristics and reaches the same endpoints regardless of loading, provided it is within actuator capability. Thus, such an actuator module provides robust binary operation. By using the actuator in a binary fashion, the hysteresis introduced by the viscoelastic properties of the elastomer is no longer a concern.

FIGS. 8B and 8C graphically illustrate the displacement 320 and current 340 of the actuator versus time. Most of the current is drawn as the actuator charges. Some leakage current is drawn once the actuated state is reached. If the dielectric elastomer actuator behaved as a true capacitor, there would be no current drawn at steady state. The actuator is switched off by draining the charge through a resistor. Theoretically, this energy can be recovered by circuitry and returned to an energy storage device such as a battery. While the voltage required for actuation is very high (5.5 kV), the current drawn is extremely low. The peak current for the given actuator is about 0.03 mA, which corresponds to a maximum electrical input of 0.165 W.

Figure 9B:
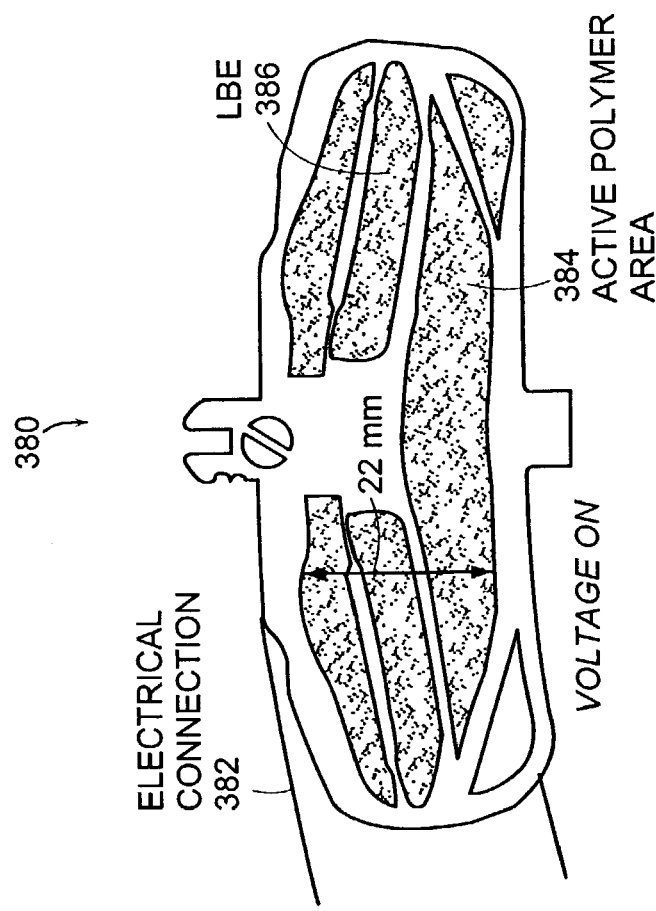
FIGS. 9A and 9B illustrate an embedded flexible-frame actuator in two states in accordance with a preferred embodiment of the present invention.
Figure 9A:
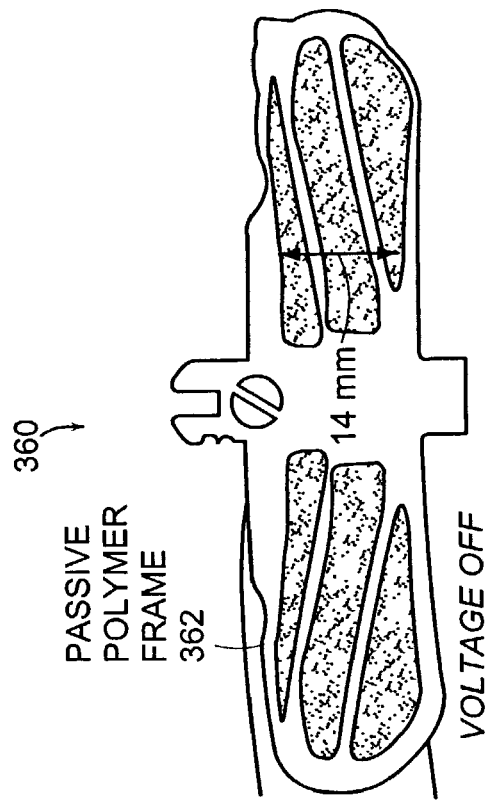

FIGS. 9A and 9B show the actuator in its two states. The actuation force is about 1.5 N. The actuator stroke is about 8 mm, with the polymer film undergoing a strain of about 57%. The weight of a complete actuator unit is approximately 6 grams. Most of this weight is due to the frame and bi-stable element. For a double-layered actuator, the weight of the dielectric elastomer and electrodes itself is less than 0.1 grams, only a fraction of what force the actuator is capable of providing.

The range of motion of the actuator can be further increased in another embodiment by including passive elements that have the desired negative stiffness over a larger range. The stroke of the current prototype is limited by the range of the LBE, rather than by the film or frame.

When the actuators are implemented into the BRAID, they behave as structural elements with embedded actuation. Three parallel actuators form a single stage. A combination of identical stages forms the BRAID. The binary actuators and in particular the BRAID is a primarily all-plastic, lightweight, binary manipulator.

FIG. 10 shows a view of a single BRAID stage before the dielectric elastomer actuators are integrated. The kinematics of the mechanism requires a revolute joint 404 at the bottom of the actuator and a spherical joint 402 at the top. One rotational DOF is provided by a cross-flexural hinge machined from Delrin®. The hinge at the top of the frame approximates a spherical joint for small motions. It consists of a thin compliant leaf that connects two pointed stiff elements.

Figure 11A:
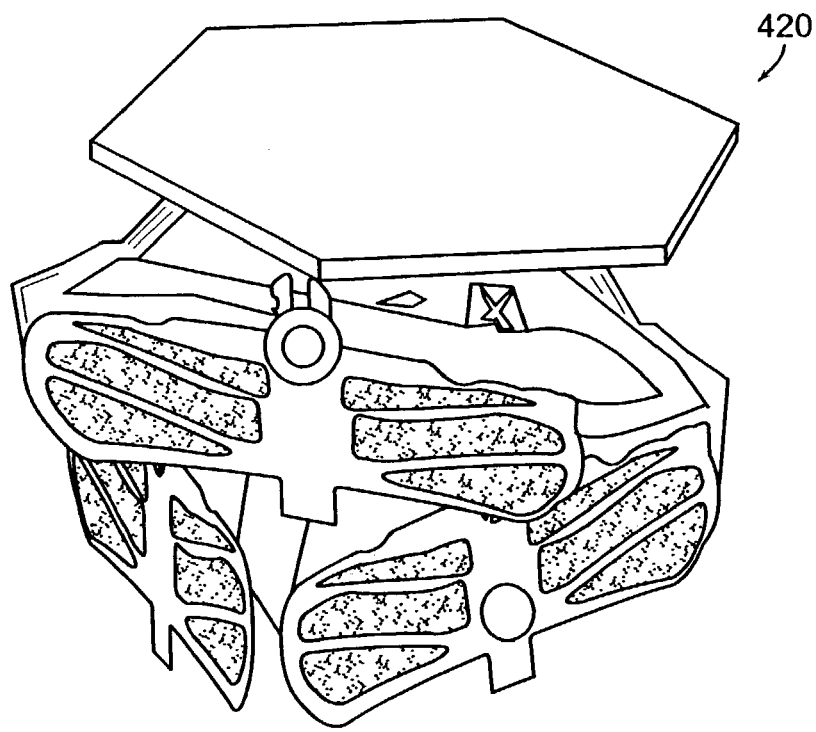
FIGS. 11A and 11B illustrate a two-stage binary actuated device manipulating an object, for example, a mirror, in accordance with a preferred embodiment of the present invention.
Figure 11B:
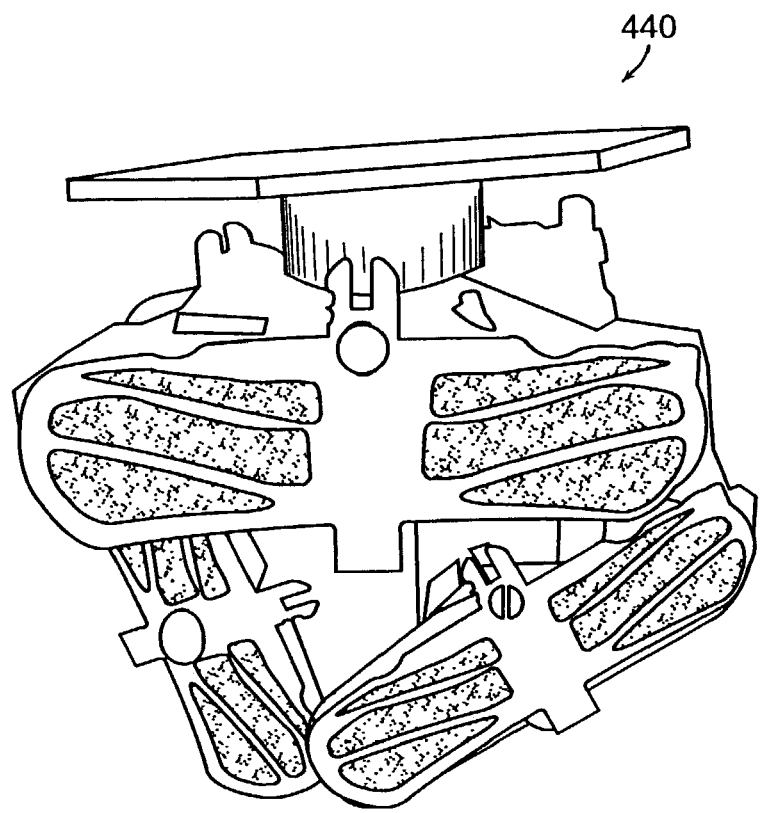

FIGS. 11A and 11B show a two-stage BRAID prototype manipulating a mirror. It has six binary DOF, allowing $2^6$=64 discrete states. Each degree of freedom is controlled by a simple switch. The total weight of the two-stage BRAID prototype is about 65 grams. The weight of the active actuator material itself, i.e. the dielectric film and electrodes, accounts for only 1% of the total weight. This suggests that most of the weight savings can be achieved by optimizing the structure rather than the actuators themselves. The performance of the BRAID presented here is sufficient to manipulate a small camera.

Dielectric elastomer artificial muscles have been introduced into the field of high-DOF binary robotics. The performance of these actuators shows promise of making high-DOF binary robotic systems practical. Preferred embodiments of the present invention include implementing dielectric elastomer actuators to perform mechanical work. A preferred embodiment includes embedding the elastomer actuators into flexible frames which maintains the desired boundary conditions on the actuator film and results in the performance of mechanical work. By adding a passive element, a self-contained actuator module is formed that can work both under tension and compression and produces approximately uniform force throughout the stroke. The active actuator area achieves a relative strain of 57% and provides a force of 1.5 N, while weighing 6 grams. The two-stage BRAID device illustrates that these actuators are a feasible alternative to conventional technologies. The simplicity of the actuators allows for high DOF binary system devices that are virtually all-plastic, inexpensive, lightweight, and easy to control devices.

A preferred embodiment of the present invention includes binary elastomeric actuated robots for space robotic systems. These robots include simple binary actuators for binary operations as described herein, have a compact polymer structure, and compliant, bi-stable mechanisms such as, for example, devices including detents. The detents achieve binary actuation due to the creation of sliding surfaces. FIGS. 12A-12D illustrate applications for space robots including the binary elastomer actuators. The actuators of the preferred embodiment can be integrated into rovers, satellites and constructions devices.

Figure 13:
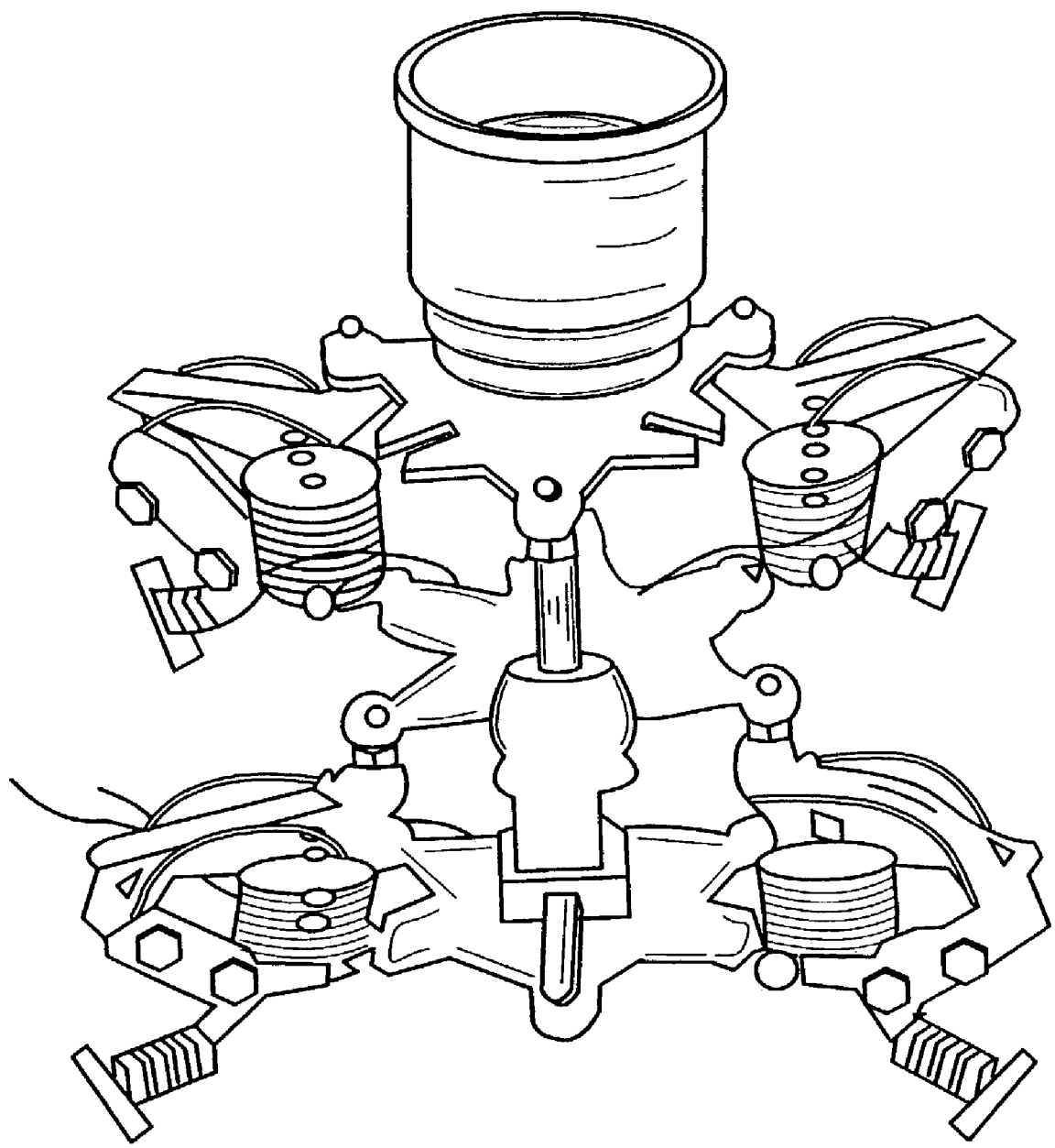
FIG. 13 illustrates an embodiment of an electromagnetic actuator device.
Figure 14B:
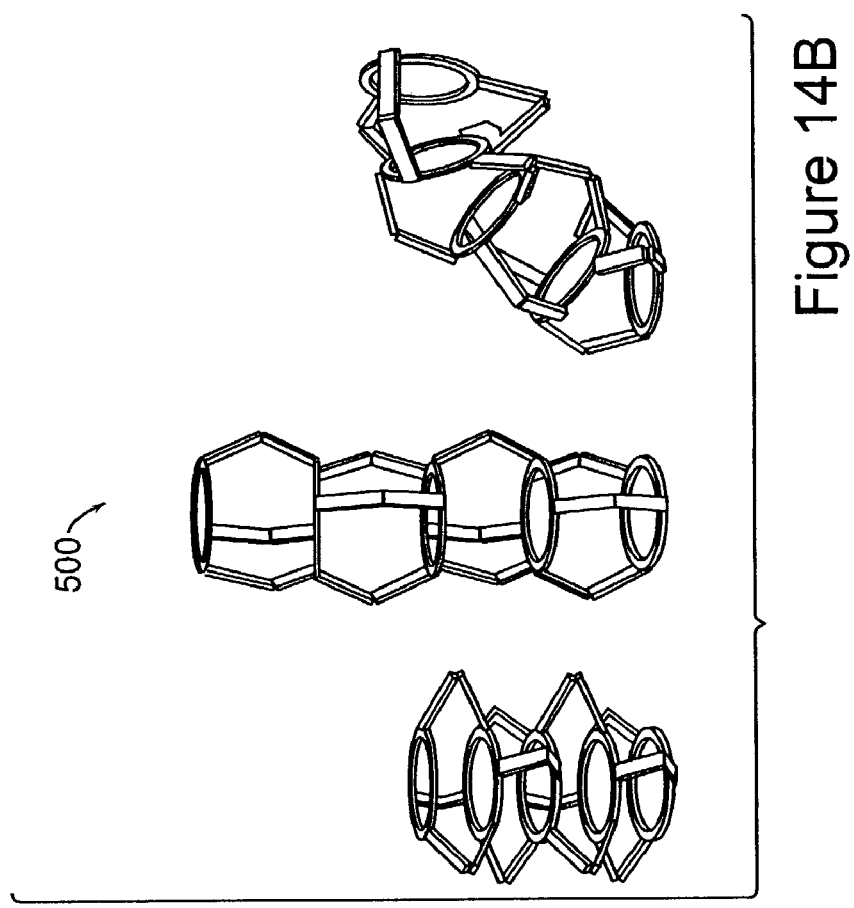
FIGS. 14A and 14B schematically illustrate a binary robotic articulated device having a serial stack of parallel stages, in accordance with a preferred embodiment of the present invention.
Figure 14A:
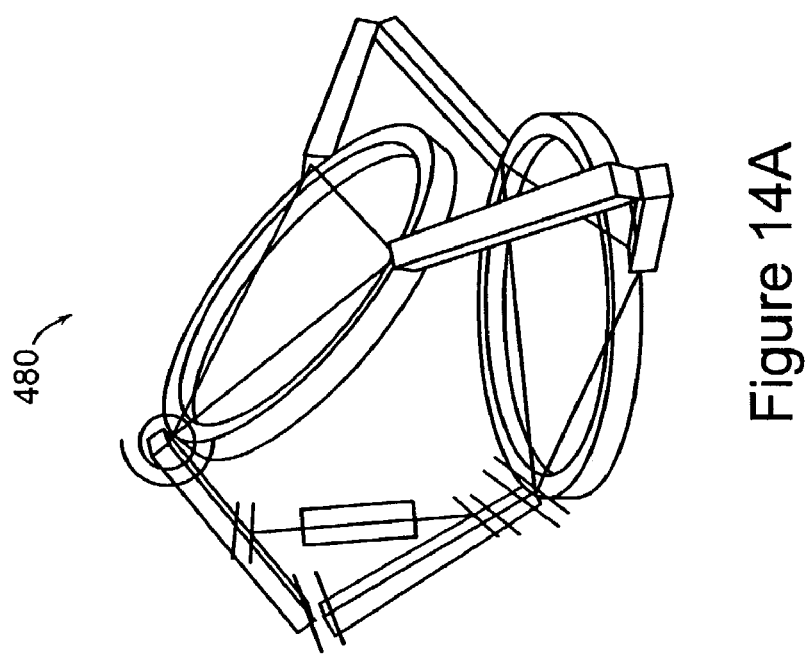

FIGS. 14A and 14B schematically illustrate a binary robotic articulated device having a serial stack of parallel stages, each having three binary actuators in accordance with a preferred embodiment of the present invention. FIG. 13 illustrates an embodiment of an electromagnetic actuator device.

FIGS. 15A and 15B illustrate the system architecture of a device having at least an electromagnetic actuator in combination with elastomeric actuator. The device includes bi-stable detent mechanisms 522, flexural bearings 526 and a preload magnet 528. The elastomer actuator can be used in parallel with the electromagnetic actuator and functions as an element that assists in actuation.

Figure 16B:
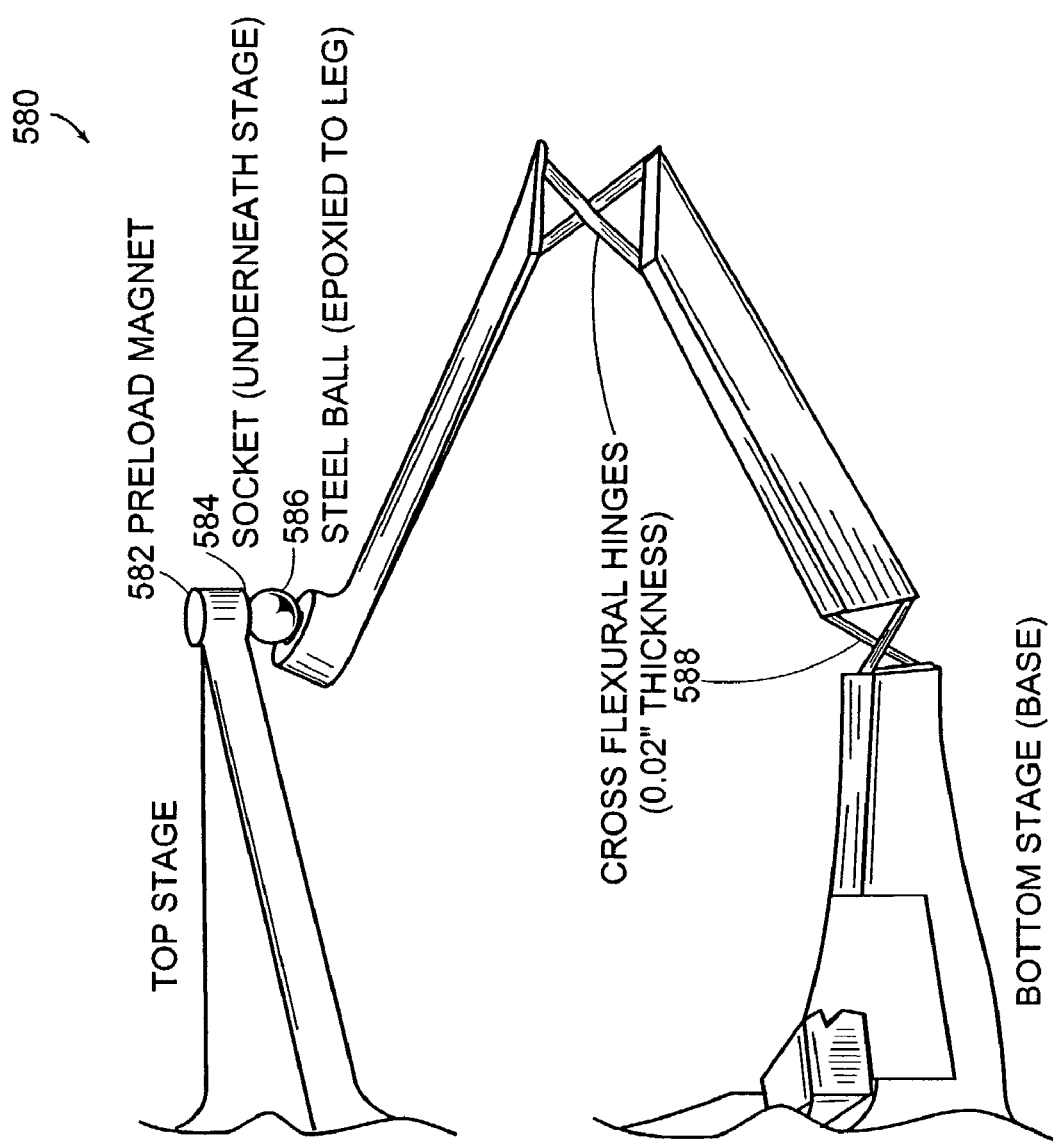
FIGS. 16A and 16B illustrate a preferred embodiment of compliant bearings having electromagnetic actuators that can have elastomeric actuators in combination therewith in accordance with the present invention.
Figure 16A:
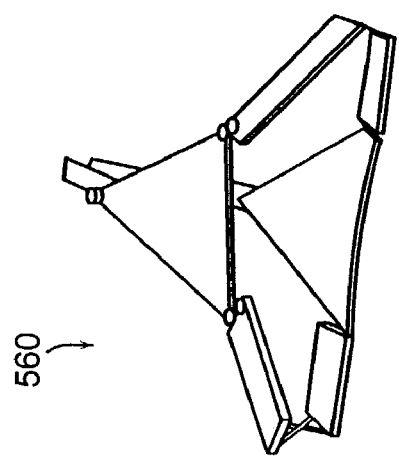

FIGS. 16A and 16B illustrate a preferred embodiment of compliant bearings having electromagnetic actuators in accordance with the present invention. The ball 586 and socket 584 provide spherical joint. The ball-socket joint introduces moving parts into the device. In a preferred embodiment, the compliant bearings can have elastomeric actuators in combination with electromagnetic actuators.

Figure 17B:
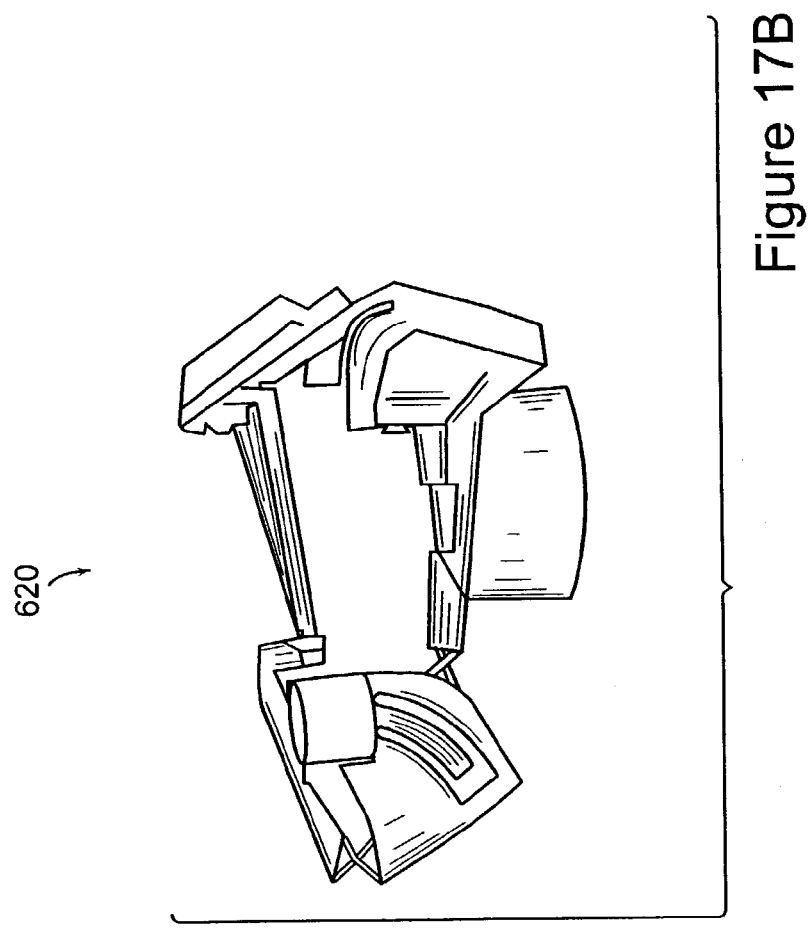
FIGS. 17A and 17B illustrate a preferred embodiment of electromagnetic actuators that can have elastomeric actuators combined therewith in accordance with the present invention.
Figure 17A:
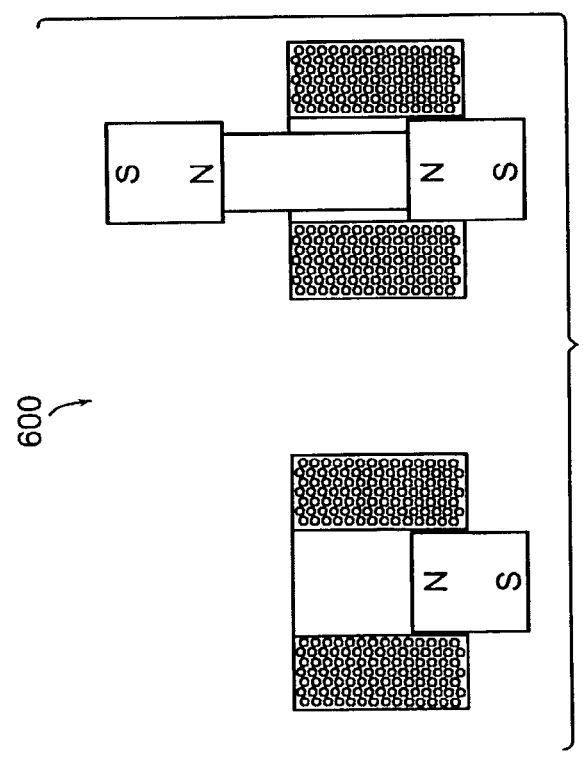

FIGS. 17A and 17B illustrate a preferred embodiment of electromagnetic actuators. Solenoids 600 can be used in a push-pull configuration. The solenoid actuators can include multiple stages, for example, two stages. A preferred embodiment can include elastomeric actuators in combination with the solenoid actuators to actuate various mechanical systems.

FIGS. 18A-18C illustrate preferred embodiments of the present invention including bi-stable mechanisms in parallel with an actuator. These embodiments maintain binary configurations without actuator power which is important in many applications such as space systems applications. FIGS. 19A-19C further illustrate embodiments of devices having bi-stable mechanisms in accordance with the present invention.

A preferred embodiment of the present invention includes an artificial muscle actuator for various robotic systems. An assembly of the preferred embodiment allows electrostrictive polymer artificial muscles (EPAMs) or dielectric elastomer actuators to effectively and easily be implemented in practical applications. The operating principle of the EPAM assembly is shown and discussed hereinbefore with respect to FIGS. 2A and 2B. An elastomeric film 62 is coated on both sides with compliant electrodes 64. The compliant electrodes is made from a group including essentially, but not limited to, graphite, carbon, conductive polymers and thin metal films. As a voltage is applied across the electrodes, the electrostatic charges will force the film 62 to compress in thickness and expand in area. This expansion in area can be used to actuate various mechanical systems.

In an embodiment, the film is under tension at all times, and therefore the dielectric elastomer actuator assembly cannot work under compression without an additional force. In another embodiment, the film is in combination with a frame and the actuator assembly can work under compression and tension, and can both push and pull.

Figure 20:
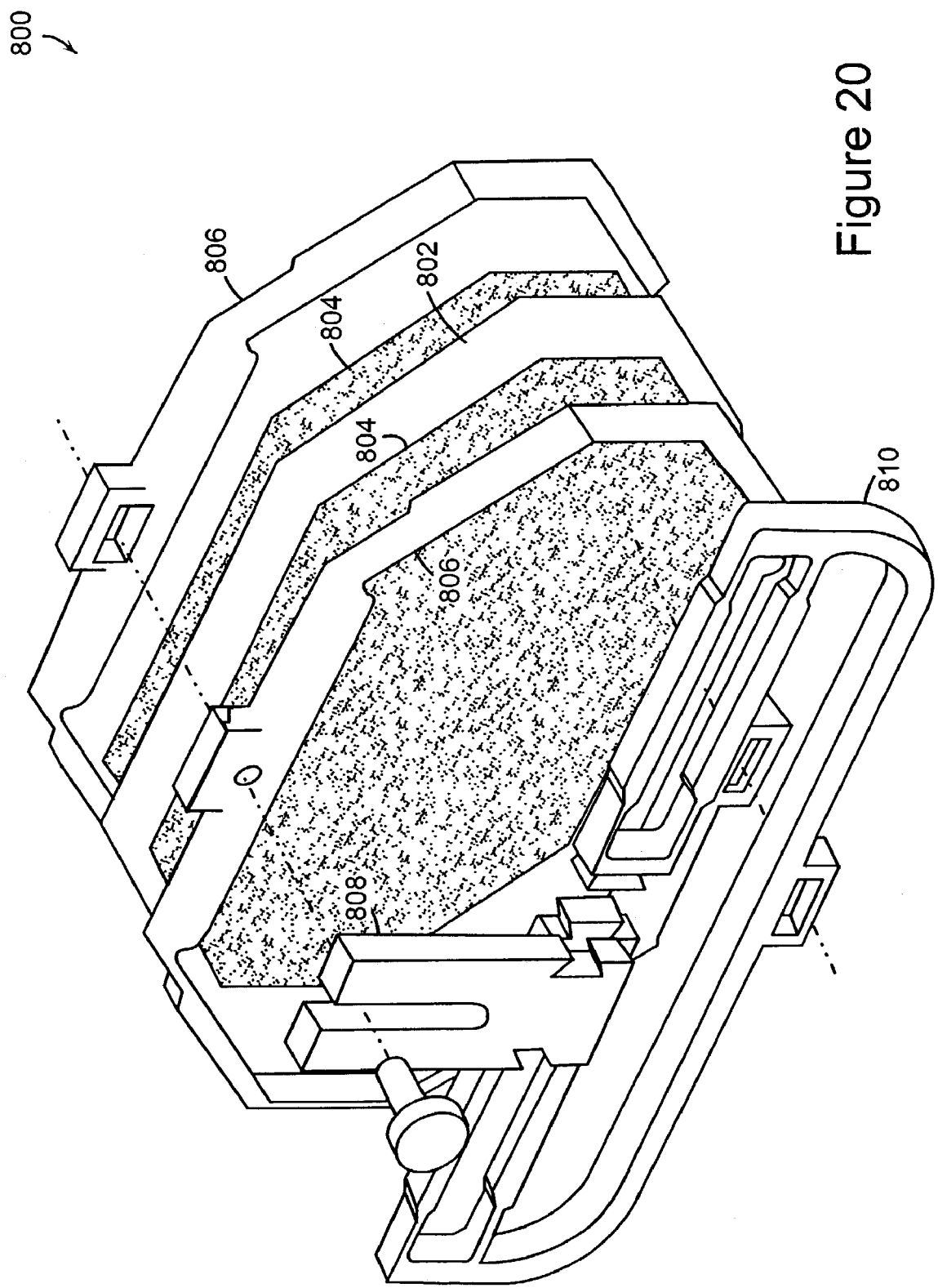
FIG. 20 is an exploded view of an actuator module in accordance with a preferred embodiment of the present invention.

The actuator frame both pre-stretches the film and provides a restoring force in an active direction. A restoring force is tuned with an additional passive element to provide a constant force throughout the stroke. The passive element can be tuned such that when two actuators are used as antagonistic pairs, they behave in a bi-stable fashion. FIG. 20 illustrates an exploded view of an actuator module in accordance with a preferred embodiment of the present invention. The actuator includes an elastomeric polymer film 802, compliant electrodes 804, a flexible frame 806, a passive element base 808 and a passive element insert 810 to preload passive element base 808.

The elastomeric polymer film 802 and the compliant electrodes 804 form the EPAM. The EPAM is stretched in both planar directions by being sandwiched between two flexible frames 804. These components 802, 804, 806 form an actuator that can both work under tension and compression, however the motion of the actuator is limited by the inherent stiffness of the film and frame. The passive element 808, 810 is connected in parallel with the actuator and effectively cancels the stiffness of the frame and film.

Figure 21A:
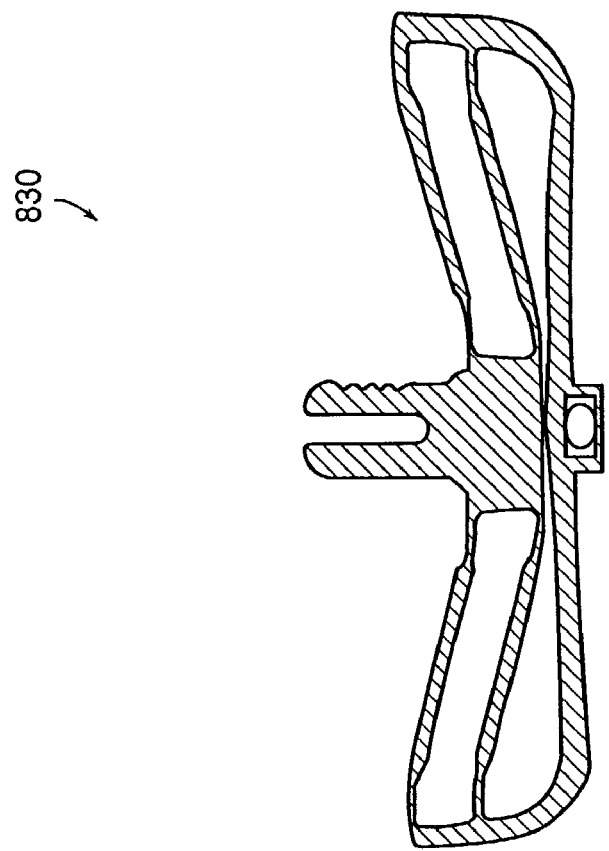
FIGS. 21A and 21B are views of the passive element illustrating two stable states of the actuator assembly in accordance with a preferred embodiment of the present invention.
Figure 21B:
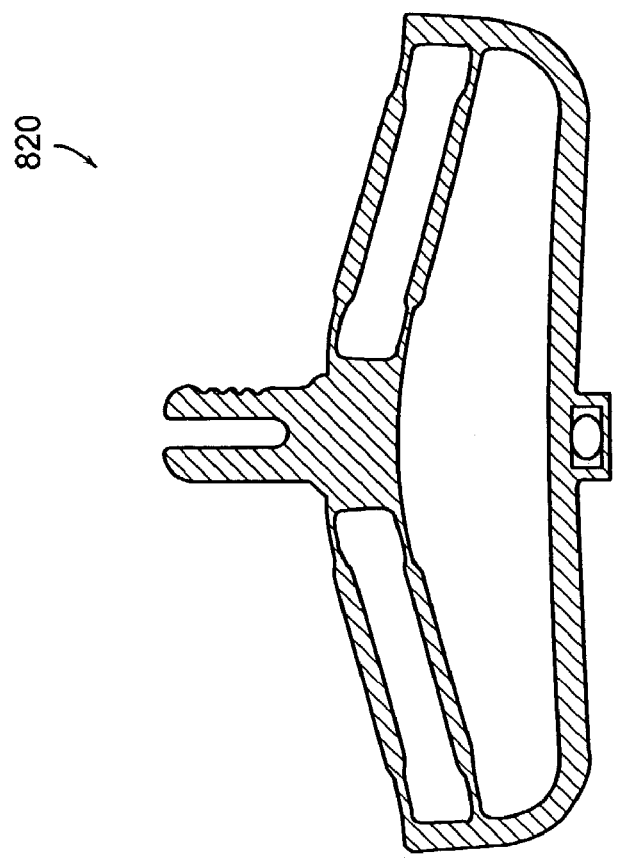

FIGS. 21A and 21B show the passive element in accordance with the present invention. It has two bi-stable states 820, 830. Between these two states there is a range where the force-displacement curve is negative, which cancels the positive force-displacement curve of the film and frame. This results in a self-contained dielectric elastomer actuator module that can both work under tension and compression (e.g. push and pull), and that produces a almost constant force throughout the actuator stroke.

Figure 22B:
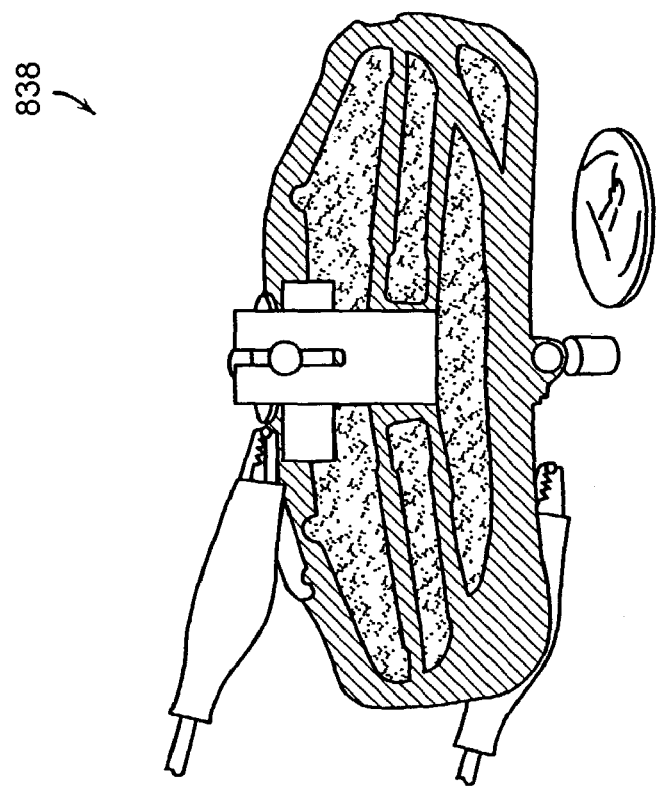
FIGS. 22A and 22B are views illustrating the actuator in its on and off positions in accordance with a preferred embodiment of the present invention.
Figure 22A:
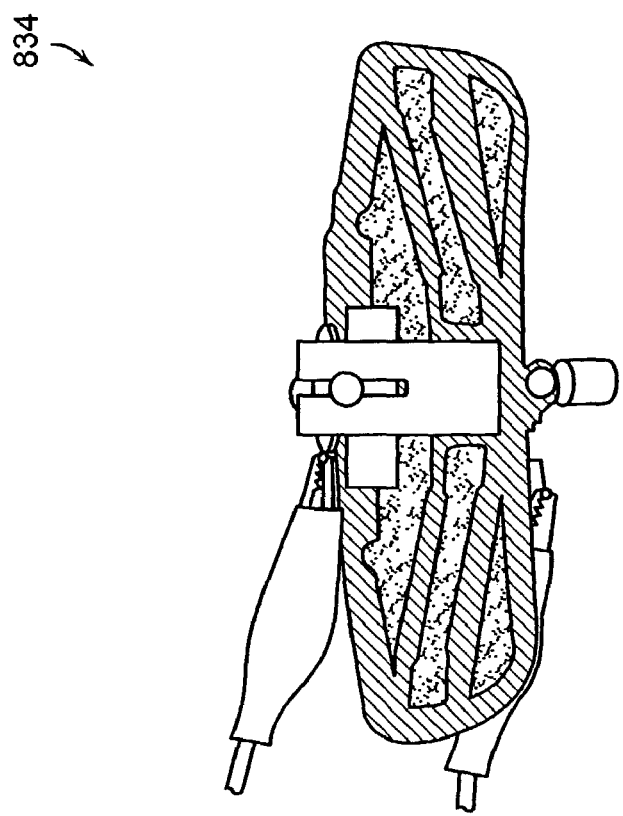

FIGS. 22A and 22B illustrate views of the actuator in its on and off positions in accordance with a preferred embodiment of the present invention. In a preferred embodiment, the dielectric elastomer actuator can achieve larger displacements. Another advantage of preferred embodiments includes an actuator with constant force throughout its stroke. Preferred embodiments can be used in robotic systems where conventional actuator technology is not feasible, for example, inside a magnetic resonance scanner. It can also be implemented in a surgical assist robot.

In a preferred embodiment, a flexible frame is a material that encloses a single or multiple sections of the elastomer film and serves one or both of the following functions. Deformation of the frame results in a change of the enclosed area. It pre-stretches the elastomer film in one or two planar directions. It also provides an elastic restoring force so that the actuator can work both under tension and compression. In an embodiment, the frame can be on just one or alternatively both sides of the elastomer film. It can also be directly embedded in the elastomeric film. A variety of geometries of frames meet the above functions.

Figure 23A:
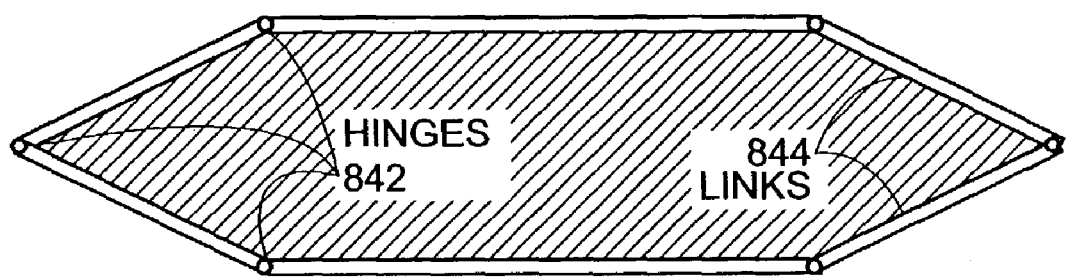
FIGS. 23A and 23B are schematic views of a hexagonal frame in accordance with a preferred embodiment of the present invention.
Figure 23B:
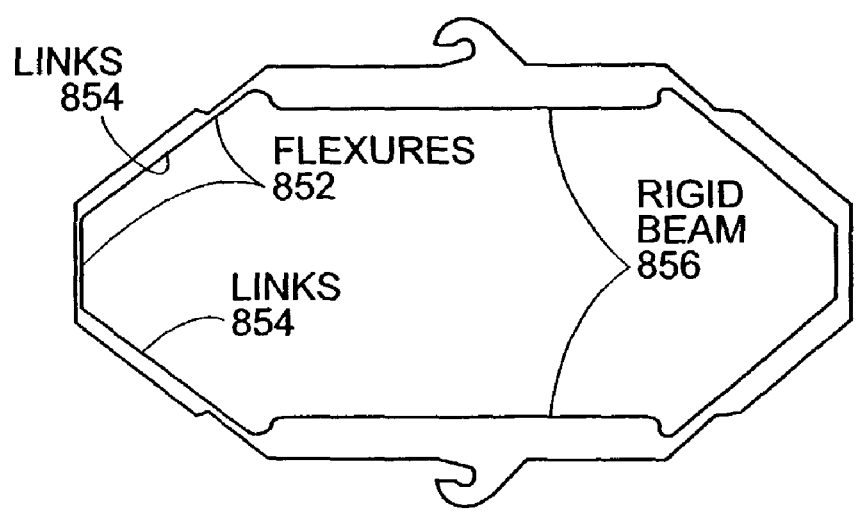

FIGS. 23A and 23B are views illustrating a hexagonal frame in accordance with a preferred embodiment of the present invention. In this embodiment, the frame can consist of two parallel beams that are connected by two pairs of links 844. The parallel beams move apart upon actuation.

Figure 24:
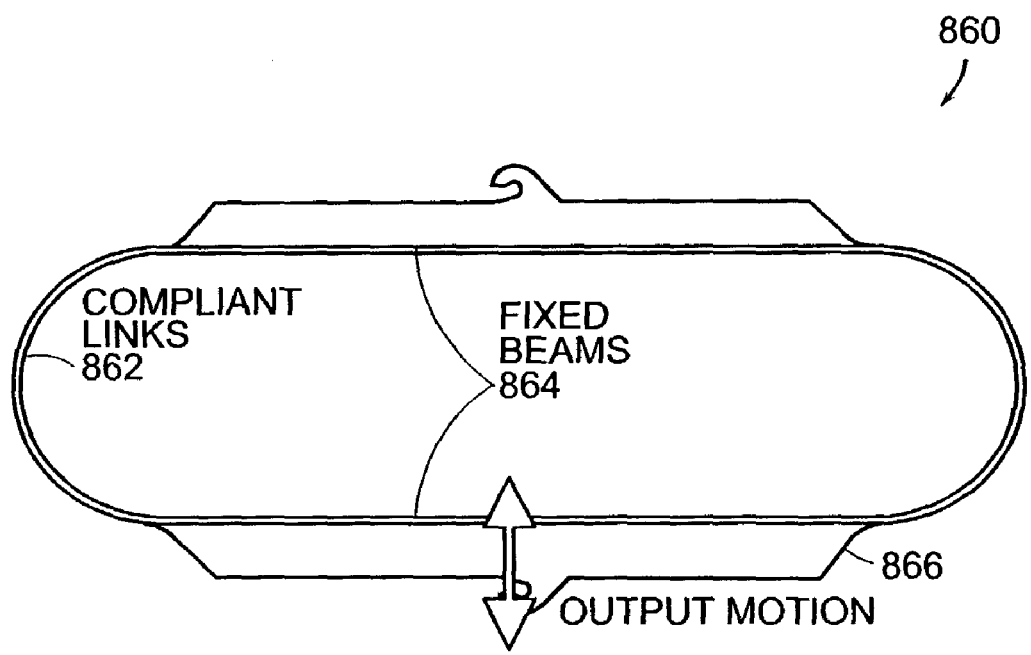
FIG. 24 is a preferred embodiment of a frame with compliant sides, essentially parallel beams with a continuous border, in accordance with the present invention.

FIG. 24 is a preferred embodiment of a frame with compliant sides in accordance with the present invention. This embodiment is similar to the one described hereinbefore, except that the links connecting the beams have been replaced by two continuous compliant members 862.

Figure 25:
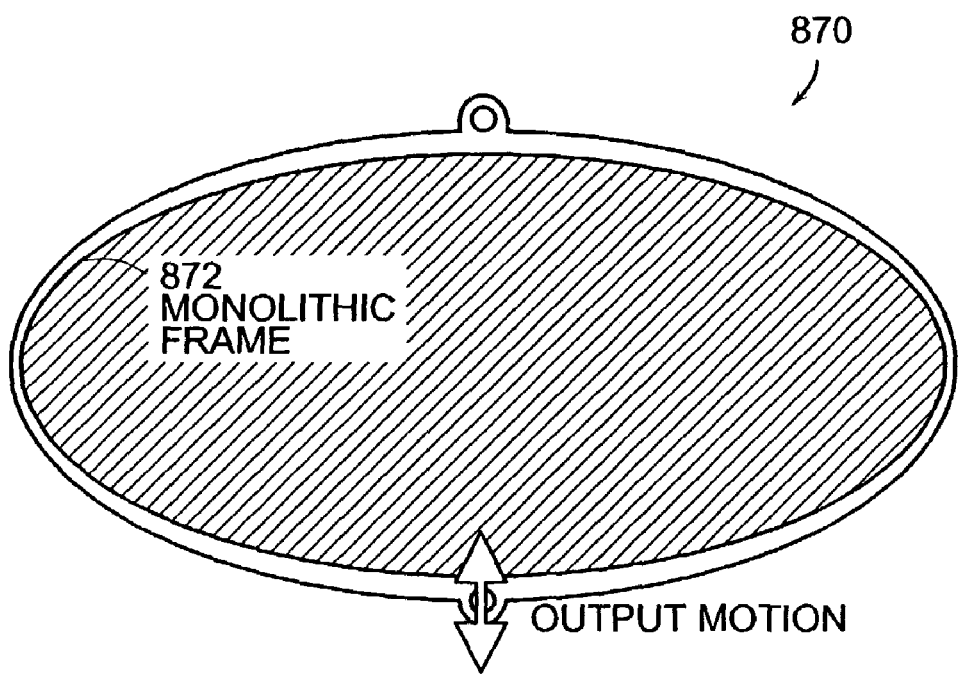
FIG. 25 is a preferred embodiment of a monolithic frame in accordance with the present invention.

FIG. 25 is a preferred embodiment of a monolithic frame in accordance with the present invention. In this embodiment all parts of the frame are flexible replacing the need for parallel beams.

Figure 26B:
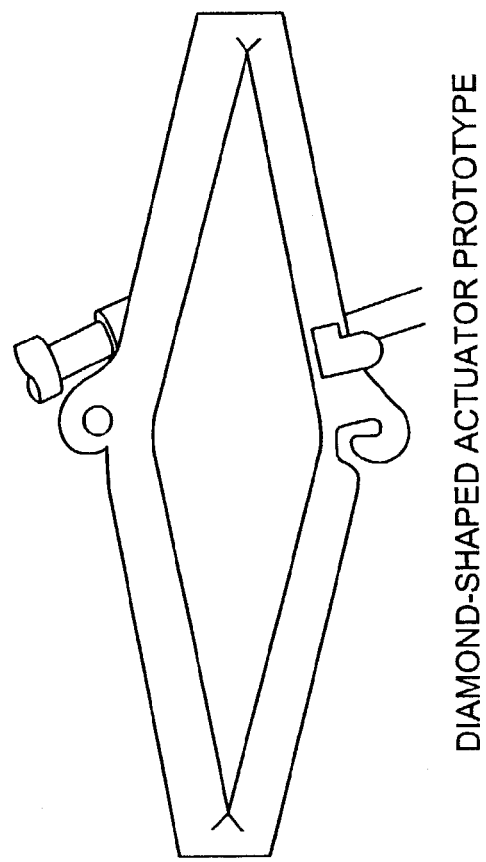
FIGS. 26A and 26B illustrate a diamond-shaped frame in accordance with a preferred embodiment of the present invention.
Figure 26A:
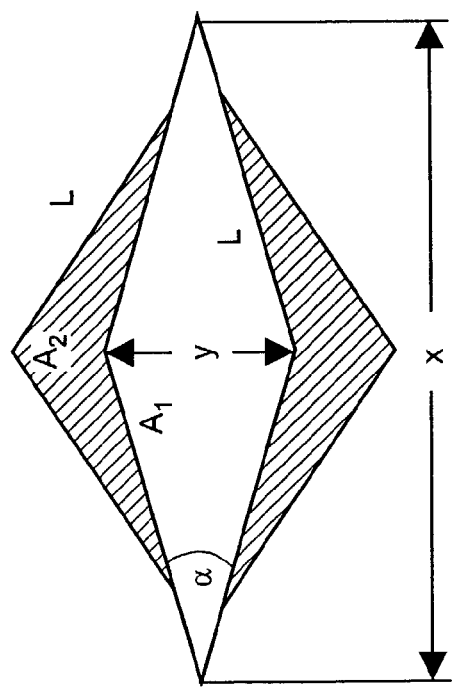
Figure 27A:
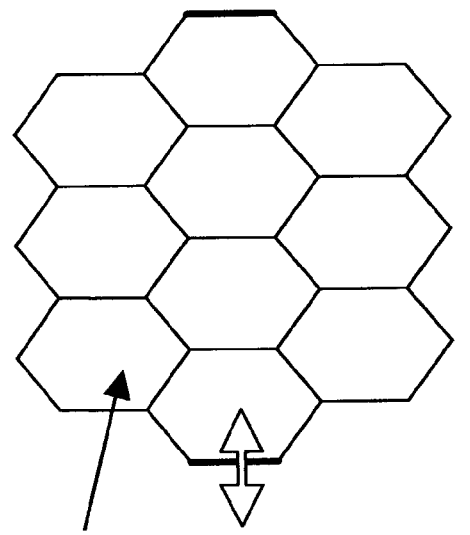
FIGS. 27A and 27B illustrate embodiments including multiple frames in accordance with preferred embodiments of the present invention.
Figure 27B:
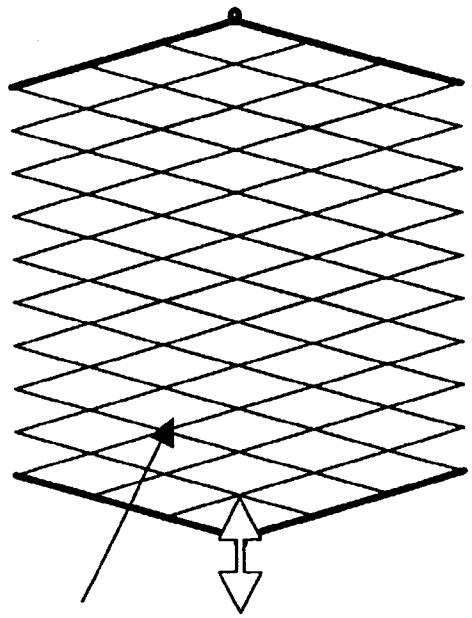

FIGS. 26A and 26B illustrate a frame having four links, forming a diamond. In another preferred embodiment, as illustrated in FIGS. 27A and 27B, a number of frames are combined, and are all actuated uniformly or separately. In FIG. 27A multiple hexagonal-shaped frames are combined while in FIG. 27B multiple flexible diamond-shaped frames are combined.

In a preferred embodiment, a large number of dielectric elastomer actuators can be used to build practical binary actuators. A binary actuator is an actuator that has two stable states. Since either state can be achieved accurately and repeatably, such an actuator is fault tolerant. As many binary actuators are combined their performance approaches that of a conventional continuous actuator. Due to their simplicity and high energy to weight ratio, dielectric elastomer actuators can be used to power a binary system with many actuators. The embodiments including linear dielectric elastomer actuators can be used to perform a variety of tasks, for example, in a magnetic resonance scanner.

Figure 28A:
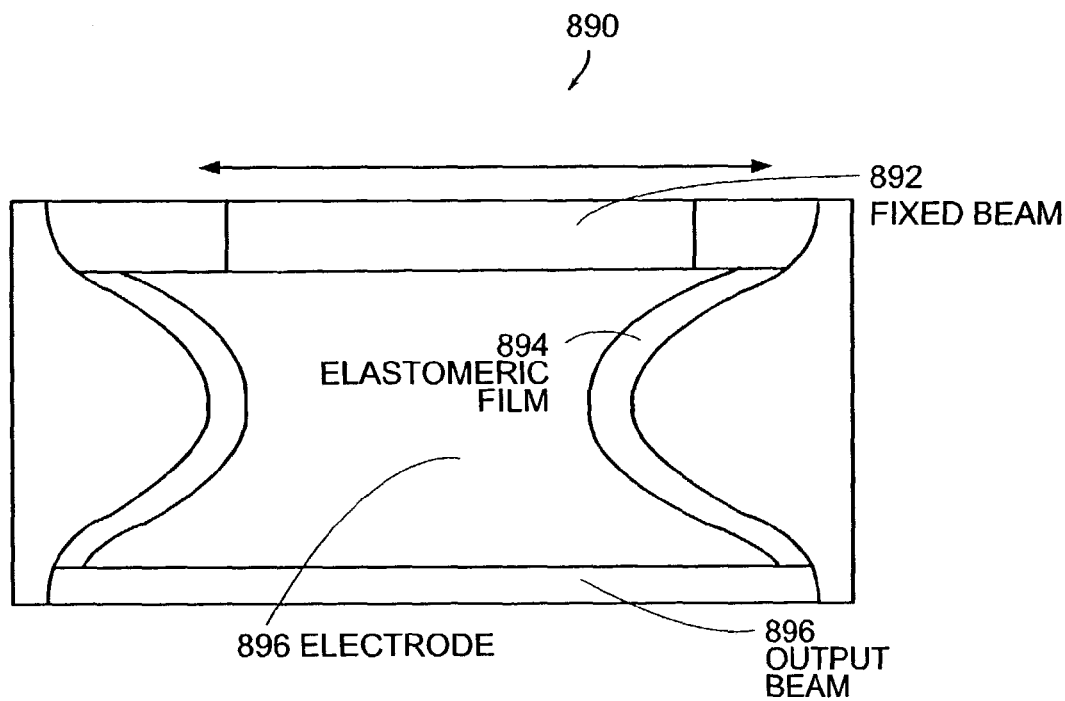
FIGS. 28A and 28B illustrate preferred embodiments of a parallel beam actuator in accordance with the present invention.
Figure 28B:
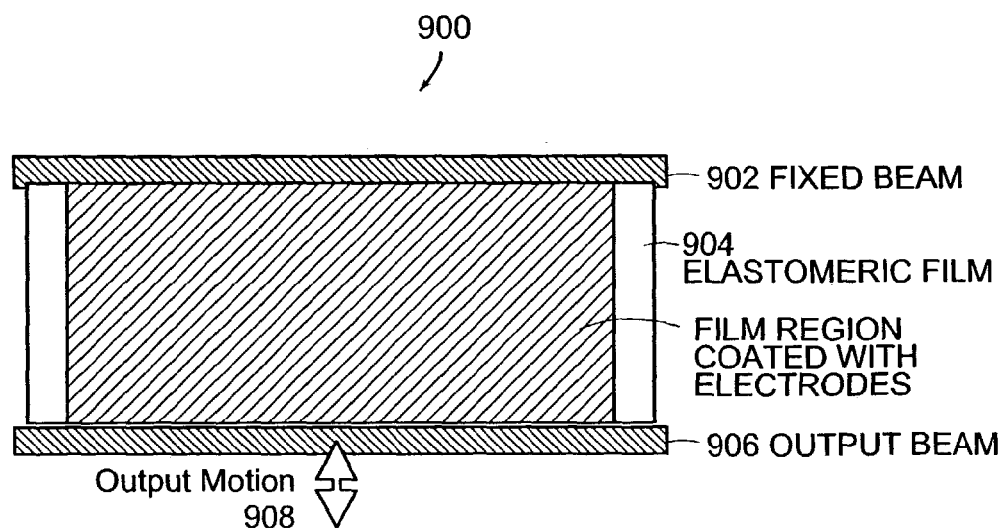

FIGS. 28A and 28B illustrate preferred embodiments of a parallel beam actuator in accordance with the present invention. In this embodiment an elastomeric film 894, 904 is attached to two parallel beams. The elastomeric film is coated on both sides with compliant electrodes 896. Applying a voltage across the electrodes causes the film to expand in area, allowing the two beams to separate. This principle can be used for actuation in mechanical systems.

Figure 29C:
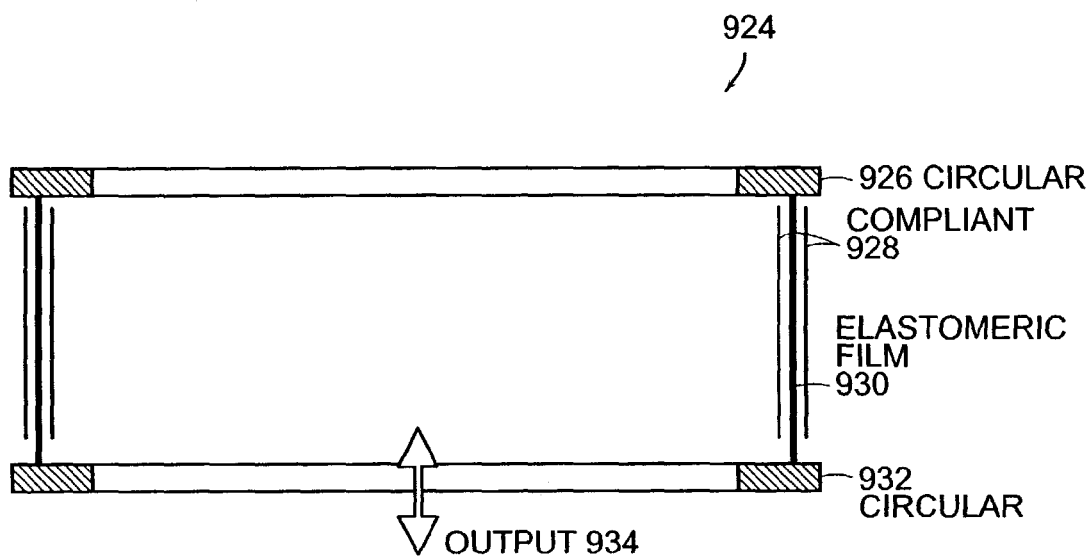

FIGS. 29A-29C illustrate preferred embodiments including cylindrical actuators in accordance with the present invention. A cylindrical actuator 910, 920 follows the same principle as the parallel beam actuator. The main difference is that a planar sheet of electrode-coated elastomeric film has been rolled into a tube. The top and bottom faces of the cylinder are rigid disks 912 or rings. The elastomeric film forms a cylindrical shell. Both the interior and exterior walls of the cylindrical wall are coated with compliant electrodes. Applying a voltage to across the electrodes allows the cylindrical shell to expand in length.

Figure 30C:
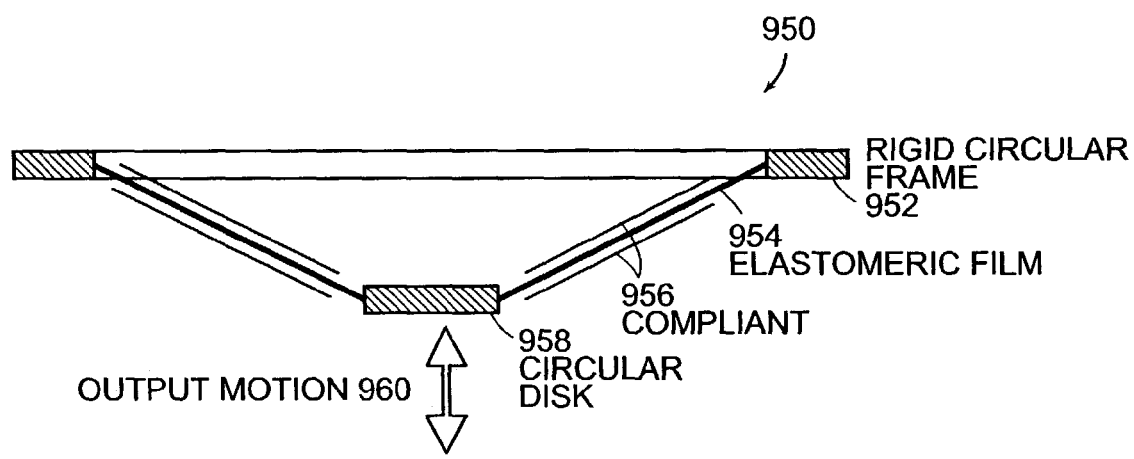
FIGS. 30A-30C illustrate diagrams and a cross-sectional view of a conical actuator in accordance with a preferred embodiment of the present invention.
Figure 30B:
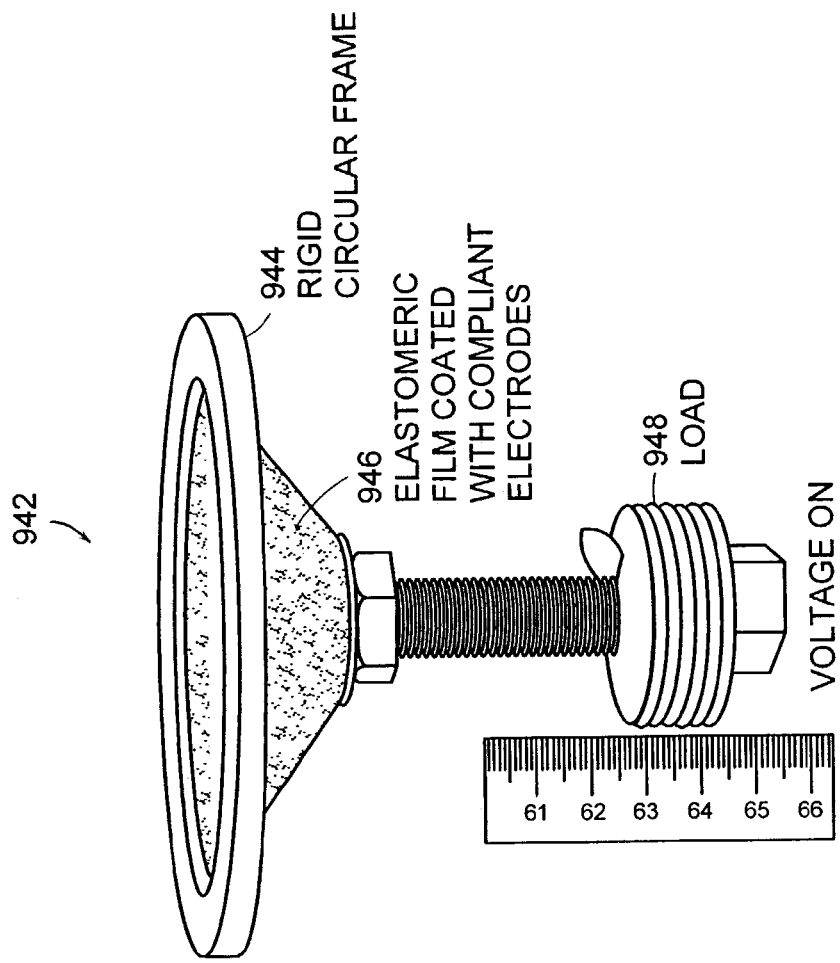
Figure 30A:
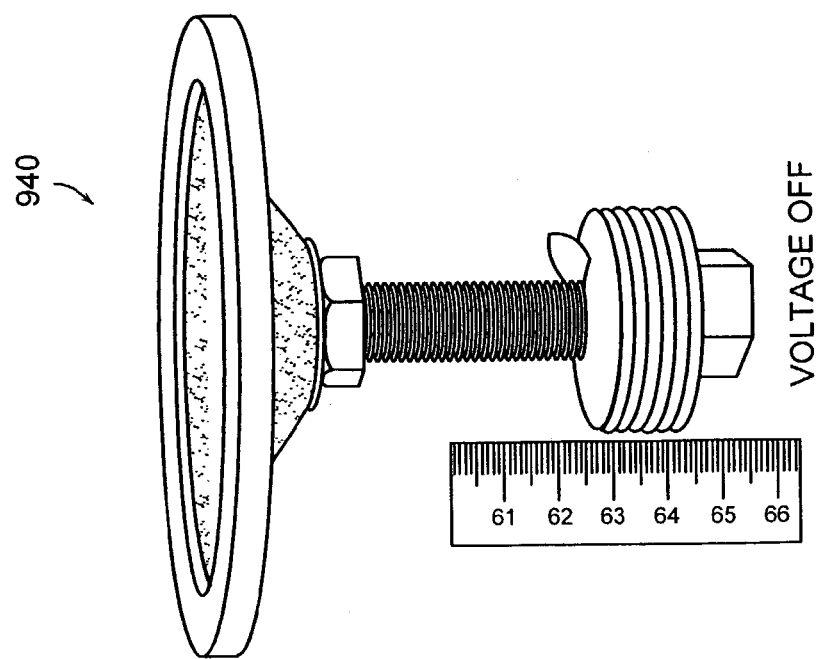

FIGS. 30A-30C illustrate a preferred embodiment including a conical actuator in accordance with the present invention. In this embodiment, the actuator has the shape of a truncated cone. The base of the cone consists of a rigid circular ring 944, 952. The elastomeric film 946, 954 forms a conical shell and is attached to the rigid ring at its base and to a rigid circular disk at its top. The inner and outer sides of the elastomeric film are coated with compliant electrodes 956. Applying a voltage across the electrodes allows the cone to expand in height, i.e., the rigid ring and disk are allowed to separate along the axial direction.

Figure 31:
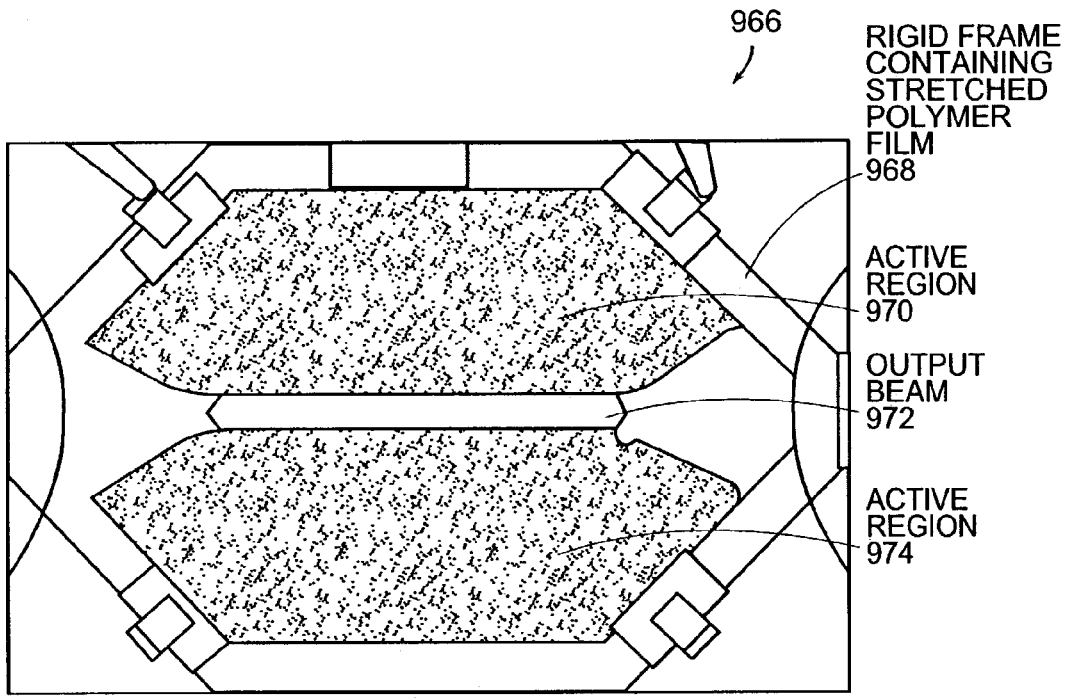
FIG. 31 illustrates a diagram of an actuator including an antagonistic pair in accordance with a preferred embodiment of the present invention.

FIG. 31 illustrates a preferred embodiment of a dielectric elastomer actuator having an antagonistic pair. All actuator embodiments described hereinbefore can further be combined with any of the other embodiments. For example, the actuators described can be combined with a ratcheting mechanism to produce a stepper motor. In this embodiment, the actuator undergoes a reciprocating motion. With each actuation cycle defined as switching on and off, a rack is advanced by a discrete step.

Figure 32:
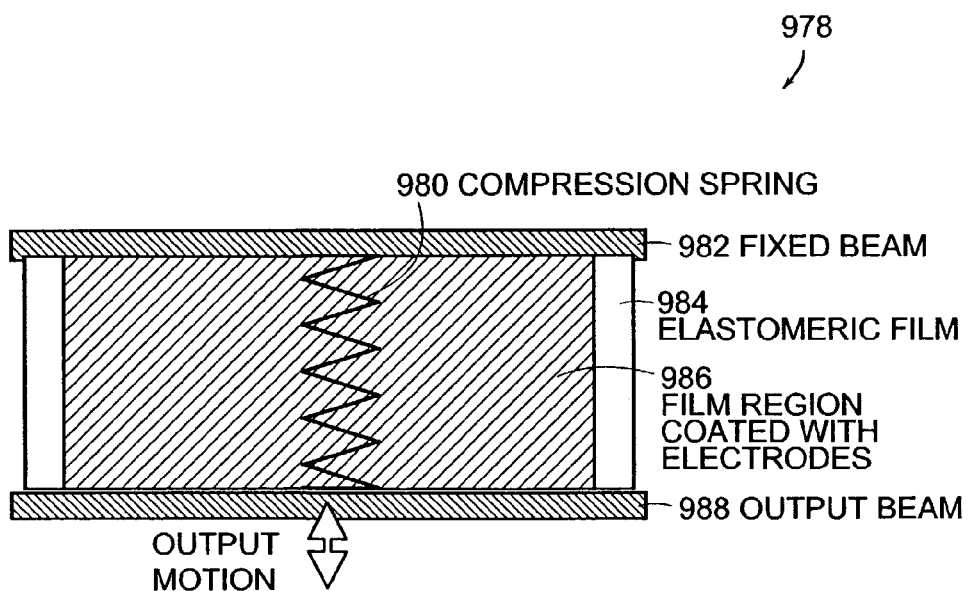
FIG. 32 illustrates a preferred embodiment having a parallel beam actuator with a spring to provide an elastic restoring force in accordance with the present invention.
Figure 33:
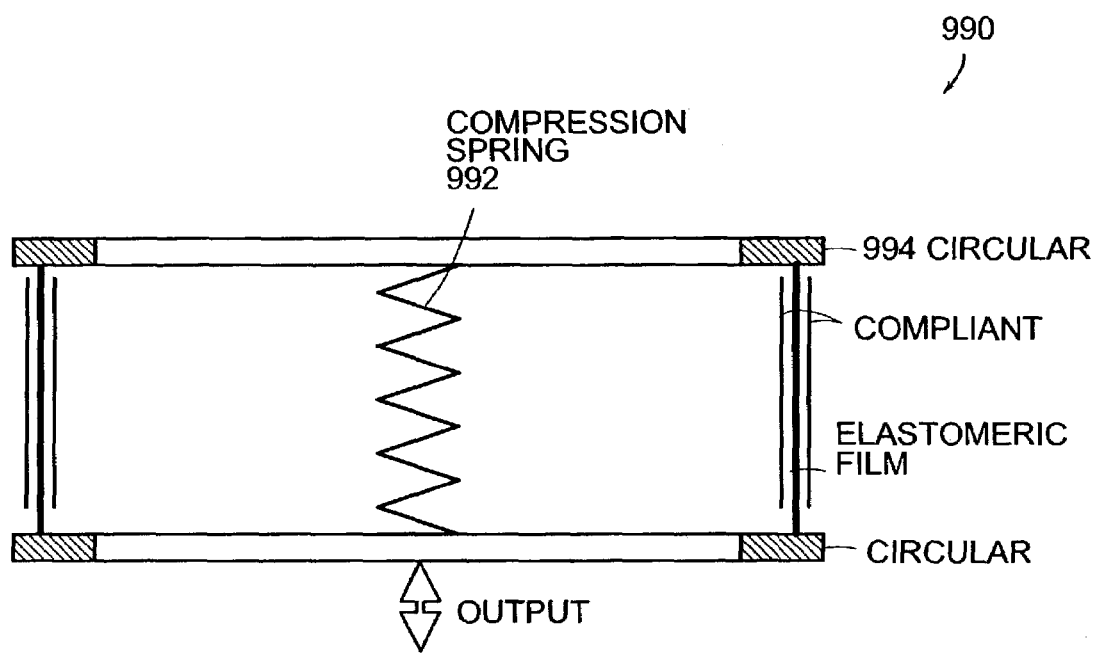
FIG. 33 illustrates a cross-sectional view of a cylindrical actuator with a spring to provide an elastic restoring force in accordance with a preferred embodiment of the present invention.
Figure 34:
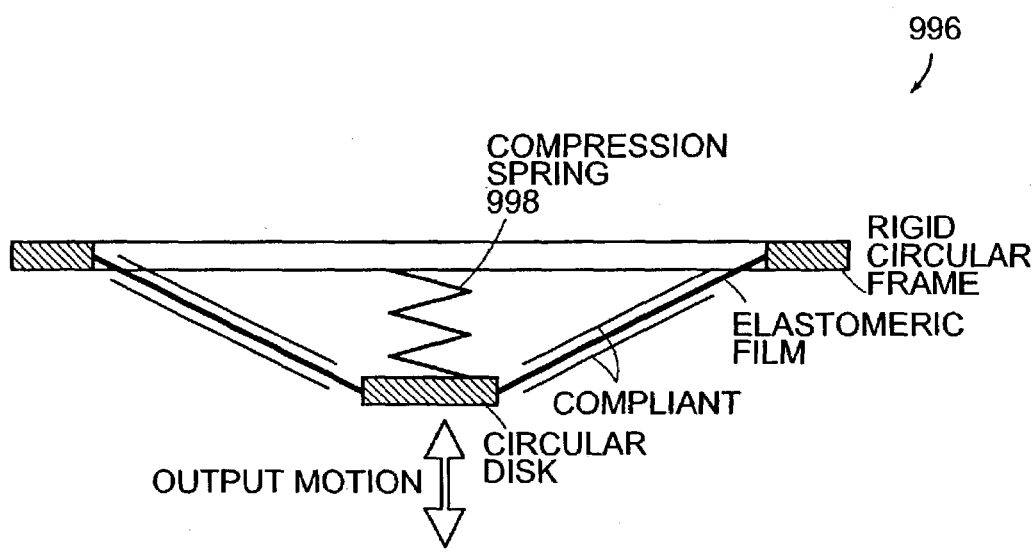
FIG. 34 illustrates a cross-sectional view of a conical actuator with a spring to provide an elastic restoring force in accordance with a preferred embodiment of the present invention.

As described hereinbefore, the elastomeric film has to be under tension for the actuator to function. The film itself is not able to work under compression. Thus, for an actuator that can work under both tension and compression, an external restoring force is necessary. This restoring force can be provided by a resilient elastic element, such as a spring as illustrated in FIGS. 32, 33 and 34. These figures illustrate a parallel beam actuator, a cylindrical actuator and a conical actuator, each having a spring to provide an elastic restoring force, respectively.

All of the actuators described hereinbefore can be further combined with a resilient elastic element that has an effective negative spring constant over at least part of its range of motion in accordance with a preferred embodiment. When combined in parallel with the actuator, such an element can increase the stroke of the actuator. It can further tune the force-displacement properties of the actuator module to meet certain applications. For many applications, it is desirable to have an actuator that produces a constant force throughout its stroke. In another embodiment, the actuation forces can be increased by using multiple layers of the elastomeric film and electrodes sandwich.

A preferred embodiment of the present invention includes intracavity probes, specifically, endorectal probes and endoscopes with integrated resizable pickup. These embodiments are very compact during insertion into the body. Once inserted, they expand into a tunable coil with multi-zoom factors. Diagnosis of prostate tumors and Barrett's Esophagus (to image the heart) significantly benefit from these embodiments. Another embodiment includes a second class of devices having dielectric elastomeric actuated manipulators for use in magnetic resonance imaging (MRI) environments for such applications as a surgical aid and steerable endoscopes.

The radio frequency signal from a sample being imaged using magnetic resonance imaging (MRI) is acquired using an antenna or "coil." A series of these signals is used to construct the image. In clinical imaging, coils are geometrically customized to the body region of interest. Small surface coils can achieve a higher signal-to-noise ratio (SNR) because they receive noise from a smaller portion of the sample volume. The disadvantage of small surface coils, however, is limited lateral coverage and limited depth of tissue penetration. Moreover, inhomogeneous spatial uniformity is associated with the size of coils. Larger coils with inherently better penetration and coverage have the advantage of improved uniformity as comparatively shown in FIGS. 35A and 35B. In these figures, white rectangles represent the locations and sizes of the coils and a lighter area indicates a region of higher SNR. The image acquired through a small surface coil is shown in FIG. 35A. It has a high peak SNR, but little penetration. Better penetration with a reduced peak SNR is obtained by the large surface coil as shown in FIG. 35B.

Typical commercial MRI surface coil receivers have a fixed or passively flexible geometry, which has been designed for a specific part of the body, for example, the head, neck, shoulder, breast, and chest. In some cases, coils of different sizes are necessary for a single MRI diagnosis. A large coil may be necessary to get a global image of an area and a smaller coil to get a high-resolution image in some sub-region. The medical staff must physically change different coils during a session. An electrically resizable coil either remotely controlled from the operating and display console or self-optimizing can significantly reduce the acquisition time and thus diagnosis time for a patient and improve image quality.

In preferred embodiments, dielectric elastomer actuator materials can be used to cause a coil to contour to the anatomy. The curvature for a shoulder coil, for example, can be adapted to the patient habitus. Further, phased array coils are often used to image the heart, torso and pelvis. More recently, phased array technology has been developed to image the breast, head/neck, and temporomandibular joint (TMJ). A plurality of resizable surface coils used in an array enable greater flexibility over improving SNR in a region of interest.

Preferred embodiments of the dielectric elastomer actuators can enable insertable resizable receiver coils in intracavity probes that have a smaller profile than the prior art. Prior art includes a coil mounted to an inflatable balloon for imaging the prostate, rectum and surrounding anatomy. These have an internal pickup coil and an inflatable anti-migration cuff to hold the probe in position. This device is rather large and can be uncomfortable for patients. A compact endorectal probe, that can expand inside the body by twice to three times its original size, with an integrated resizable electrically controlled receiving coil has a highly significant impact on patient comfort. Using conventional actuators with metal components to achieve this function would seriously degrade the MRI image. Preferred embodiments of the plastic based dielectric elastomer actuators are MRI compatible. Dielectric elastomer actuator technology can enable resizable receiver coils in intracavity probes, which is very desirable.

Preferred embodiments of the present invention include manipulative devices having EPAMs for use inside closed MRI scanners including special manipulations and systems. These embodiments, for example, might permit a minimally invasive surgery to be performed remotely while the procedure is monitored by the MRI. For example, an acoustic array can be moved and/or focussed by manipulating a device including an EPAM. Preferred embodiments of a manipulator device can vary the size of a coil, vary the shape of an acoustic array, and/or vary the position of the acoustic array. Thus, the EPAM can shape other elements that are used for treatment and/or measurements or diagnosis in the MRI environment.

The embodiments include dielectric elastomer actuators. These materials offer many advantages, such as large strokes, high energy densities, and fast responses, and can be used to produce miniature, inexpensive, and lightweight actuators. As described hereinbefore, a linear binary dielectric elastomer actuator can have a compliant bi-stable mechanism integrated into the actuator to hold the actuator in its at least two stable positions.

The operating principle of a dielectric elastomer actuator has been described with respect to FIGS. 2A and 2B. An insulating elastic film is sandwiched between two compliant electrodes. Applying a high voltage, several kV, across the electrodes causes them to attract one another and squeeze the film, reducing the film's thickness and increasing its area. This kind of enlargement can be exploited to actuate mechanical systems.

Preferred embodiments of the present invention having dielectric elastomer actuators have numerous advantages that make them ideal for actuators in a MRI environment. These include minimal degradation of the MRI image, compatibility and safety in contact with patients, they are disposable (inexpensive), easily controlled, have a large strain (more than 100%), and are constructed mostly of polymer and are thus lightweight.

Preferred embodiments include a receiving radio frequency ("RF") antenna or coil or plurality of coils, including dielectric elastomer actuator materials, which can vary its size under remote command. A surface coil can be placed on the exterior of the body that can change its contour to match the contour of the body to optimize coil filling factor in preferred embodiments. Further embodiments of the present invention include a surface coil placed on the exterior of the body that can change its size and shape to adapt depth of penetration to the region of interest in the tissue in order to optimize the signal to noise ratio of the image in that region. Further, a plurality of surface coils collectively known as a phased array coil, each of which can independently change size and shape to adapt depth of penetration to the region of interest in the tissue in order to optimize the signal to noise ratio of the image in that region and cover a larger imaging volume than can a single surface coil are included in alternate embodiments.

Preferred embodiments also include an insertable deployable intracavity probe to allow the local imaging of non-superficial tissues, for example, prostate via the anterior rectal wall, the heart via the esophagus, bladder wall subsequent to urethral insertion and arterial or venous wall via the artery or vein. The probe can be inserted in a minimum profile configuration then expanded once placed near the region of interest. In addition, preferred embodiments include an approximately all-plastic manipulator made of dielectric elastomer or other actuator muscle materials for actuation of a biopsy needle or therapeutic probes to align the trajectory and advance the needle or probe into the tissue. Preferred embodiments include a positioning device for use in MRI of a region of interest having a plurality of stages including dielectric elastomer actuator materials, for example, for the positioning of a focused ultrasound phased array over the target tissue to be ablated.

An embodiment of the present invention includes EPAMs which require high voltage for actuation (several kV) due to current manufacturing limitations. Analysis to quantify the risks of such voltages to patients and clinicians has been performed. The primary danger of the high voltage is a current from power supply short-circuited across the human body and a current from the stored energy of a charged EPAM discharging through the human body. However, despite the high voltage required, the actual electrical energy stored in the EPAM is very small. In a preferred embodiment, the dielectric elastomer actuator with an 80 mm diameter produces a maximum current of 0.1 mA. This is far less than the 2 mA allowed by the European Organization for Nuclear Research, suggesting that the estimated current does not represent a serious hazard.

Figures 36B, 36C:
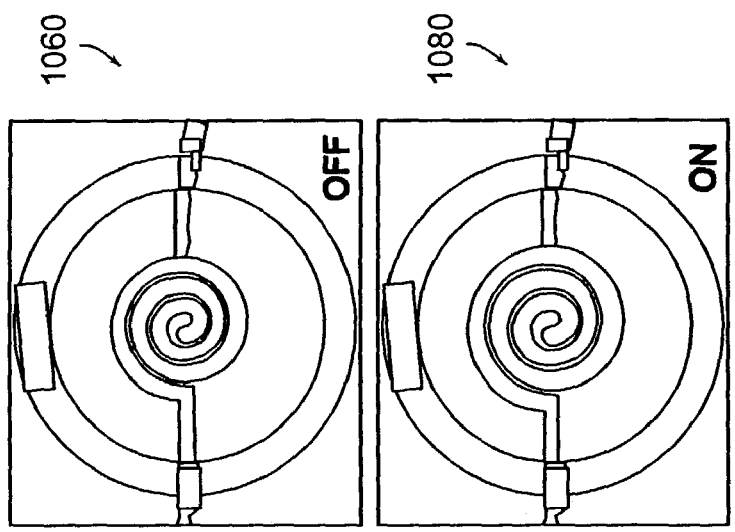
FIGS. 36A-36C illustrate an electrostrictive polymer artificial muscle actuator (EPAM) placed on a phantom which is a barrel filled with water to simulate the human body inside a MRI system and the EPAM spiral coil changing geometry when controlled remotely, respectively, in accordance with a preferred embodiment of the present invention.
Figure 36A:
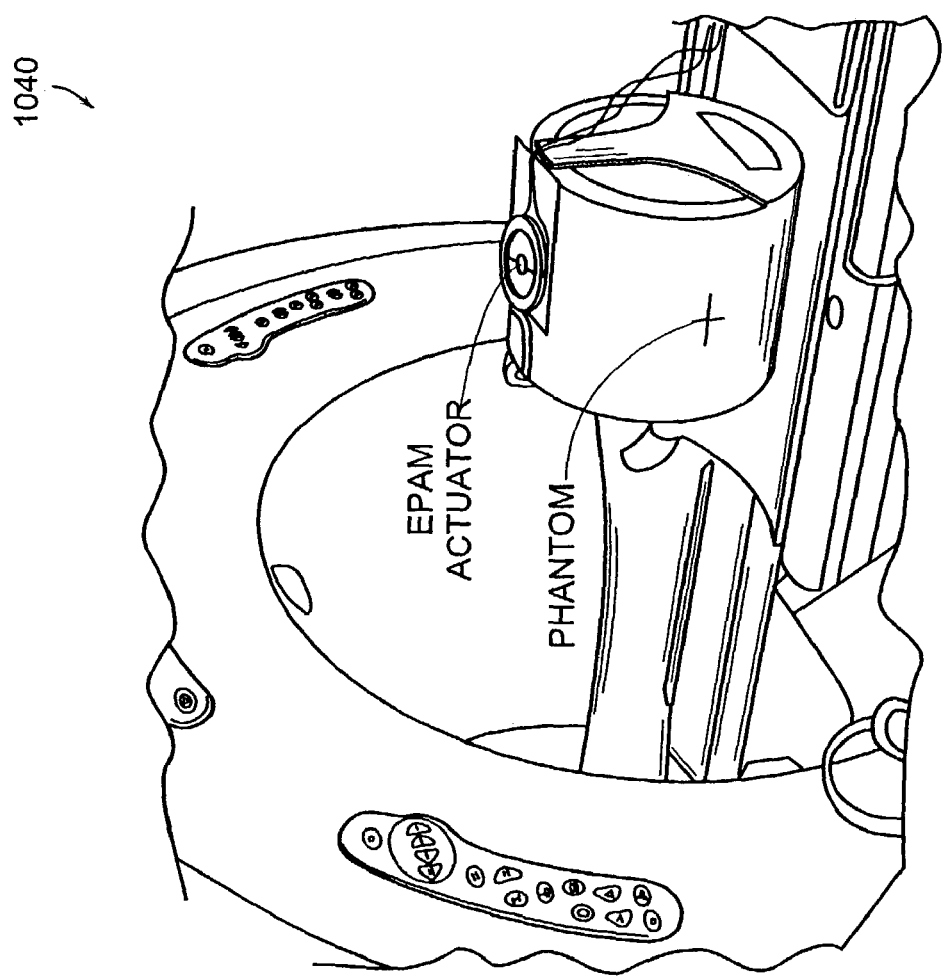

The dielectric elastomer actuator can operate effectively in the high MRI magnetic field. The high magnetic field had no detectable effect on the performance of the dielectric elastomer actuator muscle. The dielectric elastomer actuator was placed on a phantom which is a sphere and cylinder filled with water to simulate the human body as shown in FIG. 36A. FIGS. 36B and 36C display an dielectric elastomer actuator muscle spiral coil changing its geometry when controlled remotely.

Measurements regarding unwanted electromagnetic emissions produced by the dielectric elastomer actuator muscle were taken. These emissions can manifest themselves as bands of noise in the image. The MRI images can be acquired with the body coil, which lines the bore of the scanner, while the dielectric elastomer actuator device is in the imaging volume. Some image noise is exhibited under some conditions as illustrated in FIG. 37B. The white arrow 1092 points to the band of noise in the image. However, this noise is not due to the dielectric elastomer actuators, but was traced to their power lines.

FIGS. 37B and 37C illustrate the images acquired for the dielectric elastomer actuator with and without its power lines, respectively. With the dielectric elastomer actuator on or off, there is no noise for the case of the dielectric elastomer actuator without wires. The noise resulted from the antenna effect of the power cables. A filter placed on the power lines addresses the image noise. In an alternative embodiment, the power supply can be located inside the MRI room.

Figure 38A:
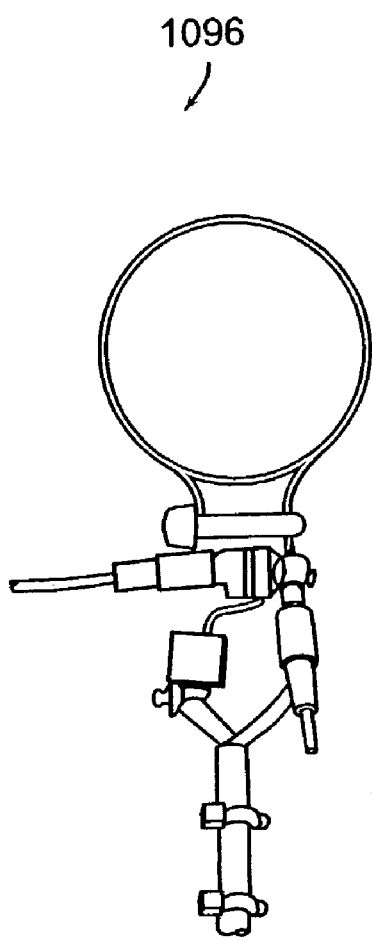

Additional measurements that have been taken include placing the dielectric elastomer actuator receiver coil on the phantom. FIGS. 38A-38D illustrate a conventional copper coil and a dielectric elastomer actuator circular coil with their MRI images, respectively, in accordance with preferred embodiments of the present invention. The MRI image acquired (FIG. 38D) with the dielectric elastomer actuator coil (FIG. 38B) shows a somewhat lower signal to noise (SNR) than that of the conventional copper coil (FIG. 38A). It is believed that the increased noise is due to the higher resistance of the dielectric elastomer actuator coil. Decreasing coil resistance reduces coil noise and results in images with high SNR. Further embodiments with an optimized dielectric elastomer actuator coil have a higher SNR. In a preferred embodiment, a thicker deposition of silver grease can provide a lower resistance and therefore a better image. Measurements indicate that dielectric elastomer actuator surface mounted coils are a promising technology.

In a preferred embodiment the EPAM actuator and the MRI coil receiver loop can be formed from two different elastomers. They can be arranged in layers, for example, alternating layers of the coil, and the polymer actuator. Specific layers can be predetermined to be active or passive.

Figure 38B:
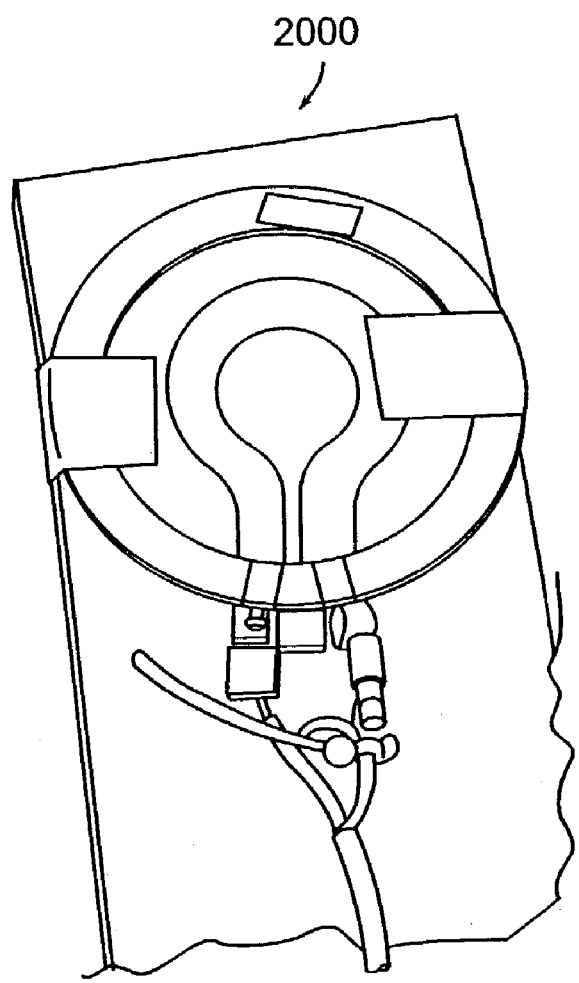

In an embodiment having a surface coil, a second ring of EPAM material can be used as the frame of the coil and a thick layer of silver paint can be used as the conductor (FIG. 38B). The coil possesses the same flexibility properties as the EPAM actuator and thus has the capability to expand with the actuator and be compliant.

Another preferred embodiment includes a woven switching matrix having an interlacing of mutually perpendicular conductors and insulator threads. The woven matrix possesses properties of inductance, capacitance and resistance. An RF coil can be constructed from this material having both a flexible cross-section and an adjustable radius. In this embodiment, the EPAM actuator can be used to change the radius of the woven switching matrix RF coil.

Preferred embodiments of the present invention include insertable intracavity probes having dielectric elastomer actuators wherein flexible surface coils can be placed into the rectum or esophagus to image the heart and bring the detector, the coil, closer to the tissue of interest. To be minimally invasive, the coils can have a minimal profile when entering the body. For optimized imaging, the elastomeric actuator opens to the maximum diameter comfortable for the patient. Dielectric elastomer actuator based coils that can change size and shape can be used for in-vivo applications.

Figure 39A:
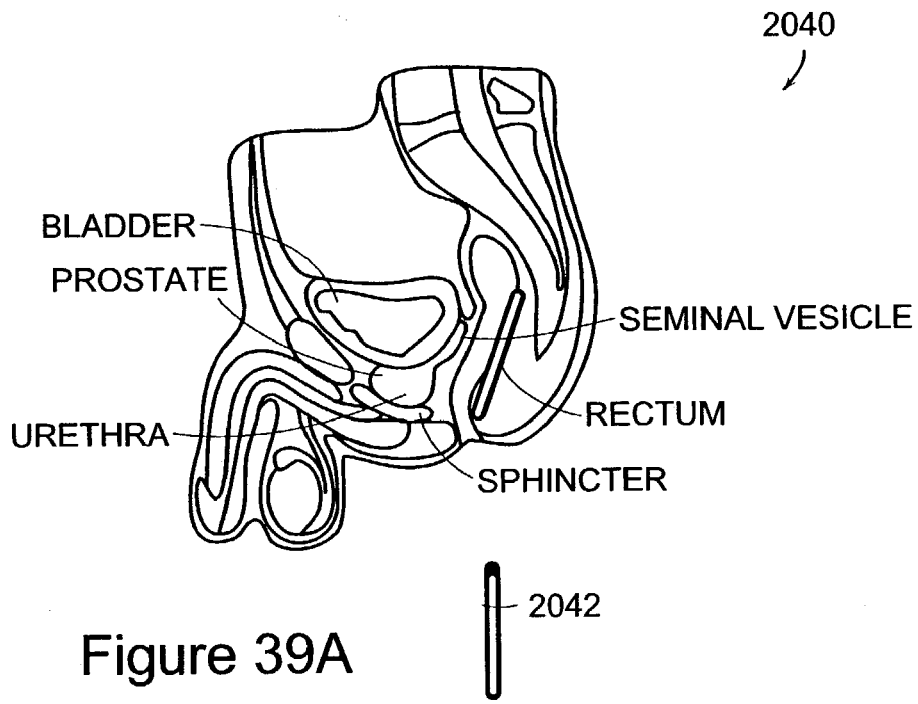
FIGS. 39A and 39B illustrate a side view and a front view showing an insertion of an intracavity probe having an elastomeric actuator before and after insertion for prostrate diagnosis in accordance with preferred embodiments of the present invention.
Figure 39B:
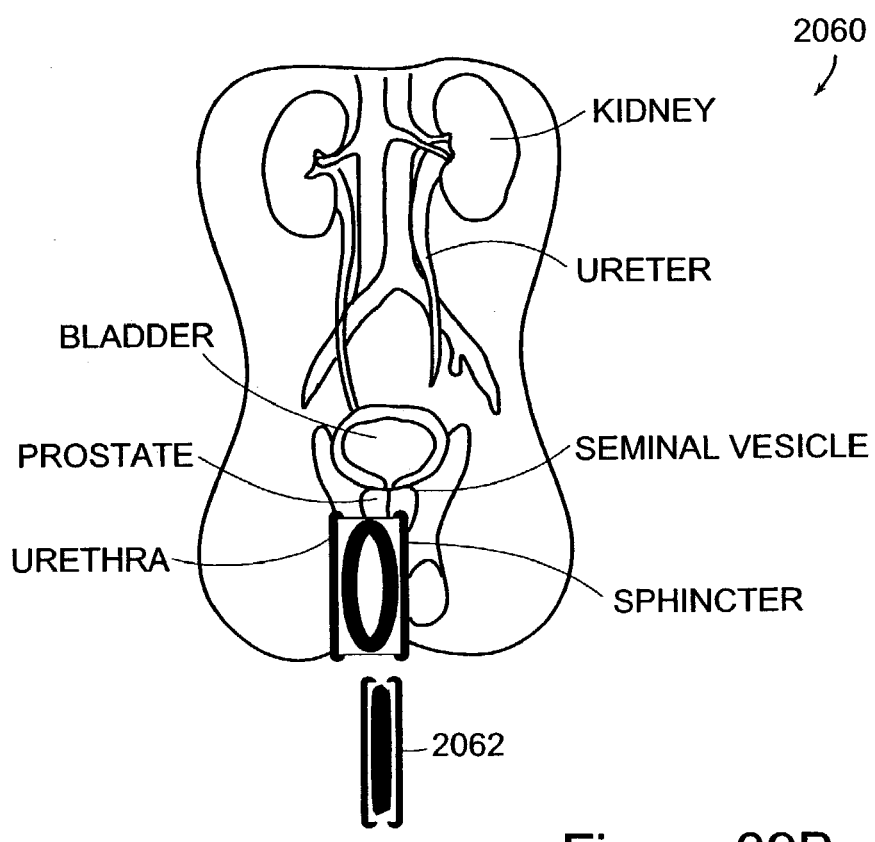

Preferred embodiments that combine deployable structures with large strain dielectric elastomer actuators can produce devices with relatively large ratios between their deployed and stowed sizes. FIGS. 39A and 39B illustrate an embodiment of an endorectal probe that is stowed before insertion and then deployed in the human body in accordance with the present invention. The receiver coil is resizable according to the patient habitus and affords a smaller profile for insertion than the prior art.

Figure 40B:
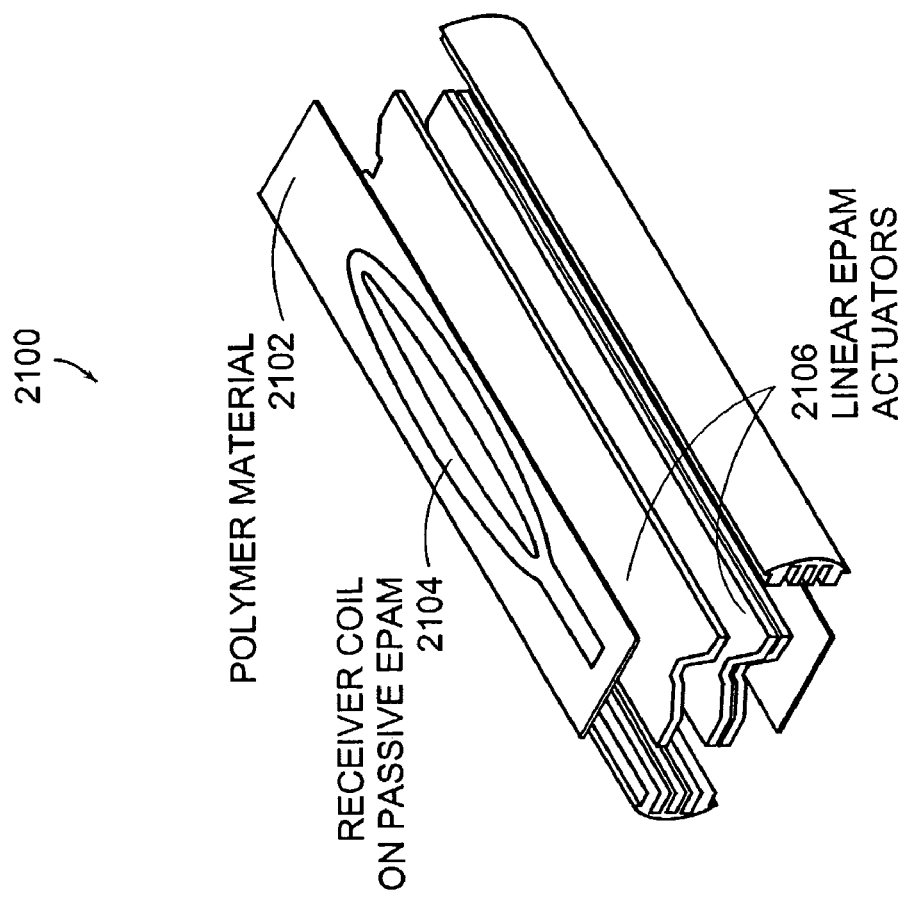
FIGS. 40A and 40B illustrate a preferred embodiment of an endorectal probe having an elastomeric actuator, in an assembled configuration and in an exploded view, respectively, in accordance with the present invention.
Figure 40A:
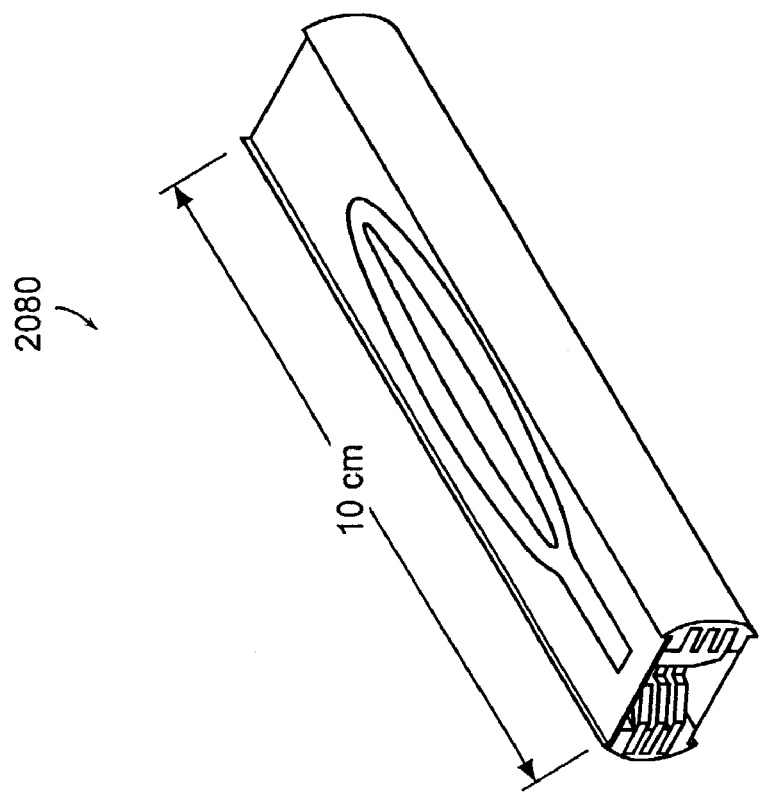

FIGS. 40A and 40B show a preferred embodiment of a dielectric elastomer actuator based endorectal probe for prostate tumor diagnosis that can also be implemented as an endoscopic probe for Barrett's Esophagus diagnosis. In this embodiment the device is driven by a large-stroke linear dielectric elastomer actuators. The receiver coil 2104 disposed on a passive polymer layer, is separated from the EPAM actuators 2106. The receiver coil is positioned on the upper part of the device to be as proximate as possible to the organs to be imaged. Compliant structures can be integrated into the device to further increase the stowed/deployed size ratio.

Figure 41:
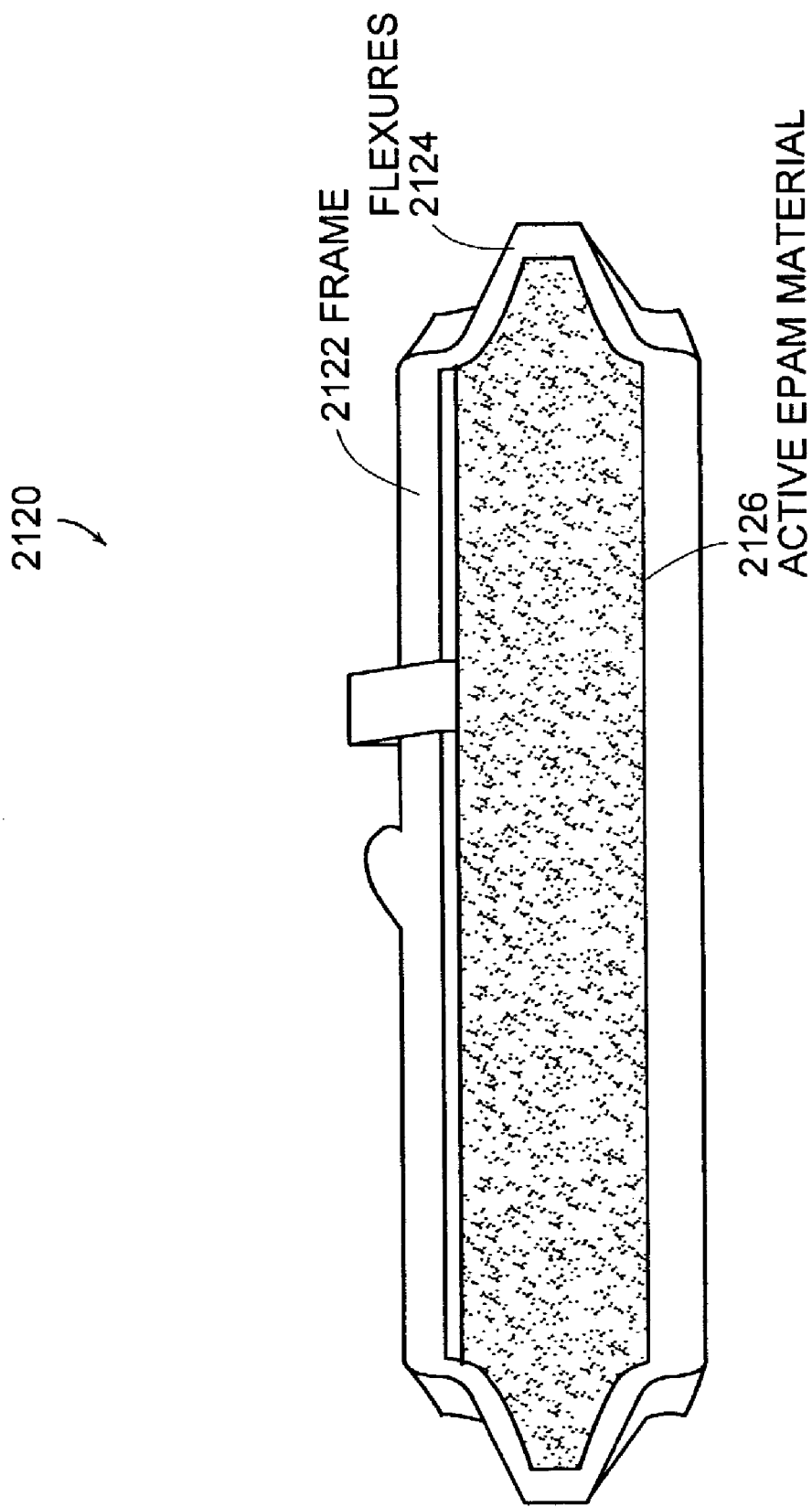
FIG. 41 illustrates a flexible frame elastomeric actuator in accordance with a preferred embodiment of the present invention.

Dielectric elastomer actuators in preferred embodiments can be used as the basis for manipulators to function inside MRI systems. Preferred embodiments have integrated dielectric elastomer actuator with flexible frames to produce actuators that can both "push and pull." These actuators are simple, as they only consist of the materials used to form the elastomer, the frame and electrodes. FIG. 41 illustrates a preferred embodiment of such an dielectric elastomer actuator. It is constructed with acrylic film coated with a compliant electrode and is attached to a flexible frame 2122, which is machined from a single piece of plastic. In an embodiment, this actuator has a linear strain of about 30% and a force output of about a 0.5 N. The width of the actuator is about 10 cm.

The actuator shown in FIG. 41 has a single layer elastomer film with a thickness of about 0.05 mm. In preferred embodiments, the individual elastomer films can be multi-layered, with the output force being proportional to the number of layers, Therefore, the actuator is capable of an output force of at least 10 N with the elastomer actuator sandwich thickness of about 1 mm. Dielectric elastomer actuators also have the potential for miniaturization, as the specific power output is independent of scale. The flexible frame dielectric elastomer actuators of preferred embodiments can actuate MRI compatible manipulators.

Figure 42A:
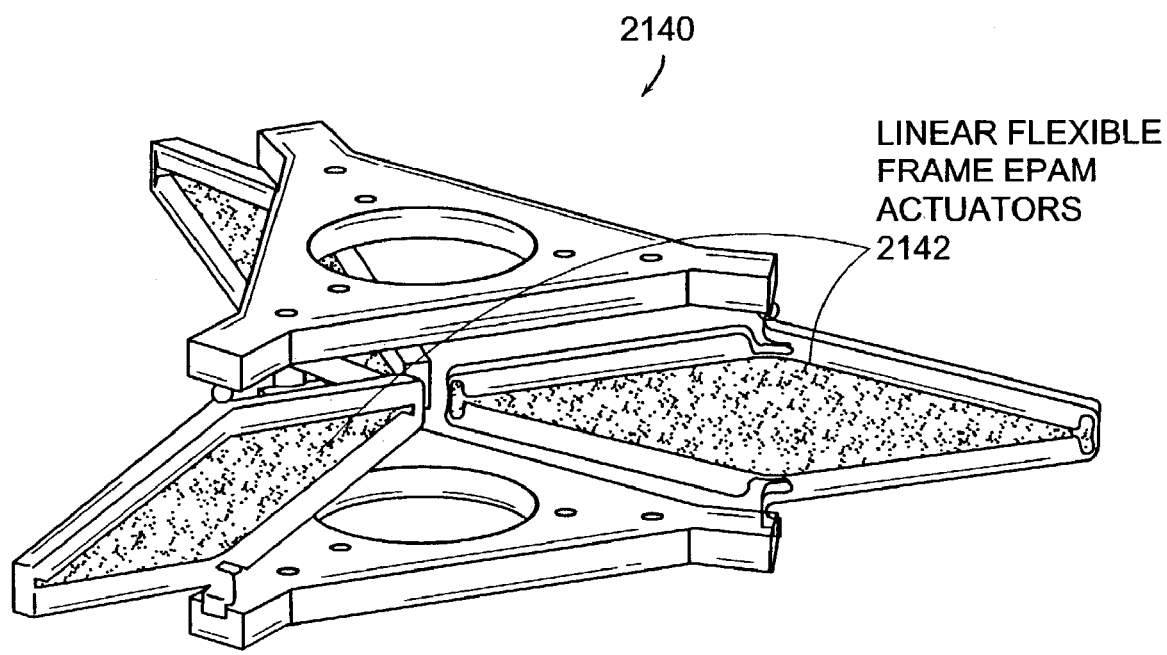
FIGS. 42A and 42B illustrate dielectric polymer actuated muscle having three degrees of freedom parallel manipulator elements in accordance with a preferred embodiment of the present invention.
Figure 42B:
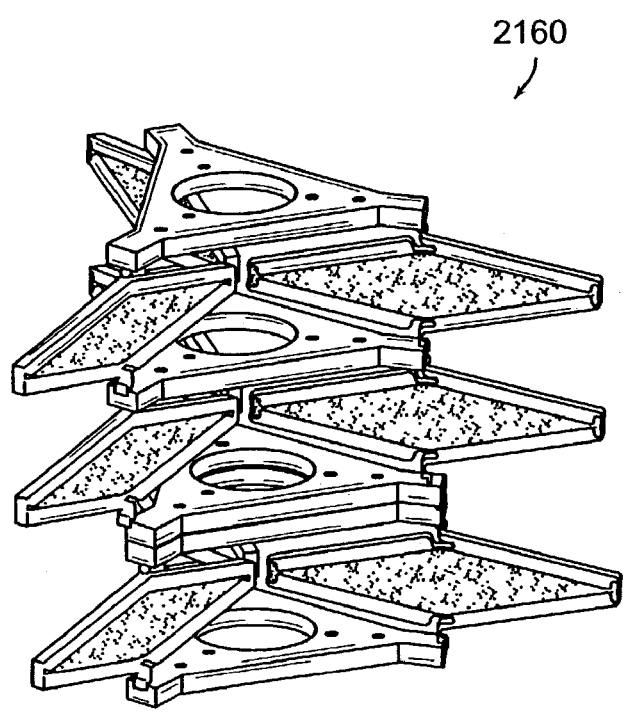

FIG. 42A illustrates a preferred embodiment of a single stage, three degree of freedom parallel manipulator with dielectric elastomer actuators. Combining multiple stages results in a manipulator that can be used for positioning a variety of devices. FIG. 42B illustrates a multistage MRI manipulator. Using a multistage manipulator to position an imaging coil, focused images can be taken of different regions of the body without having to remove the patient from the MRI scanner. Combining this with the variable imaging coil allows the location as well as the focus of the image to be controlled remotely. The result is a more efficient use of the MRI scanner as well as a minimization of the discomfort a patient may experience due to the confined space.

Preferred embodiments of the present invention include MRI compatible surgical robots and manipulators. A robot is capable of high precision and has the potential for telesurgery, and MRI adds the benefits of image-guided surgery. These motivations result in embodiments having an MR Compatible Surgical Assist Robot. Due to the inherent MR compatibility of dielectric elastomer actuators, robots with dielectric elastomer actuators have the potential of further advancing state of the art MR compatible surgical assist robots. With its virtually all plastic construction, a dielectric elastomer actuator powered robot can be placed very close to the region of interest and perform high precision tasks without distorting the images.

Other embodiments of the present invention also include the dielectric elastomer actuators in MRI-guided procedures. As some breast lesions cannot be seen under mammography or ultrasound, MRI is the only imaging modality that assures accurate lesion targeting for biopsy. Such procedures can be performed in closed bore magnets, by removing the patient in order to change trajectory of the needle and for advancement. Minimally invasive surgery procedures can be migrated to MRI-guidance with the development of MRI-compatible manipulators. Elastomer actuators decrease the size and cost of the MRI-guided focused ultrasound system. As the preferred embodiment system ablates tumors in a truly non-invasive fashion, it can supplant conventional surgery.

Further, a phased array coil having many elements that can be switched on/off to improve image quality for a given target can include dielectric elastomer actuator coils that can add a degree of freedom of resizing the coil to further improve this process. For example, resizing an MRI surface coil can enable optimization of coil size to patient habitus and imaging target. The trade off between tissue penetration and signal to noise ratio can be optimized. In some single surface coil embodiments, the coil is selected from a family of surface coils having different sizes. With a resizable coil, one coil can suffice.

Prior art insertable coils are passive in their deployment. Preferred embodiments of dielectric elastomer actuator based insertable coils may be opened to a continuum of sizes to match patient habitus. Using these preferred embodiments, devices that deploy inside the bladder are possible.

Another embodiment of the present invention includes a device for applying an oscillatory stress to an object positioned in a polarizing magnetic field of a nuclear magnetic resonance (NMR) imaging system, used to perform MR elastography. MR elastography includes quantitatively mapping the physical response of a material to harmonic mechanical excitation (shear wave). The resulting images allow calculation of regional mechanical properties. The method is sensitive to cyclic displacements smaller than 200 nanometers. In addition, the method is feasible for delineating elasticity and other mechanical properties of tissue. The method can be used as a diagnostic tool in the detection of abnormalities in tissue, such as those caused by cancer or other lesions and characterizing processes in tissues accompanied by changes in their mechanical properties. Further, the method can also be used for assessment of brain tissue and the evaluation of the biomechanical state of muscle.

A device is necessary to remotely induce a shear wave in the tissue. The prior art describes ultrasonic oscillators, electrically energized coils, and piezoelectric transducers. In a preferred embodiment, the EPAM actuator produces the mechanical excitation required to induce a shear wave in the tissue.

Figure 43:
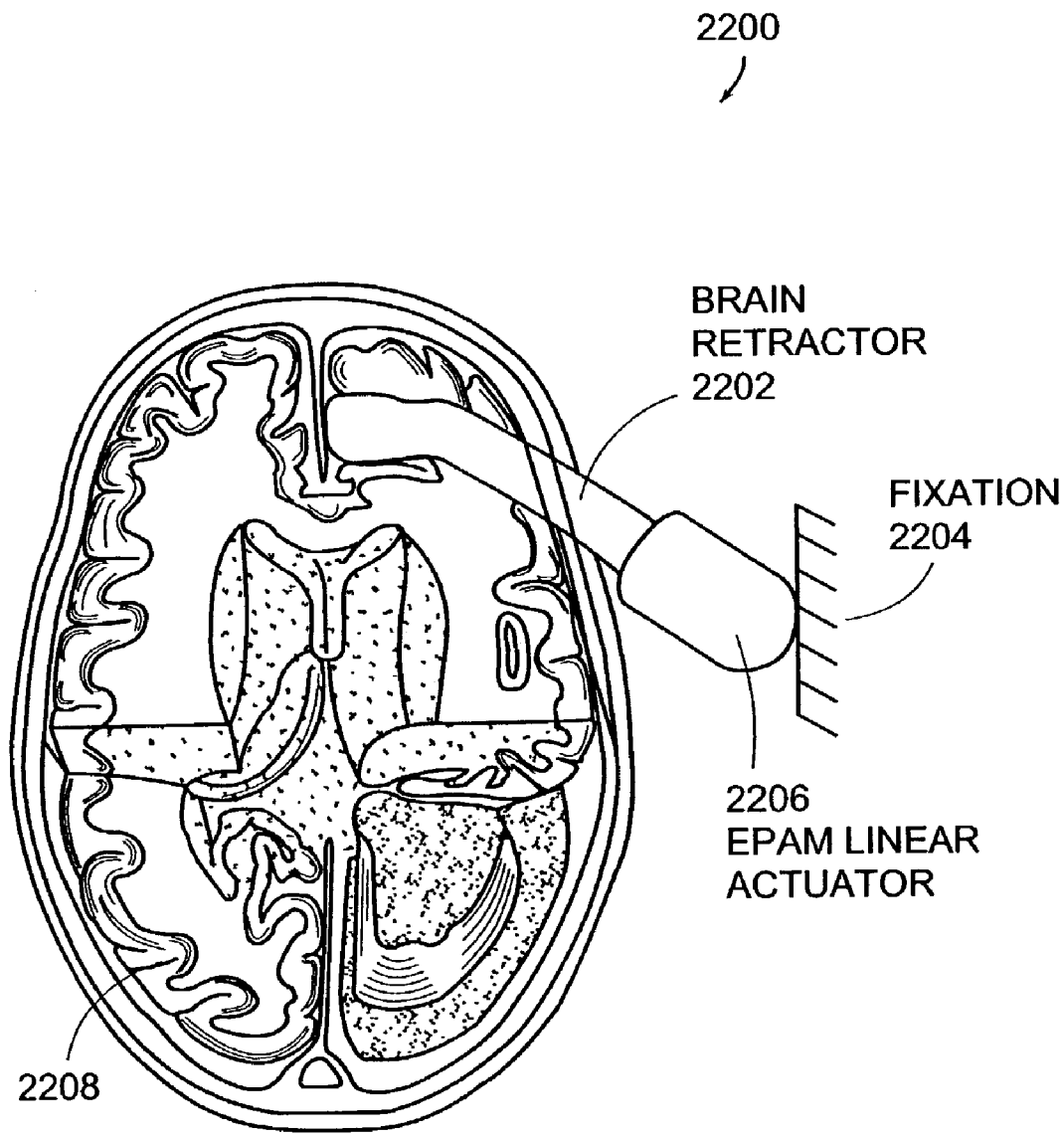
FIG. 43 illustrates a retractor including an electrostrictive polymer artificial muscle actuator (EPAM) that can be used during intra-operative magnetic resonance imaging (MRI) guided surgery in accordance with a preferred embodiment of the present invention.

FIG. 43 illustrates a retractor including an electrostrictive polymer artificial muscle actuator (EPAM) that can be used during intra-operative magnetic resonance imaging (MRI) guided surgery in accordance with a preferred embodiment of the present invention. A retractor 2202 in direct contact with the brain 2208 during intra-operative MRI-guided surgery can be driven by an EPAM actuator 2206 to produce a shear wave.

Figure 44A:
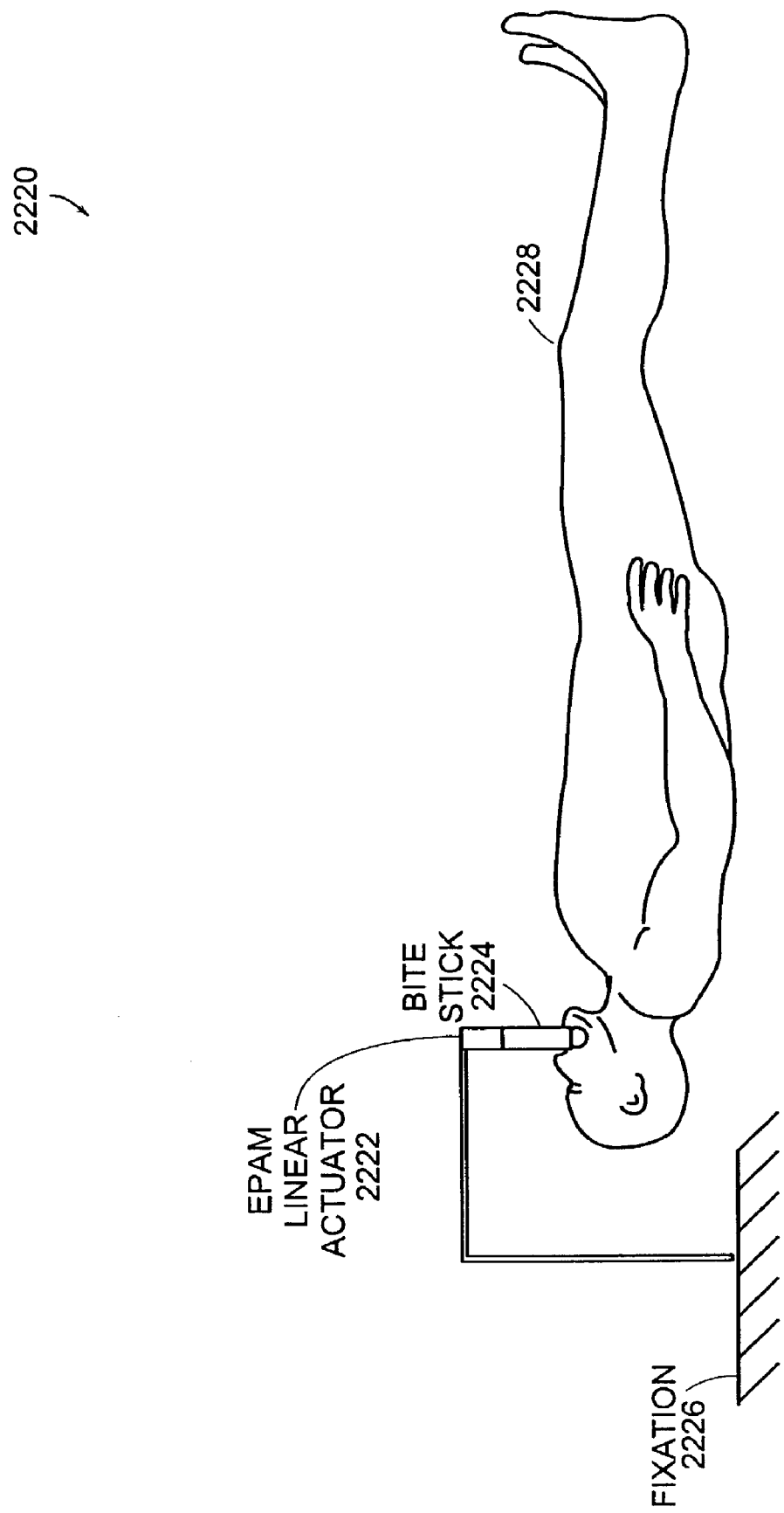
FIGS. 44A-44C illustrate alternate preferred embodiments for applying oscillatory stress to an object in an MR imaging system to perform MR elastography, in accordance with the present invention.
Figure 44B:
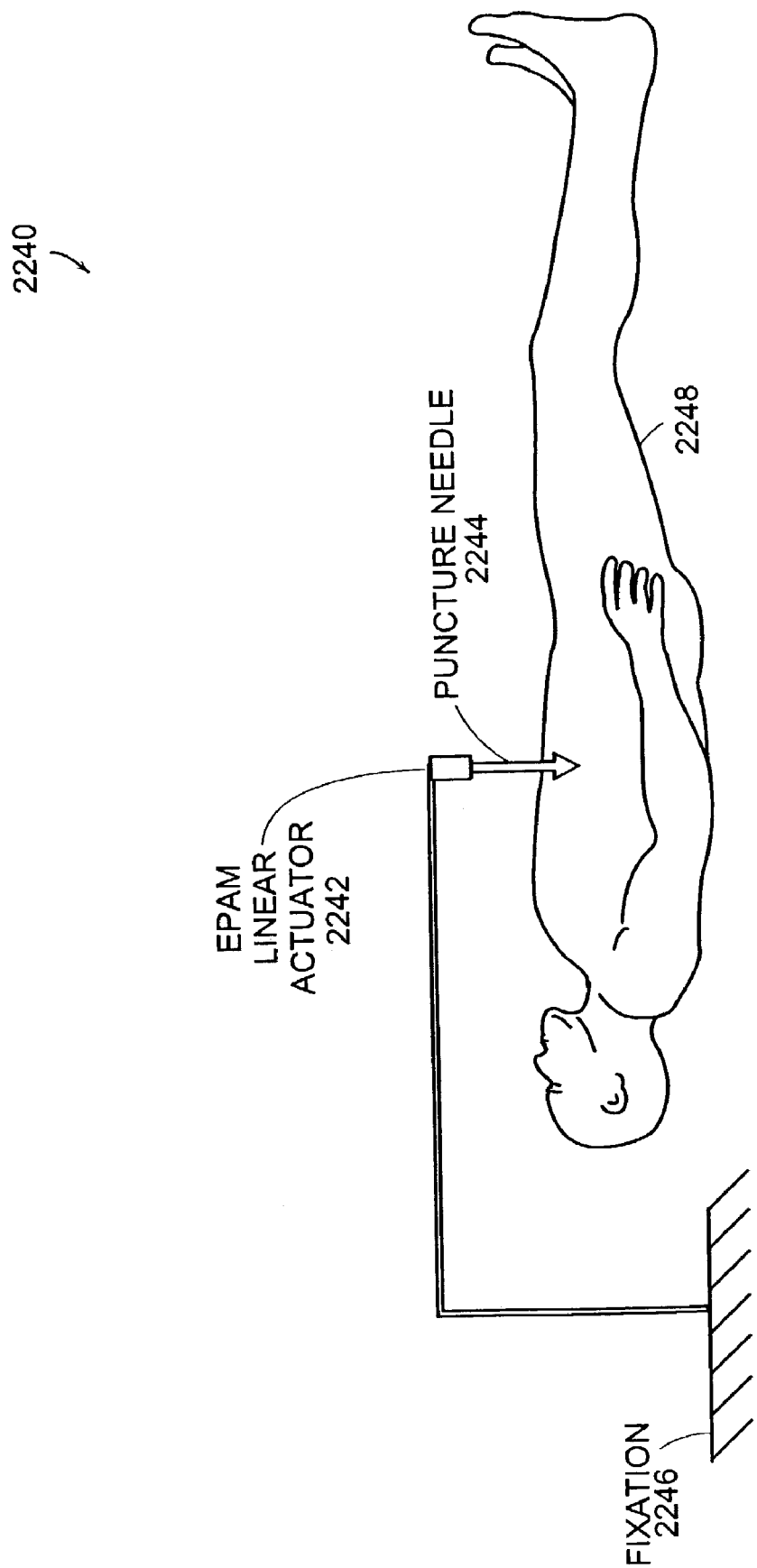
Figure 44C:
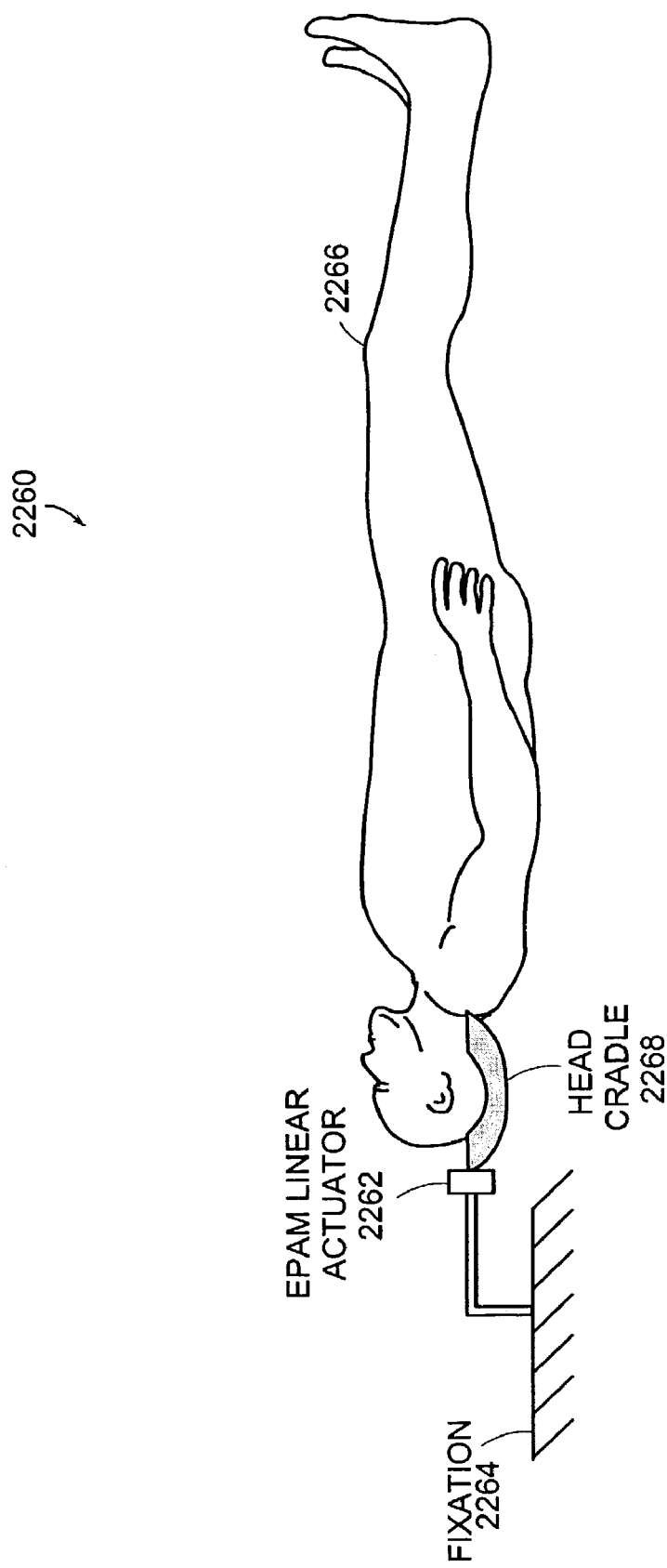

FIGS. 44A-44C illustrate alternate preferred embodiments for applying oscillatory stress to an object in an MR imaging system to perform MR elastography, in accordance with the present invention. A transducer having an EPAM actuator 2222 can be gripped by the patient's teeth and can produce a shear wave within the brain, for example, by vibrating the entire skull as illustrated in FIG. 44A. Alternatively, bulk motion of tissue 2248 can be induced by a form-fit EPAM device attached to any part of the body or to the head as illustrated in FIGS. 44B and 44C. For organs that do not communicate with the skin, for example, the liver, a puncture needle may provide mechanical contact. The EPAM driver can be connected to such a needle 2244 as illustrated in FIG. 44B.

The claims should not be read as limited to the described order or elements unless stated to that effect. Therefore, all embodiments that come within the scope and spirit of the following claims and equivalents thereto are claimed as the invention.

What is claimed:

1. An actuator for use in magnetic resonance imaging, comprising:
    an actuator device for actuating movement of an object within a magnetic coil assembly of a magnetic resonance imaging device, the actuator device having an elastomeric dielectric film with a first compliant electrode and a second compliant electrode; wherein the actuator device is disposed within the magnetic field generated by magnetic coil assembly of the magnetic resonance imaging device, and
    a frame element of a the magnetic resonance imaging device attached to at least a portion of the actuator device.

2. The actuator of claim 1, wherein the elastomeric dielectric film comprises a plurality of layers of silicone.

3. The actuator of claim 1, wherein the elastomeric film comprises a plurality of layers of acrylic.

4. The actuator of claim 1, wherein the frame element further comprises a flexible member.

5. The actuator of claim 1, further comprising the frame element having a rigid member comprising one or more of parallel beams, curved beams, rods, and plates.

6. The actuator of claim 1, further comprising a device having a plurality of actuator stages.

7. The actuator of claim 1, further comprising an electrically resizable receiver coil disposed on a portion of at least one of the first and the second surface of the elastomeric dielectric film.

8. The actuator of claim 1, wherein the frame element provides a linear actuation force characteristic over a displacement range.

9. The actuator of claim 1 wherein the actuator device comprises a bi-stable actuator.

10. A positioning device for use in magnetic resonance imaging of a region of interest having a plurality of stages, each stage of the device comprising:
    an actuator device having an elastomer dielectric film with a first electrode and a second electrode, wherein the actuator device is disposed within the magnetic field generated by a magnetic coil assembly of a magnetic resonance imaging device;
    a frame element of the magnetic resonance imaging device attached to at least a portion of the actuator device; and
    an electrically resizable receiver coil disposed on at least a portion of the actuator device to remotely control the location and focus of the region of interest.

11. The positioning device of claim 10, wherein the frame element provides a linear actuation force characteristic over a displacement range.

12. The positioning device of claim 10, wherein the frame further element comprises a rigid member coupled with a plurality of links.

13. The positioning device of claim 12, further comprising a bi-stable passive element coupled to the plurality of links.

14. The positioning device of claim 10, wherein the elastomer dielectric film comprises a plurality of layers of one or more of silicone and acrylic.

15. The positioning device of claim 10, wherein the frame element comprises one or more of parallel beams, curved beams, rods and plates.

16. A probe for use in magnetic resonance imaging of a region of interest within a body, the region of interest within the body being disposed within the magnetic field generated by a magnetic coil assembly of a magnetic resonance imaging device, comprising:
    an elongate shaft having a proximal end and a distal end; and
    an actuator device disposed in the distal end, the actuator device having an elastomeric dielectric film with a first compliant electrode and a second compliant electrode, the actuator device further having a frame element and a variable size receiver coil disposed thereon; wherein the distal end of the probe is disposed within the magnetic field generated by the magnetic coil assembly of the magnetic resonance imaging device.

17. The probe of claim 16, wherein the variable size coil is remotely controllable.

18. The probe of claim 16, further comprising a plurality of varying sizes for insertion into and deployment within a cavity.

19. A receiver coil for a magnetic resonance imaging device for use in magnetic resonance imaging of a region of interest, comprising:
    an actuator device having an elastomeric dielectric film with a first compliant electrode and a second compliant electrode, wherein the actuator device is disposed within the magnetic field generated by a magnetic coil assembly of the magnetic resonance imaging device; and
    a frame element of the magnetic resonance imaging device attached to at least a portion of the actuator device.

20. The receiver coil of claim 19, further comprising the frame element having at least one flexible member.

21. The receiver coil of claim 19, wherein the coil has a variable size that is remotely controllable.

22. The receiver coil of claim 19, wherein the coil is integrated in an intracavity probe.

23. A device to manipulate objects in a magnetic resonance imaging environment, comprising:
    an actuator device having an elastomer dielectric film with a first electrode and a second electrode;
    a frame element of a magnetic imaging device attached to at least a portion of the actuator device; and
    an electrically resizable receiver coil disposed on at least a portion of the elastomer dielectric film to remotely control the location and focus of the region of interest; wherein the actuator device is disposed within the magnetic field generated by a magnetic coil assembly of the magnetic resonance imaging device.

24. The device to manipulate objects of claim 23, wherein the frame element further comprises rigid members coupled with a plurality of links.

25. The device to manipulate objects of claim 24, further comprising a bi-stable passive element coupled to the plurality of links.

26. The device to manipulate objects of claim 23, wherein the elastomer dielectric film comprises a plurality of layers of one or more of silicone and acrylic.

27. The device to manipulate objects of claim 23, wherein the frame element further comprises of one of parallel beams, curved beams, rods and plates.

28. A device for applying oscillatory stress to an object within a magnetic resonance imaging device for use in magnetic resonance imaging, comprising:

an actuator device having an elastomeric dielectric film with a first compliant electrode and a second compliant electrode, wherein the actuator device is disposed within the magnetic field generated by a magnetic coil assembly of the magnetic resonance imaging device; and a frame element of the magnetic resonance imaging device attached to at least a portion of the actuator device.

\* \* \* \* \*